(12) United States Patent
Kubo et al.

(10) Patent No.: US 7,244,972 B2
(45) Date of Patent: Jul. 17, 2007

(54) SEMICONDUCTOR DEVICES AND METHOD FOR MANUFACTURING THE SAME

(75) Inventors: Minoru Kubo, Mie (JP); Yo Ichikawa, Aichi (JP); Akira Asai, Osaka (JP); Takahiro Kawashima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/868,774

(22) Filed: Jun. 17, 2004

(65) Prior Publication Data

US 2004/0227169 A1 Nov. 18, 2004

Related U.S. Application Data

(62) Division of application No. 10/203,891, filed as application No. PCT/JP01/11504 on Dec. 26, 2001, now Pat. No. 6,844,227.

(30) Foreign Application Priority Data

Dec. 26, 2000 (JP) .............................. 2000-395824

(51) Int. Cl.
*H01L 29/778* (2006.01)
(52) U.S. Cl. ..................... 257/194; 257/97; 257/103; 257/310
(58) Field of Classification Search ................ 257/194
See application file for complete search history.

(56) References Cited

U.S. PATENT DOCUMENTS

| | | | |
|---|---|---|---|
| 5,561,302 | A | 10/1996 | Candelaria |
| 6,190,975 | B1 | 2/2001 | Kubo et al. |
| 6,323,525 | B1 | 11/2001 | Noguchi et al. |
| 6,472,685 | B2 | 10/2002 | Takagi |

FOREIGN PATENT DOCUMENTS

| | | |
|---|---|---|
| EP | 494395 A2 | 7/1992 |
| EP | 921575 A2 | 6/1999 |
| JP | 04-247664 | 9/1992 |
| JP | 5-218014 A | 8/1993 |
| JP | 07-321222 | 12/1995 |
| JP | 9-82944 A | 3/1997 |
| JP | 10-214906 | 8/1998 |
| JP | 11-233771 | 8/1999 |
| JP | 2000-114257 | 4/2000 |
| JP | 2000-150512 A | 5/2000 |
| JP | 2000-216163 | 8/2000 |
| JP | 2000-216392 | 8/2000 |
| JP | 2000-277514 A | 10/2000 |
| JP | 2000-286413 A | 10/2000 |
| JP | 2000-286418 | 10/2000 |
| WO | WO 00/60671 A1 | 10/2000 |

OTHER PUBLICATIONS

M. Togo et al., "Low-Leakage and Highly-Reliable 1.5 nm SiOn Gate-Dielectric Using Radical Oxynitridation for Sub-0.1 μm CMOS", 2000 Symposium on VLSI Technology Digest of Tchnical Papers.

*Primary Examiner*—Jerome Jackson
(74) *Attorney, Agent, or Firm*—Nixon Peabody LLP; Donald R. Studebaker

(57) ABSTRACT

In a field effect transistor, an Si layer 11, an SiC ($Si_{1-y}C_y$) channel layer 12, a CN gate insulating film 13 made of a carbon nitride layer (CN) and a gate electrode 14 are deposited in this order on an Si substrate 10. The thickness of the SiC channel layer 12 is set to a value that is less than or equal to the critical thickness so that a dislocation due to a strain does not occur according to the carbon content. A source region 15 and a drain region 16 are formed on opposite sides of the SiC channel layer 12, and a source electrode 17 and a drain electrode 18 are provided on the source region 15 and the drain region 16, respectively.

17 Claims, 24 Drawing Sheets

Conduction band

Valence band

Conduction band

Valence band

FIG. 29A  < Low |Vg| >
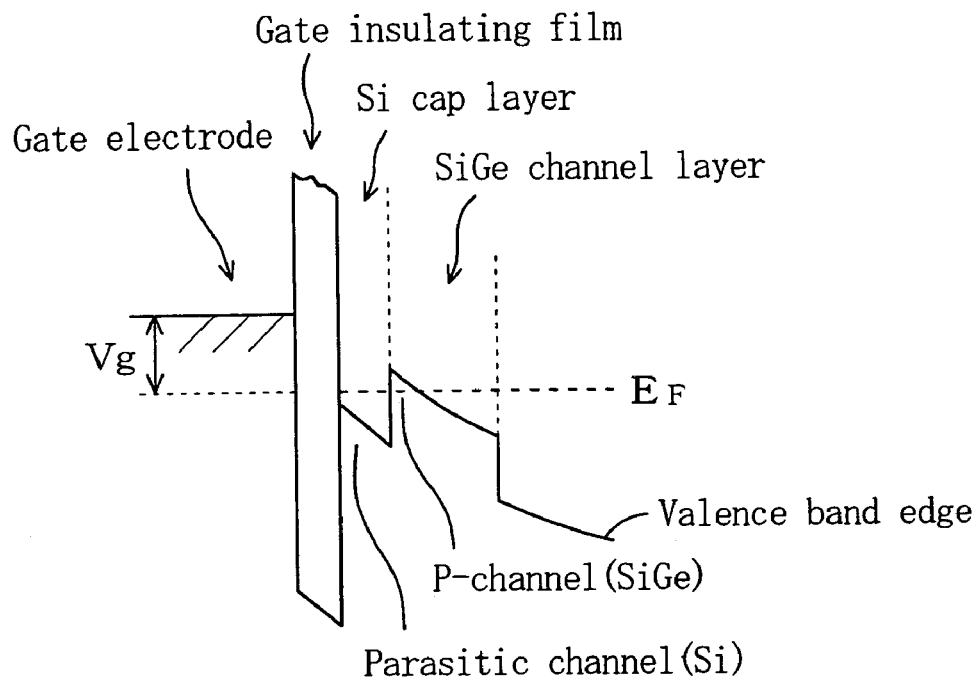
FIG. 29B  < High |Vg| >
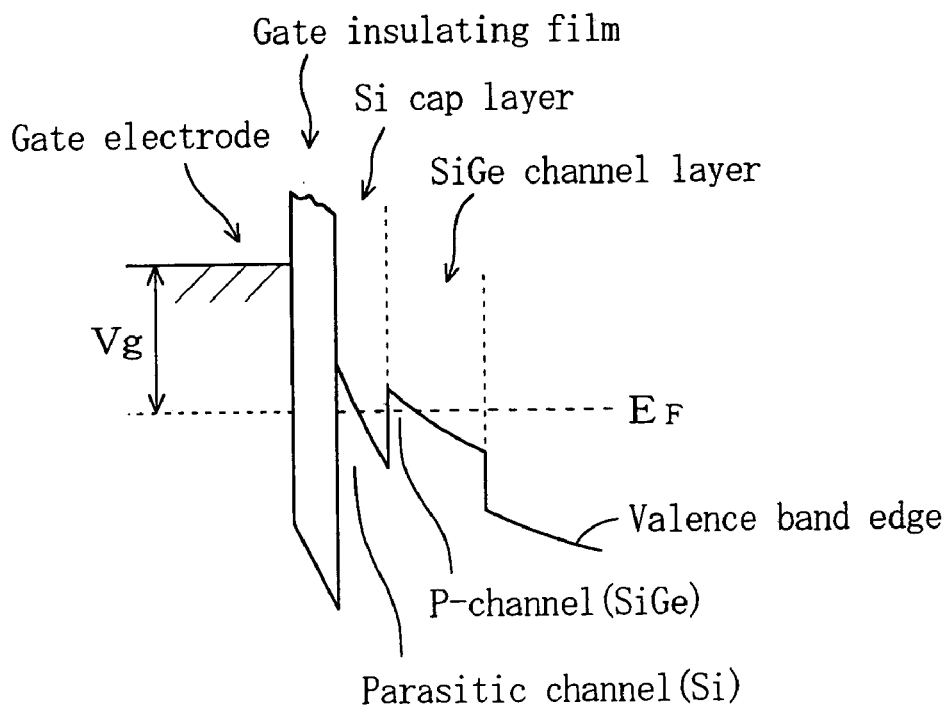

SEMICONDUCTOR DEVICES AND METHOD FOR MANUFACTURING THE SAME

TECHNICAL FIELD

The present invention relates to a field effect transistor using a hetero junction, and particularly to measures to improve the performance thereof

BACKGROUND ART

Currently, the mainstream type of transistor that is formed on a silicon substrate is a metal/oxide film insulator/semiconductor (MOS) type field effect transistor (MOSFET). As a method for improving the characteristics of such a MOSFET, a method of applying a tensile strain to an Si channel layer is reported in articles (J. Welser et al., "Strain dependence of the performance enhancement in strained-Si n-MOSFETs," IEDM Tech. Dig. 1994, p.373. and K. Rim et al., "Enhanced hole mobilities in surface-channel strained-Si p-MOSFETs," IEDM Tech. Dig. 1995, p.517). This is a method in which a thick SiGe buffer layer is grown on a silicon substrate, and the lattice of the SiGe buffer layer is relaxed, after which an Si channel layer is formed thereon. This is to increase the lattice constant of the SiGe buffer layer to be equal to that of unstrained SiGe so as to apply a tensile strain to the Si channel layer grown thereon.

In the Si channel layer in the hetero junction structure, which is subject to a tensile strain, the 6-fold degeneracy is lifted in the conduction band, and the band is split into 2-fold and 4-fold degenerated bands ($\Delta(2)$ and $\Delta(4)$). At this time, the conduction band edge of the Si channel layer is formed by the 2-fold degenerated band $\Delta(2)$, and the effective mass of electrons when moving in the channel direction in the band $\Delta(2)$ is reduced. By forming an n-channel field effect transistor by using such a hetero junction, electrons can be confined in a hetero barrier of Si channel layer/SiGe layer.

Moreover, due to the reduction in the effective mass of electrons in the Si channel layer, the electron mobility is improved, and the operating speed of a transistor is improved. On the other hand, degeneracy is similarly lifted also in the valence band, and the valence band is split into a light hole (LH) band and a heavy hole (HH) band. At this time, the valence band edge in the Si channel layer is formed by a band of light holes, which are positive holes having a small effective mass, and the effective mass of light holes is smaller than the effective mass of holes in the SiGe layer. By forming a p-channel field effect transistor by using such a hetero junction, the hole mobility is improved due to a decrease in the effective mass of holes, thereby improving the operating speed of a transistor. Note however that since a hetero barrier is formed on the SiGe layer side, confinement of holes cannot be expected.

As described above, there have been reported that transistor characteristics are improved by applying a tensile strain to an Si channel layer both for n-channel and p-channel.

Problems to be Solved

However, in order to apply a tensile strain to an Si channel layer with the conventional method, it is necessary to grow the SiGe buffer layer to be sufficiently thick on the silicon substrate until the lattice is relaxed. When the lattice is relaxed, a large number of dislocations occur in the SiGe buffer layer. Moreover, a large number of dislocations inherently exist also in the Si channel layer formed thereon. Such dislocations not only deteriorate the characteristics of the transistor, but also present a problem in terms of long-term reliability. In view of this, it has been reported that the dislocations can be reduced by improving the structure of the SiGe buffer layer. However, a dislocation density of about $10^5$ cm$^{-2}$ is the limit at present. Thus, the device is very defective.

Moreover, such an SiGe buffer layer for lattice relaxation is required to have a considerable thickness (1 µm or more), whereby the crystal growth takes a long time, thus presenting a problem also in terms of throughput.

DISCLOSURE OF THE INVENTION

An object of the present invention is to take measures to suppress the problems as described above so as to provide a transistor having good characteristics while ensuring a sufficient reliability.

A semiconductor device of the present invention is a semiconductor device, including at least one field effect transistor, the field effect transistor including: a first semiconductor layer; a first active layer provided on the first semiconductor layer, an uppermost portion of the first active layer being a nitride-containing layer and a main portion of the first active layer being a second semiconductor layer having a composition expressed as $Si_{1-x-y}Ge_xC_y$ ($0 \leq x < 1$, $0 \leq y < 1$, $x+y>0$); and a gate electrode provided on the first active layer.

In this way, the nitrogen-containing layer of the first active layer functions as a gate insulating film, and the second semiconductor layer, which is to be an SiGe layer, an SiC layer or an SiGeC layer, can function as a channel layer, whereby it is possible to obtain a semiconductor device that operates as a hetero junction type field effect transistor. The uppermost portion of the active layer, which functions as a gate insulating film, is a nitrogen-containing layer, whereby it is possible to suppress the occurrence of defects due to detachment of C or Ge of the channel layer without providing an Si cap layer. Thus, it is possible to provide a semiconductor device having a high current drivability and an ability for high speed operation by utilizing the advantages of a hetero junction type transistor.

It is preferred that the nitride-containing layer is made of at least one material selected from carbon nitride (CN), aluminum nitride (AlN), gallium nitride (GaN), silicon nitride (SiN), germanium nitride (GeN), silicon germanium nitride (SiGeN), silicon carbon nitride (SiCN), germanium carbon nitride (GeCN), silicon germanium carbon nitride (SiGeCN) and silicon oxynitride (SiON).

A distance between the nitride-containing layer and the second semiconductor layer in the first active layer may be 2 nm or less. In this way, it is possible to obtain a particularly high transconductance.

At least a portion of the nitride-containing layer may be oxidized.

The first semiconductor layer may have a composition expressed as $Si_{1-x-y}Ge_xC_y$ ($0 \leq x < 1$, $0 \leq y < 1$); and the second semiconductor layer may have a composition expressed as $Si_{1-y}C_y$ ($0 < y < 1$). In this way, the channel layer is formed not by an Si layer but by the second semiconductor layer containing Si and C. Therefore, it is possible to apply a tensile strain to the channel layer only by adjusting the C content without providing a thick buffer layer for lattice relaxation under the second semiconductor layer to be the channel layer. Thus, it is possible to obtain a semiconductor device including a transistor having a high current drivability while maintaining a good crystallinity of the channel layer.

The second semiconductor layer may be under a tensile strain. In this way, it is possible to improve the carrier velocity by utilizing the fact that the band degeneracy can be lifted, and thus to obtain a semiconductor device including a transistor having an ability for high speed operation.

The second semiconductor layer may be used as an n-channel through which electrons flow. In this way, the electron velocity in the channel direction increases, whereby it is possible to obtain a semiconductor device including a transistor having an ability for high speed operation.

The second semiconductor layer may be used as a p-channel through which holes travel. In this way, it is possible to obtain a semiconductor device including a transistor having an ability for high speed operation by utilizing light holes.

The field effect transistor may be an n-channel field effect transistor; and the semiconductor device may further include a p-channel field effect transistor, the p-channel field effect transistor including: a third semiconductor layer having a composition expressed as $Si_{1-x-y}Ge_xC_y(0 \leq x<1, 0 \leq y<1)$; a second active layer provided on the third semiconductor layer, an uppermost portion of the second active layer being a nitride-containing layer and a main portion of the second active layer being a fourth semiconductor layer having a composition expressed as $Si_{1-y}C_y$ $(0<y<1)$; and a gate electrode provided on the second active layer. In this way, it is possible to obtain a complementary semiconductor device that can exert functions/effects as described above in the p-channel field effect transistor and in the n-channel field effect transistor.

The first semiconductor layer and the third semiconductor layer may be formed from the same semiconductor film; and the second semiconductor layer and the fourth semiconductor layer may be formed from the same semiconductor film. In this way, it is possible to ensure a high efficiency in applying a gate bias to the channel layer both in the n-channel transistor and in the p-channel transistor.

The first semiconductor layer may have a composition expressed as $Si_{1-x-y}Ge_xC_y(0 \leq x<1, 0 \leq y<1)$; and the second semiconductor layer may have a composition expressed as $Si_{1-x-y}Ge_xC_y(0<x<1, 0<y<1)$. In this way, it is possible to form a hetero barrier both in the conduction band and in the valence band at the interface between the first semiconductor layer and the second semiconductor layer, which is an SiGeC layer. Moreover, the second semiconductor layer can function as a quantum well layer sandwiched between the nitrogen-containing layer and the first semiconductor layer, whereby it is possible to obtain a semiconductor device having a high current drivability.

The second semiconductor layer may be used as an n-channel through which electrons travel or as a p-channel through which holes travel.

The field effect transistor may be an n-channel field effect transistor; and the semiconductor device may further include a p-channel field effect transistor, the p-channel field effect transistor including: a fifth semiconductor layer having a composition expressed as $Si_{1-x-y}Ge_xC_y(0 \leq x<1, 0 \leq y<1)$; a third active layer provided on the fifth semiconductor layer, an uppermost portion of the third active layer being a nitride-containing layer and a main portion of the third active layer being a sixth semiconductor layer having a composition expressed as $Si_{1-y}C_y(0<y<1)$; and a gate electrode provided on the third active layer. In this way, it is possible to obtain a complementary semiconductor device that can exert functions/effects as described above in the p-channel field effect transistor and in the n-channel field effect transistor.

The first semiconductor layer may have a composition expressed as $Si_{1-x-y}Ge_xC_y(0 \leq x<1, 0 \leq y<1)$; and the second semiconductor layer may have a composition expressed as $Si_{1-x}Ge_x(0<x<1)$. In this way, the channel layer is formed not by an Si layer but by the second semiconductor layer containing Si and Ge. Therefore, it is possible to apply a compressive strain to the channel layer only by adjusting the Ge content without providing a thick buffer layer for lattice relaxation under the second semiconductor layer. Moreover, a hetero barrier is formed in the valence band at the interface between the first semiconductor layer and the second semiconductor layer. Moreover, the second semiconductor layer can function as a quantum well layer sandwiched between the nitrogen-containing layer and the first semiconductor layer, whereby it is possible to obtain a semiconductor device having a high current drivability. Thus, it is possible to obtain a semiconductor device including a transistor having a high current drivability while maintaining a good crystallinity of the channel layer.

The second semiconductor layer may be under a compressive strain. In this way, it is possible to obtain a semiconductor device having an ability for high speed operation utilizing light holes that are produced by the degeneracy splitting in the valence band of the second semiconductor layer.

The second semiconductor layer may be used as an n-channel through which electrons travel. In this way, it is possible to obtain a semiconductor device having an ability for high speed operation by utilizing the fact that the electron mobility in a semiconductor layer containing Si and Ge is higher than that in an Si layer.

The second semiconductor layer may be used as a p-channel through which holes travel. In this way, it is possible to exert the effect (high current drivability) by utilizing the hetero barrier formed in the valence band between the second semiconductor layer and the first semiconductor layer.

The field effect transistor may be an n-channel field effect transistor; and the semiconductor device may further include a p-channel field effect transistor, the p-channel field effect transistor including: a seventh semiconductor layer having a composition expressed as $Si_{1-x-y}Ge_xC_y(0 \leq x<1, 0 \leq y<1)$; a fourth active layer provided on the seventh semiconductor layer, an uppermost portion of the fourth active layer being a nitride-containing layer and a main portion of the fourth active layer being an eighth semiconductor layer having a composition expressed as $Si_{1-x}Ge_x(0<x<1)$; and a gate electrode provided on the fourth active layer. In this way, it is possible to obtain a complementary semiconductor device that can exert the ability for high speed operation in the n-channel field effect transistor, and the high current drivability and the ability for high speed operation in the p-channel field effect transistor.

It is preferred that the first semiconductor layer and the seventh semiconductor layer are formed from the same film; and the second semiconductor layer and the eighth semiconductor layer are formed from the same film.

The first semiconductor layer may be a lattice-relaxed layer having a composition expressed as $Si_{1-x-y}Ge_xC_y$ $(0<x<1, 0<y<1)$; the second semiconductor layer may be a lattice-relaxed layer; and the semiconductor device may further include a tensile-strained ninth semiconductor layer having a composition expressed as $Si_{1-x-y}Ge_xC_y$ $(0 \leq x<1, 0 \leq y<1)$ and provided between the first semiconductor layer and the second semiconductor layer in the first active layer. In this way, it is possible to obtain a high-performance semiconductor device by utilizing the lattice-relaxed second semiconductor layer (SiGe layer or SiGeC layer) having a good crystallinity, or the tensile-strained ninth semiconductor layer (Si layer, SiGe layer, SiC layer or SiGeC layer). Particularly, since the strained ninth semiconductor layer is sandwiched between the lattice-relaxed first and second semiconductor layers, the thermal budget improves, while the Ge composition in the ninth semiconductor layer can be increased, whereby it is possible to obtain a semiconductor device having an even higher performance.

The ninth semiconductor layer may be used as an n-channel through which electrons travel. In this way, it is possible to confine electrons in the ninth semiconductor layer by utilizing a hetero barrier formed between the ninth semiconductor layer and the second semiconductor layer and between the ninth semiconductor layer and the first semiconductor layer, while it is possible to increase the electron traveling velocity by utilizing the splitting caused by a strain. Thus, it is possible to obtain a semiconductor device having a high current drivability and an ability for high speed operation.

The second semiconductor layer may be used as a p-channel through which holes travel. In this way, the second semiconductor layer can be used as a quantum well layer sandwiched between the nitrogen-containing layer and the ninth semiconductor layer, whereby it is possible to obtain a semiconductor device having a high current drivability.

The semiconductor device may further include a tenth semiconductor layer provided under the second semiconductor layer and having a graded composition expressed as $Si_{1-x-y}Ge_xC_y(0<x<1, 0\leq y<1)$ that is varied so that a crystal lattice dimension increases from a lower portion toward an upper portion. In this way, the second semiconductor layer can be a relaxed layer having a high Ge content. Therefore, it is possible to prominently exert the advantages of a hetero junction type field effect transistor.

The field effect transistor may be an n-channel field effect transistor; and the semiconductor device may further include a p-channel field effect transistor, the p-channel field effect transistor including: a lattice-relaxed tenth semiconductor layer having a composition expressed as $Si_{1-x-y}Ge_xC_y$ ($0<x<1, 0\leq y<1$); a fifth active layer, an uppermost portion of the fifth active layer being a nitride-containing layer and a main portion of the fifth active layer including a lattice-relaxed eleventh semiconductor layer having the same composition as that of the tenth semiconductor layer and a tensile-strained twelfth semiconductor layer that is provided between the tenth semiconductor layer and the eleventh semiconductor layer and has a composition expressed as $Si_{1-x-y}Ge_xC_y(0\leq x<1, 0\leq y<1)$; and a gate electrode provided on the fifth active layer. In this way, it is possible to obtain a complementary semiconductor device that can exert a high performance in the n-channel field effect transistor and in the p-channel field effect transistor.

The first semiconductor layer and the tenth semiconductor layer may be formed from the same film; the second semiconductor layer and the eleventh semiconductor layer may be formed from the same film; and the ninth semiconductor layer and the twelfth semiconductor layer may be formed from the same film.

A first method for manufacturing a semiconductor device of the present invention includes the steps of: (a) preparing a substrate including a semiconductor layer, which is a first semiconductor layer; (b) forming a second semiconductor layer having a composition expressed as $Si_{1-x-y}Ge_xC_y$ ($0\leq x<1, 0\leq y<1, x+y>0$) on the first semiconductor layer; (c) nitriding a surface portion of the second semiconductor layer so as to form a nitride-containing layer; and (d) forming a gate electrode on the second semiconductor layer.

With this method, it is possible to obtain a nitrogen-containing layer having a good structural affinity with the underlying layer, whereby it is possible to suppress adverse influences on a portion to be the channel. Thus, it is possible to easily manufacture a high-performance semiconductor device.

In the step (c), an ECR plasma may be used. In this way, it is possible to form a nitrogen-containing layer at a low temperature, whereby it is possible to avoid the deterioration of various characteristics due to the exposure of the entire active layer to high temperature conditions.

A second method for manufacturing a semiconductor device of the present invention includes the steps of: (a) preparing a substrate including a semiconductor layer, which is a first semiconductor layer; (b) forming a second semiconductor layer having a composition expressed as $Si_{1-x-y}Ge_xC_y$($0\leq x<1, 0\leq y<1, x+y>0$) on the first semiconductor layer; (c) forming a nitride-containing layer by a CVD method on the second semiconductor layer; and (d) forming a gate electrode on the second semiconductor layer.

With this method, it is possible to select the material of the nitrogen-containing layer independently of the underlying material, whereby it is possible to form a suitable nitrogen-containing layer according to the application of the semiconductor device.

A third method for manufacturing a semiconductor device of the present invention includes the steps of: (a) preparing a substrate including a semiconductor layer, which is a first semiconductor layer; (b) forming a second semiconductor layer having a composition expressed as $Si_{1-x-y}Ge_xC_y$ ($0\leq x<1, 0\leq y<1, x+y>0$) on the first semiconductor layer; (c) forming a CN insulating film on the second semiconductor layer; and (d) removing a portion of the CN insulating film by a dry etching process using an oxygen-containing gas.

With this method, it is possible to suppress the etching of the second semiconductor layer made of $Si_{1-x-y}Ge_xC_y$ ($0\leq x<1, 0\leq y<1, x+y>0$) to be the underlying layer of the nitrogen-containing layer during the etching process. The dry etching process is a step required when patterning a gate insulating film and when forming a contact to a source/drain region.

BRIEF DESCRIPTION OF THE DRAWINGS

FIG. 29($a$) and FIG. 29($b$) are energy band diagrams illustrating a band structure of a conventional SiGe-pMOSFET along its vertical cross section with a small gate bias and with a large gate bias, respectively.

BEST MODE FOR CARRYING OUT THE INVENTION

First, an Si cap layer that was provided in an SiGe-MOSFET in the prior art will be discussed. An Si cap layer was indispensable in the conventional SiGe-MOSFET. The Si cap layer was necessary for suppressing an outward diffusion of Ge in an SiGe layer or C in an SiC layer or a diffusion of the opposite direction of O atoms from an oxide, which is a material of a gate insulating film, into the SiGe layer or the SiC layer. However, the presence of the Si cap layer was undesirable for two reasons as follows. The first reason is the parasitic channel effect by which electrons or holes flow through the Si cap layer, and the other reason is the decrease in the electron- or hole-attracting effect that is caused by an increase in the distance between the gate electrode and the SiGe channel layer due to the presence of the Si cap layer.

First, the parasitic channel effect will be discussed in detail using an SiGe-pMOSFET as an example.

FIG. 29($a$) and FIG. 29($b$) are energy band diagrams illustrating a band structure of a conventional SiGe-pMOSFET along its vertical cross section with a small gate bias and with a large gate bias, respectively. In FIG. 29($a$) and FIG. 29($b$), the conduction band is not shown.

As illustrated in FIG. 29($a$), when the absolute value |Vg| of the negative voltage (gate bias) applied to the gate electrode is small, holes, which are carriers, are confined in the SiGe channel layer having a high mobility. However, as illustrated in FIG. 29($b$), when the absolute value |Vg| of the negative voltage (gate bias) applied to the gate electrode is large, the holes flow not only through the SiGe channel layer but also through the Si cap layer having a low mobility. This effect becomes more pronounced as the thickness of the Si cap layer increases.

Figure 30A:
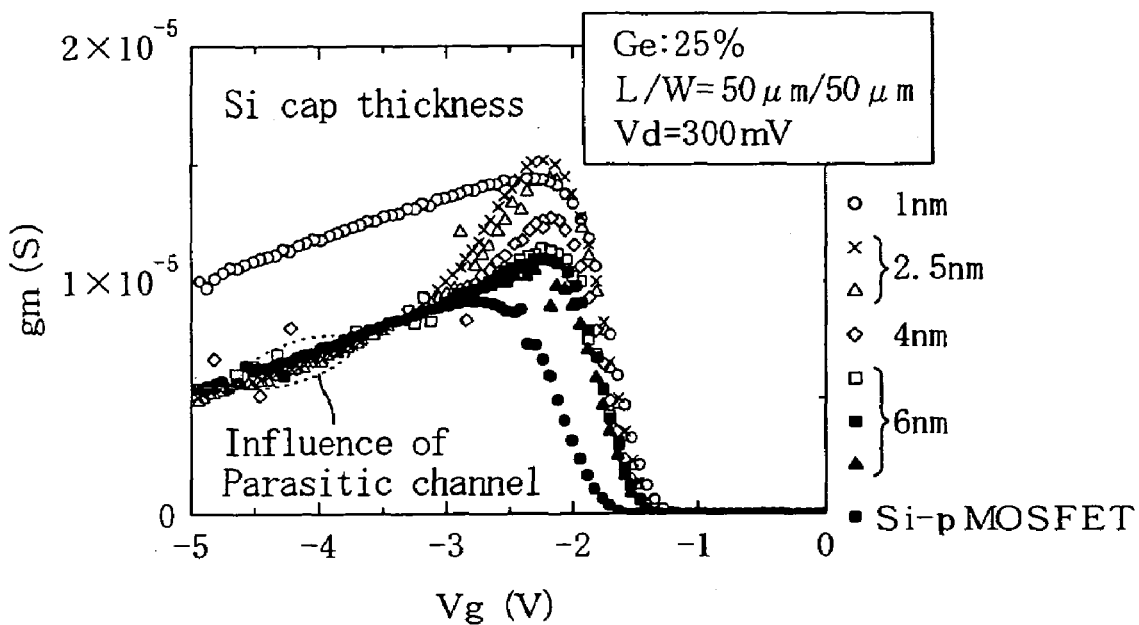
FIG. 30($a$) and FIG. 30($b$) show actual measurement data and simulation data, respectively, of the gate bias dependence of the transconductance in the conventional SiGe-MOSFET, with the thickness of the Si cap layer being a parameter.
Figure 30B:
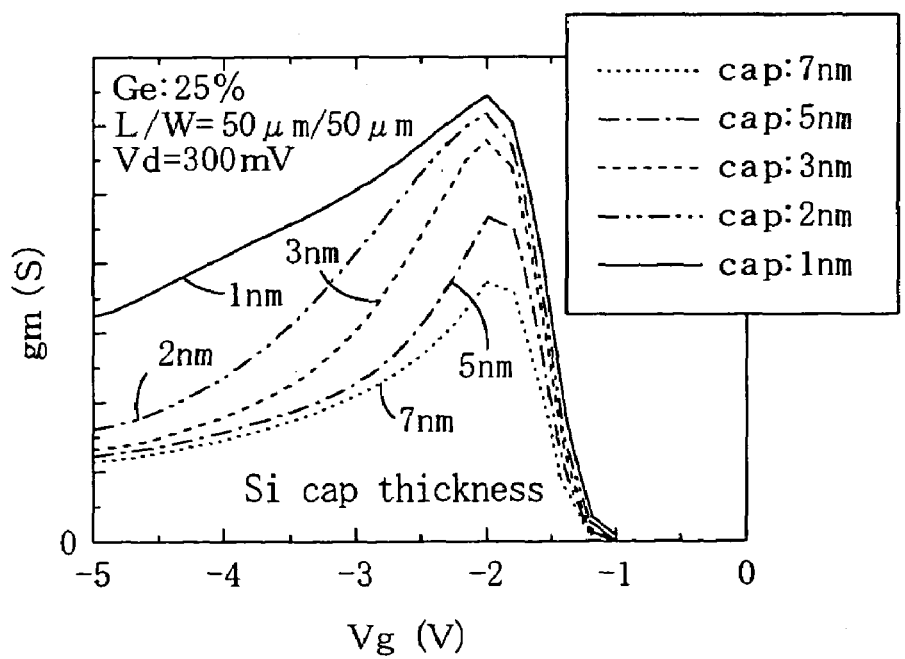

FIG. 30(a) and FIG. 30(b) show actual measurement data and simulation data, respectively, of the gate bias dependence of the transconductance in the conventional SiGe-pMOSFET, with the thickness of the Si cap layer being a parameter. The data shown in FIG. 30(a) and FIG. 30(b) is obtained by changing the thickness of the Si cap layer to 1 nm, 2 nm, 3 nm, 5 nm and 7 nm in a MOSFET in which the Ge composition of the SiGe channel layer is 25% and the gate length L/gate width W is 50 μm/50 μm. Moreover, FIG. 30(a) also shows data of an Si-MOSFET for comparison.

As shown in FIG. 30(a), when the gate bias (the absolute value of the gate voltage Vg) is small (when Vg=−2 to −3 V), the values of the transconductance gm of SiGe-MOSFETs having thick Si cap layers are significantly larger than that of the Si-MOSFET. However, as the gate bias is increased (when Vg=−3 to −5), the transconductance values of the SiGe-MOSFETs decrease to be substantially the same as that of the Si-MOSFET. Therefore, under actual operating conditions, the SiGe-MOSFETs having relatively thick Si cap layers (3 to 7 nm) have only a similar level of performance to that of the Si-MOSFET. On the other hand, the SiGe-MOSFET having a thin Si cap layer (2 nm or less) exhibits a higher transconductance than that of the Si-MOSFET both for a small gate bias and for a large gate bias. Particularly, the SiGe-MOSFET having an Si cap layer that is 1 nm thick exhibits a transconductance gm about twice as much as that of the Si-MOSFET for small and large gate biases.

As shown in FIG. 30(b), the simulation data indicates similar effects as those indicated by the actual measurement data. Note however that while the SiGe-MOSFET in which the thickness of the Si cap layer is 3 nm exhibits a relatively high transconductance gm even for a small gate bias according to the simulation data, the SiGe-MOSFET in which the thickness of the Si cap layer is 3 nm exhibits a transconductance gm that is not substantially different from that of the Si-MOSFET for a small gate bias according to the actual measurement data. Therefore, it is preferred that the thickness of the Si cap layer is 2 nm or less, and it is more preferred that the Si cap layer is absent.

In view of this, according to the present invention, a portion that functions as a gate insulating film is formed by using a nitride, thereby eliminating the Si cap layer, which was necessary in the prior art, whereby it is possible to provide a high-performance Si-based hetero junction MISFET.

In order to achieve the object as set forth above, the present inventors employed a basic structure in which an $Si_{1-x-y}Ge_xC_y$ film is used instead of an Si layer as a strained channel layer, with a gate insulating film being provided on the $Si_{1-x-y}Ge_xC_y$ film, based on considerations to be shown below, and experimentally sought for materials that are suitable for the gate insulating film and processes for manufacturing the same.

Typically, in a MOS-type transistor including a strained channel layer, an Si cap layer is normally formed on an SiGe layer, an SiC layer or an SiGeC layer, and the Si cap layer is used as a channel layer. As described above, the present inventors believe that it is ideally desirable to realize a structure in which an $Si_{1-x-y}Ge_xC_y$ channel layer, an $Si_{1-y}C_y$ channel layer or an $Si_{1-x}Ge_x$ channel layer (which can be collectively expressed as $Si_{1-x-y}Ge_xC_y$ channel layer ($0 \leq x<1$, $0 \leq y<1$, $x+y>0$)) is epitaxially grown on an Si substrate, with an insulative gate oxide film being formed thereon. However, successful formation of a good gate oxide film on an SiGe layer, an SiC layer or an SiGeC layer has not yet been reported in the art. This is for the following reason.

During the formation of an $SiO_2$ film, which is the gate oxide film, Ge or C in the SiGe channel layer, the SiC channel layer or the SiGeC channel layer reacts with oxygen, whereby $GeO_2$ grains are produced at the interface between the channel layer and the gate oxide film, and lattice defects occur in the SiC layer or the SiGeC layer due to detachment of C, thereby creating a large number of interface levels. Moreover, in a case where an Si cap layer is provided on a strained SiGe, SiC or SiGeC channel layer, another channel (parasitic channel) is formed at the interface between the gate oxide film and the Si cap layer, in addition to the SiGe channel layer, the SiC channel layer or the SiGeC channel layer, thereby causing problems such as a decrease in the power efficiency and complication of the manufacturing process, and a MOS structure having good characteristics has not yet been obtained.

On the other hand, the strained $Si_{1-x-y}Ge_xC_y$ film ($0 \leq x<1$, $0 \leq y<1$, $x+y>0$) is epitaxially grown on a single crystal Si substrate having a lattice constant different from those of Ge crystal and C crystal. An $SiO_2$ film is widely used as an interlayer insulating film or a gate insulating film in LSI devices based on a MOS structure on an Si-based semiconductor. The $SiO_2$ film is formed by thermally oxidizing the Si surface to form an oxide film, or by depositing an oxide film using a CVD method, a sputtering method, an electron beam evaporation method, or the like. In an experiment performed during the process of making the present invention, an attempt was made to form an $SiO_2$ film by a method as described above on an $Si_{1-x-y}Ge_xC_y$ film or an $Si_{1-x-y}Ge_xC_y$ crystal. When the surface of the $Si_{1-x-y}Ge_xC_y$ film was thermally oxidized, Ge diffused into the $SiO_2$ film, thereby producing $GeO_2$ grains or C at the $SiO_2/Si_{1-x-y}Ge_xC_y$ interface in the $SiO_2$ film, making the $SiO_2$ film appear clouded. On the other hand, it was found that the $SiO_2$ film obtained by using a CVD method or a vapor evaporation method has a poorer surface flatness than that of a thermal oxide film, Ge or C may diffuse into the $SiO_2$ film from the surface of the $Si_{1-x-y}Ge_xC_y$ layer during the subsequent heating process so as to react with oxygen, thereby causing phenomena as those occurring in the thermal oxidization process, and lattice defects occur at the $SiO_2/Si_{1-x-y}Ge_xC_y$ interface due to detachment of C. These are true also for the $SiO_2/Si_{1-x}Ge_x$ interface or the $SiO_2/Si_{1-y}C_y$ interface. Moreover, it was also found that also in a case where an oxide film other than $SiO_2$, e.g., an $Al_2O_3$ film, a $TiO_2$ film or a $Y_2O_3$ film, is formed on the surface of an Si-based alloy material film containing at least two elements of Si, Ge and C, an impurity level occurs and the oxide film itself deteriorates at the oxide film/Si-based alloy material film interface. Furthermore, it was found from various analyses that in these deteriorations, oxygen in the gate oxide film is causing serious deteriorations for the device. In view of this, the present inventors examined an insulating film of an MIS (metal-insulator-semiconductor) type transistor, which uses an insulating film containing no oxygen.

First, the use of a silicon nitride film, which is an insulating film containing Si, was examined as a gate insulating film formed on a strained Si-based alloy material film. Herein, while the stoichiometric composition of silicon nitride is $Si_3N_4$, the composition ratio between Si and N substantially varies depending upon the growth conditions, and it is rather often the case that it is shifted from the stoichiometric composition. Therefore, in the following description, it will be referred to simply as an SiN film. Two methods were used for forming an SiN film, i.e., 1) depositing an SiN film, after the formation of the $Si_{1-x-y}Ge_xC_y$ channel layer, and 2) forming a thin Si film and then nitriding the surface thereof, after the formation of the $Si_{1-x-y}Ge_xC_y$ channel layer. In either case, an adjustment was made so that the thickness of the SiN film was 5 nm.

1) The formation of an SiN film by a deposition method was performed by a CVD method or a reactive vacuum evaporation method using an ammonium gas while changing the temperature of the sample from room temperature to 700° C.

2) The formation of an SiN film by nitriding an Si film was performed in a vacuum into which an $N_2$ gas or an $N_2$ gas activated by a radical gun was introduced or in a 1-atm $N_2$ gas atmosphere while heating the sample from. 200° C. to 1000° C.

As a result of forming a gate electrode (Al—Cu alloy) on the SiN film to produce a field effect transistor, with either one of the methods 1) and 2), the occurrence of interface levels due to an impurity at the gate insulating film/$Si_{1-x-y}Ge_xC_y$ film interface is reduced, and the characteristics of the field effect transistor can be improved, as compared with a case where the $SiO_2$ gate insulating film is formed on the $Si_{1-x-y}Ge_xC_y$ channel layer.

Note however that a residual stress may possibly occur in the SiN film depending on the film formation conditions and the heat treatment after the film deposition, thereby causing a strain between the SiN film and the channel layer. These are both related to aggregation of the SiN crystal, and it is necessary to lower the formation temperature, to control the film composition ratio with a high precision, and to compact the film.

Based on the experimental results as set forth above, the present invention improves the characteristics and to improve the process efficiency by employing a nitride as a gate insulating film to be formed on a strained channel layer of a field effect transistor, which is made of $Si_{1-x}Ge_x$, $Si_{1-y}C_y$, $Si_{1-x-y}Ge_xC_y$, etc.

Herein, while there are various nitride materials, it is believed that particularly carbon nitride (CN), which contains C, is a promising material for a C-containing silicon layer (e.g., an SiC layer or an SiGeC layer). CH can be easily made by, for example, implanting nitrogen ion into a graphite and then performing an annealing process.

FIRST EMBODIMENT

Figure 1:
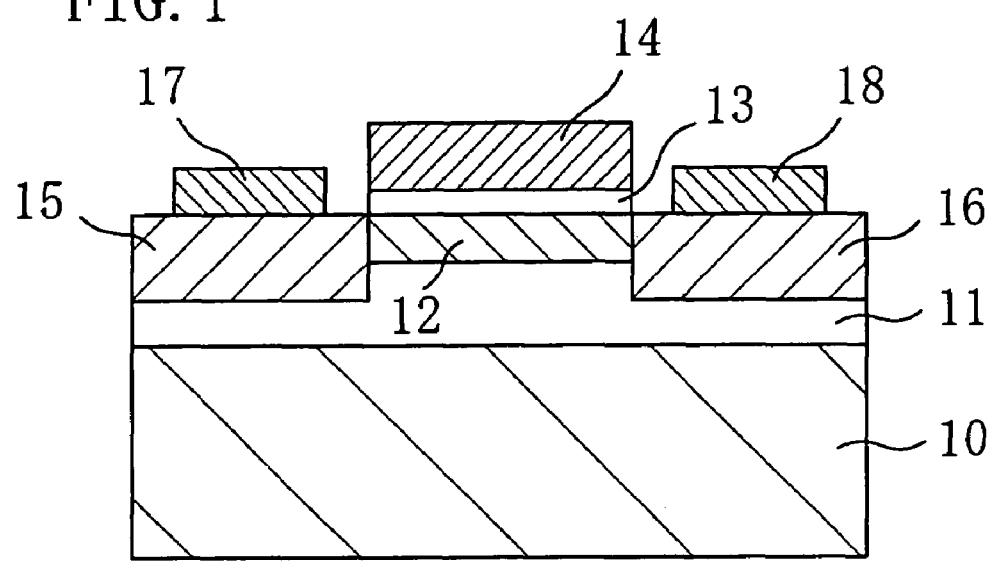
FIG. 1 is a cross-sectional view illustrating an n-MISFET according to the first embodiment of the present invention.

FIG. 1 is a cross-sectional view illustrating a structure of an n-MISFET in which tensile-strained silicon containing carbon is used as a channel according to the first embodiment of the present invention.

A substantially intrinsic Si layer 11, an SiC ($Si_{1-y}C_y$) channel layer 12, which is a silicon layer containing carbon, a CN gate insulating film 13 made of a carbon nitride layer (CN), which is a nitride, and a gate electrode 14 are deposited in this order on a p-type Si substrate 10. The Si layer 11, the SiC channel layer 12 and the CN gate insulating film 13 are all deposited by using an UHV-CVD method. Herein, it is preferred that the thickness of the SiC channel layer 12 is set to a value that is less than or equal to the critical thickness so that a dislocation due to a strain does not occur according to the carbon content. In the present embodiment, the carbon content of the SiC channel layer 12 is 2% (y=0.02), and the thickness of the SiC channel layer 12 is 10 nm. A source region 15 and a drain region 16, which are obtained by introducing a high concentration of an n-type impurity into an SiC layer and an Si layer, are formed on opposite sides of the SiC channel layer 12. Moreover, a source electrode 17 and a drain electrode 18 are formed on the source region 15 and the drain region 16, respectively.

Moreover, the CN gate insulating film 13 may be formed by a method other than a CVD method, such as an MBE method. Furthermore, an SICN film (e.g., an $Si_{3-y}C_yN_4$ film) may be used, instead of a CN gate insulating film, as will be described in a subsequent embodiment.

Figure 2:
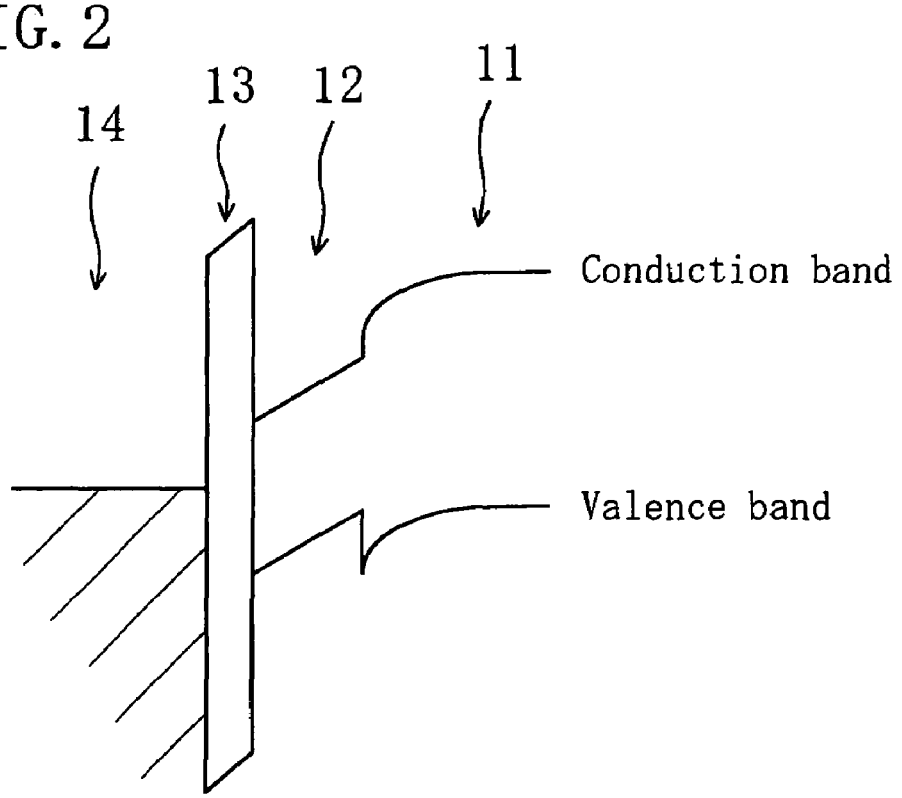
FIG. 2 is an energy band diagram illustrating a band structure along a cross section passing through a gate electrode—CN gate insulating film—SiC channel layer—Si layer of the first embodiment.

FIG. 2 is an energy band diagram illustrating a band structure along a cross section passing through the gate electrode 14—CN gate insulating film 13—SiC channel layer 12—Si layer 11 of the n-MISFET of the present embodiment. When a positive voltage is applied to the gate electrode 14, the band is bent in a direction in which the potential of the gate electrode 14 decreases. Then, when the SIC channel layer 12 is brought into an inverted state, a current flows between the source region 15 and the drain region 16. At this time, since the lattice constant of the $Si_{1-y}C_y$ crystal of the SiC channel layer 12 is smaller than that of the Si crystal, the SiC channel layer 12 will be under a tensile strain in a case where the SiC channel layer 12 is grown on the Si layer 11 with a thickness less than or equal to the critical thickness. Then, due to the tensile strain, the band gap of the SiC channel layer 12 is substantially reduced, and the conduction band of the SiC channel layer 12 will be in a state where the degeneracy is lifted as follows.

Figure 11:
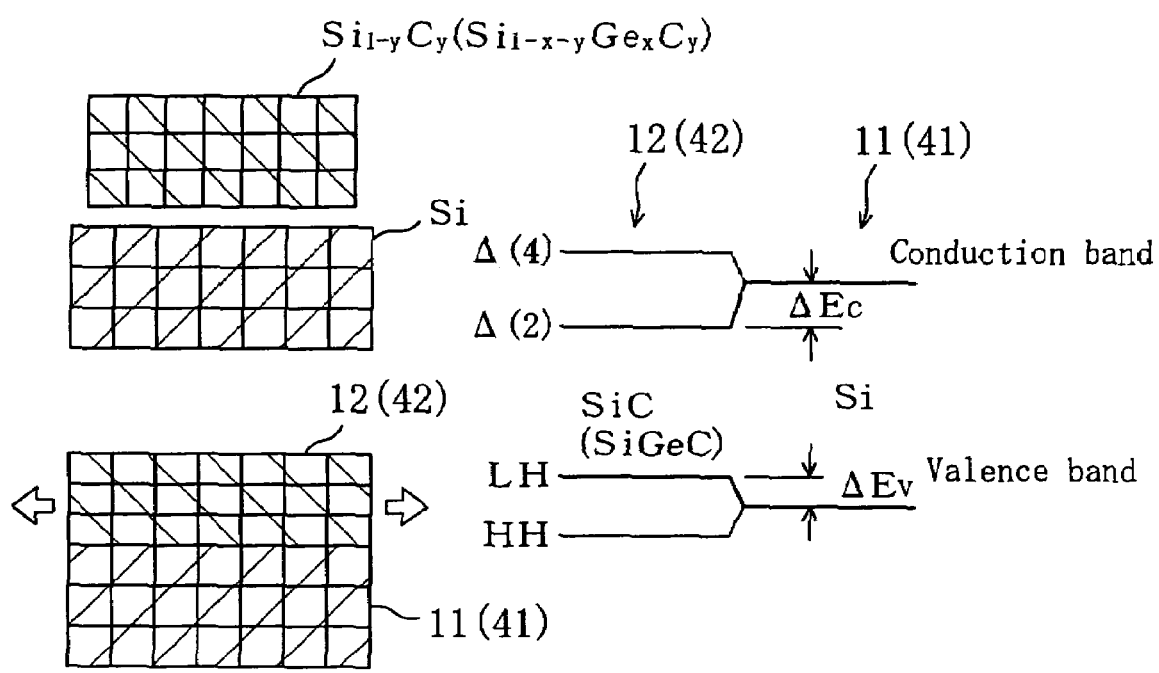
FIG. 11 is an energy band diagram illustrating a degenerated state of the conduction band and the valence band in an Si layer and that in an SiGeC channel layer when a tensile strain is applied to the SiC channel layer.

FIG. 11 is an energy band diagram illustrating a degenerated state of the conduction band and the valence band in the Si layer and that in the SiC channel layer in a case where the SiC channel layer 12 having a lattice constant that is smaller than that of the Si layer 11 is provided on the Si layer 11, thus applying a tensile strain to the SiC channel layer 12. As illustrated in the figure, the conduction band in the Si layer 11 is degenerated in 6 fold, whereas the conduction band in the tensile-strained SiC channel layer 12 is split into 2-fold and 4-fold degenerated bands (Δ(2) and Δ(4)). The band Δ(2), which is the 2-fold degenerated conduction band edge in the SiC channel layer 12, has a potential that is lower than that of the Si layer 11. At this time, the band offset value ΔEc at the conduction band edge formed between the Si layer 11 and the SiC channel layer 12 is about 150 meV. On the other hand, the degeneracy is similarly lifted also in the valence band of the SiC channel layer 12, and the band is split into light hole (LH) and heavy hold (HH) bands.

Therefore, as illustrated in FIG. 2, an energy barrier of an insulator is formed between the SiC channel layer 12 and the CN gate insulating film 13 at the conduction band edge of the SiC channel layer 12, and a hetero barrier is formed between the SiC channel layer 12 and the Si layer 11. Thus, the SiC channel layer 12 is in a quantum well structure sandwiched between the Si layer 11 having a large band gap and the CN gate insulating film 13.

In such a state, when a positive voltage is applied to the gate electrode 14 and the SiC channel layer 12 is brought into an inverted state, excited electrons are confined in the SiC channel layer 12, which is a quantum well. Then, even if the electron density increases, substantially no electrons will cross over the hetero barrier, but the electrons travel through the SiC channel layer 12 in the direction perpendicular to the sheet of FIG. 2. Since the effective mass of the electrons that travel in this direction is small, the electron mobility in the SiC channel layer 12 is improved. Moreover, since the impurity concentration in the SiC channel layer 12 is small, the electrons that travel through the SiC channel layer 12 can travel at a high speed without being substantially subject to scattering due to an impurity. Therefore, it is possible to obtain a field effect transistor that operates at a high speed.

Since the channel layer is formed not by an Si layer but by an SiC layer, which is a second semiconductor layer containing Si and C, it is possible to apply a tensile strain to the SiC channel layer 12 only by adjusting the C content without providing a thick buffer layer for lattice relaxation under the SiC channel layer 12. Moreover, since the gate insulating film 13 is made of a nitride, it is possible to suppress the occurrence of defects due to, for example, diffusion of C of the SiC channel layer 12 without providing an Si cap layer. If an Si cap layer is provided, a parasitic channel may possibly occur between the Si cap layer and the gate insulating film. However, since the Si cap layer is absent, a parasitic channel will not occur. Therefore, it is possible to obtain a semiconductor device including a transistor having a high current drivability, while maintaining a good crystallinity of the channel layer.

Thus, it is possible to avoid the occurrence of a parasitic channel while using an Si/SiC hetero interface, and it is possible to obtain a transistor that operates at a high speed by utilizing the fact that the degeneracy of the conduction band can be lifted.

SECOND EMBODIMENT

Figure 3:
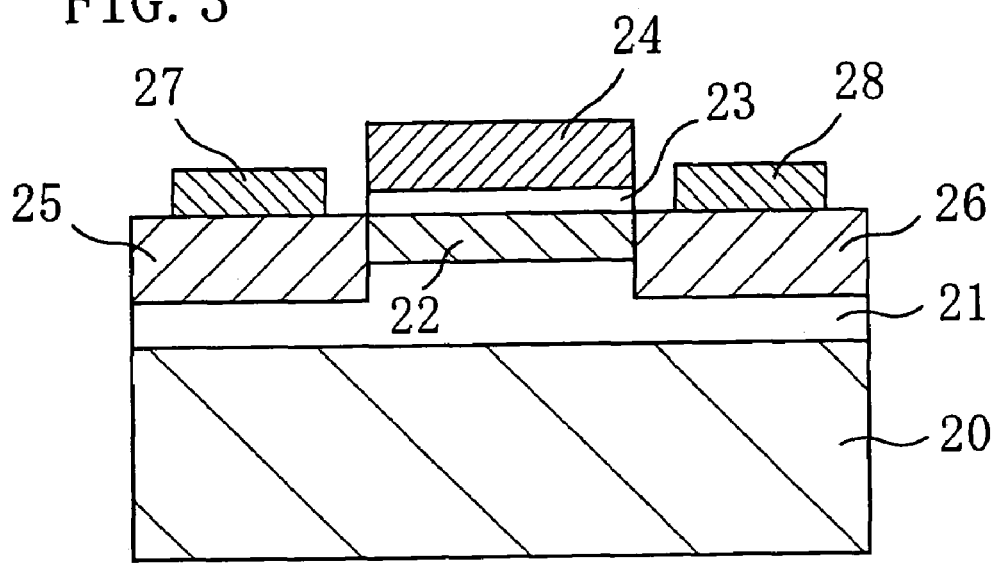
FIG. 3 is a cross-sectional view illustrating a p-MISFET according to the second embodiment of the present invention.

FIG. 3 is a cross-sectional view illustrating a structure of a p-MISFET in which tensile-strained silicon containing carbon is used as a channel according to the second embodiment of the present invention.

A substantially intrinsic Si layer 21, an SiC ($Si_{1-y}C_y$) channel layer 22, which is a silicon layer containing carbon, a CN gate insulating film 23 and a gate electrode 24 are deposited in this order on an n-type Si substrate 20. The Si layer 21, the SiC channel layer 22 and the CN gate insulating film 23 are all deposited by using an UHV-CVD method. Herein, it is preferred that the thickness of the SiC channel layer 22 is set to a value that is less than or equal to the critical thickness so that a dislocation due to a strain does not occur according to the carbon concentration. In the present embodiment, the carbon content of the SiC channel layer 22 is 2% (y=0.02), and the thickness of the SiC channel layer 22 is 10 nm. A source region 25 and a drain region 26, which are obtained by introducing a high concentration of a p-type impurity into an SiC layer and an Si layer, are formed on opposite sides of the SiC channel layer 22. Moreover, a source electrode 27 and a drain electrode 28 are formed on the source region 25 and the drain region 26, respectively.

Note that the CN gate insulating film 23 may be formed by a method other than a CVD method, such as an MBE method. Furthermore, an SiCN film (e.g., an $Si_{3-y}C_yN_4$ film) may be used, instead of a CN gate insulating film, as will be described in a subsequent embodiment.

Figure 4:
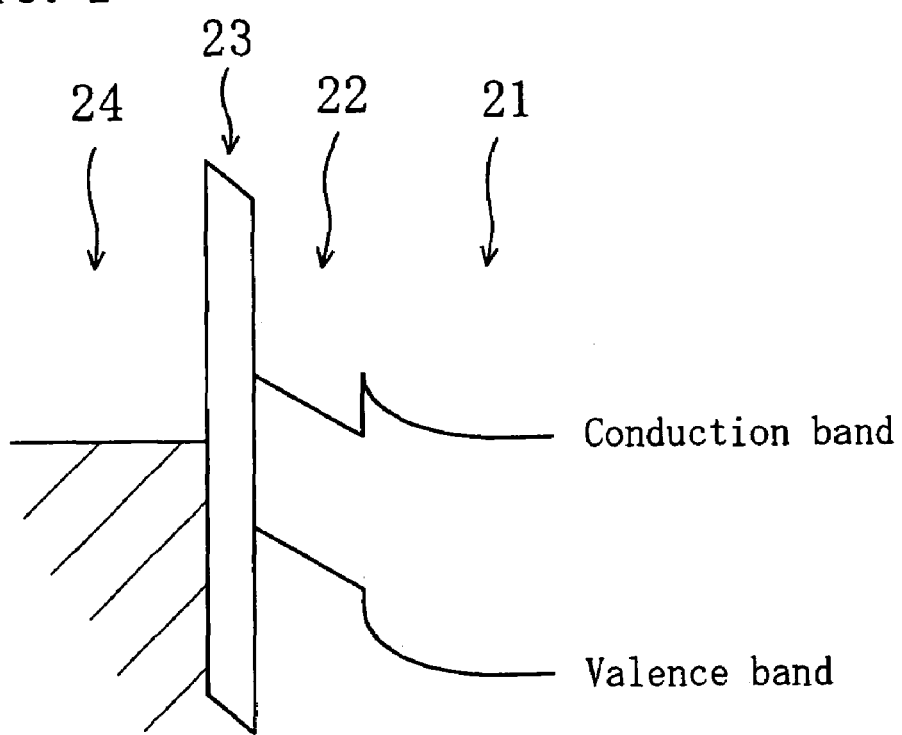
FIG. 4 is an energy band diagram illustrating a band structure along a cross section passing through a gate electrode—CN gate insulating film—SiC channel layer—Si layer of the second embodiment.

FIG. 4 is an energy band diagram illustrating a band structure along a cross section passing through the gate electrode 24—CN gate insulating film 23—SiC channel layer 22—Si layer 21 of the n-MISFET of the present embodiment. When a negative voltage is applied to the gate electrode 24, the band is bent in a direction in which the potential of the gate electrode 24 increases. Then, when the SiC channel layer 22 is brought into an inverted state, a current flows between the source region 25 and the drain region 26. At this time, since the lattice constant of the $Si_{1-y}C_y$ crystal of the SiC channel layer 22 is smaller than that of the Si crystal, the SiC channel layer 22 will be under a tensile strain in a case where the SiC channel layer 22 is grown on the Si layer 21 with a thickness less than or equal to the critical thickness. Then, due to the tensile strain, the band gap of the SiC channel layer 22 is substantially reduced, and the valence band of the SiC channel layer 22 will be in a state where the degeneracy is lifted as follows.

That is, as illustrated in FIG. 11, the valence band in the Si layer 21 is degenerated, whereas the degeneracy of the valence band is lifted in the tensile-strained SiC channel layer 22, and the band is split into light hole (LH) and heavy hold (HH) bands.

Therefore, as illustrated in FIG. 4, an energy barrier of an insulator is formed between the SiC channel layer 22 and the CN gate insulating film 23 at the valence band edge of the SiC channel layer 22, and a hetero barrier is formed between the SiC channel layer 22 and the Si layer 21. Thus, the SiC channel layer 22 is in a quantum well structure sandwiched between the Si layer 21 having a large band gap and the CN gate insulating film 23 made of CN.

In such a state, when a negative voltage is applied to the gate electrode 24 and the SiC channel layer 22 is brought into an inverted state, excited holes are confined in the SiC channel layer 22, which is a quantum well. Then, even if the hole density increases, substantially no holes will cross over the hetero barrier, but the holes travel through the SiC channel layer 22 in the direction perpendicular to the sheet of the figure. Furthermore, since the effective mass of the light holes is small, the hole mobility in the SiC channel layer 22 is improved. Moreover, since the impurity concentration in the SiC channel layer 22 is small, the holes that travel through the SiC channel layer 22 can travel at a high speed without being substantially subject to scattering due to an impurity. Therefore, it is possible to obtain a field effect transistor that operates at a high speed.

Since the channel layer is formed not by an Si layer but by an SiC layer, which is a second semiconductor layer containing Si and C, it is possible to apply a tensile strain to the SiC channel layer 22 only by adjusting the C content without providing a thick buffer layer for lattice relaxation under the SiC channel layer 22. Moreover, since the gate insulating film 23 is made of a nitride, it is possible to suppress the occurrence of defects due to, for example, diffusion of C of the SiC channel layer 22 without providing an Si cap layer. If an Si cap layer is provided, a parasitic channel may possibly occur between the Si cap layer and the gate insulating film. However, since the Si cap layer is absent, a parasitic channel will not occur. Therefore, it is possible to obtain a semiconductor device including a transistor having a high current drivability, while maintaining a good crystallinity of the channel layer.

Thus, it is possible to avoid the occurrence of a parasitic channel while using an Si/SiC hetero interface, and it is possible to obtain a transistor that operates at a high speed by utilizing the fact that the degeneracy of the valence band can be lifted.

THIRD EMBODIMENT

Figure 5:
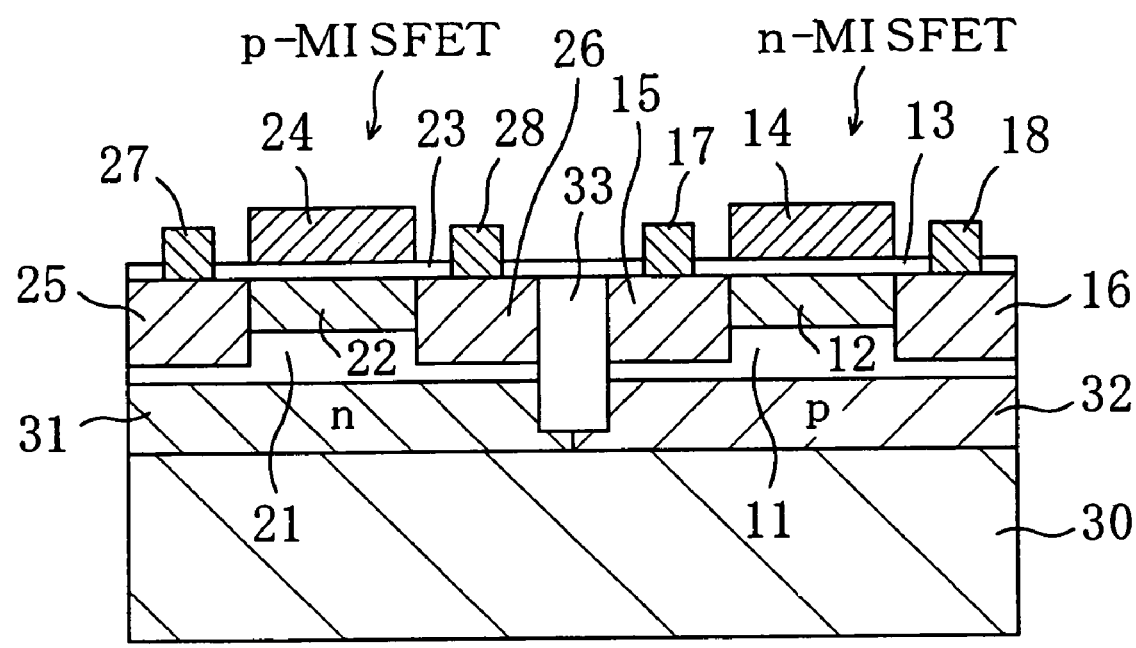
FIG. 5 is a cross-sectional view illustrating a complementary MISFET according to the third embodiment of the present invention.

FIG. 5 is a cross-sectional view illustrating a structure of a complementary MISFET in which tensile-strained silicon containing carbon is used as a channel according to the third embodiment of the present invention.

An n-well 31 and a p-well 32 are provided on an Si substrate 30. A p-MISFET having substantially the same structure as that illustrated in FIG. 3 is provided on the n-well 31, and an n-MISFET having substantially the same structure as that illustrated in FIG. 1 is provided on the p-well 32. Moreover, the p-MISFET and the n-MISFET are electrically insulated from each other by a trench isolation insulating film 33.

Specifically, the Si layer 11, the SiC ($Si_{1-y}C_y$) channel layer 12, which is a silicon layer containing carbon, the CN gate insulating film 13 and the gate electrode 14 are deposited in this order on the p-well 32, substantially as in the structure illustrated in FIG. 1. Also in the present embodiment, the carbon content of the SiC channel layer 12 is 2% (y=0.02), and the thickness of the SiC channel layer 12 is 10 nm. The source region 15 and the drain region 16, which are obtained by introducing a high concentration of an n-type impurity into an SiC layer and an Si layer, are formed on opposite sides of the SiC channel layer 12. Moreover, the source electrode 17 and the drain electrode 18 are formed on the source region 15 and the drain region 16, respectively. Thus, the SiC channel layer 12 is in a quantum well structure sandwiched between the Si layer 11 having a large band gap and the CN gate insulating film 13.

Moreover, the Si layer 21, the SiC ($Si_{1-y}C_y$) channel layer 22, which is a silicon layer containing carbon, the CN gate insulating film 23 and the gate electrode 24 are deposited in this order on the n-well 32, as in the structure illustrated in FIG. 3. Also in the present embodiment, the carbon content of the SiC channel layer 22 is 2% (y=0.02), and the thickness of the SiC channel layer 22 is 10 nm. The source region 25 and the drain region 26, which are obtained by introducing a high concentration of a p-type impurity into an SiC layer and an Si layer, are formed on opposite sides of the SiC channel layer 22. Moreover, the source electrode 27 and the drain electrode 28 are formed on the source region 25 and the drain region 26, respectively. Thus, the SiC channel layer 22 is in a quantum well structure sandwiched between the Si layer 21 having a large band gap and the CN gate insulating film 23.

Thus, in the present embodiment, it is possible to form, from a single SiC film, an n-channel (SiC channel layer 12) and a p-channel (SiC channel layer 22) for confining electrons and holes, respectively.

In a conventional CMOS device using an SiGe/Si hetero junction (see, for example, Japanese Laid-Open Patent Publication No. 61-282278), it is not possible to form hetero barriers for electrons and holes from a single hetero junction structure, and thus such a device employs a structure in which an n-channel and a p-channel are formed by separate hetero junction structures, and many layers are deposited so as to form the two hetero junction structures. As a result, the crystal growth is complicated, and the throughput is lowered. Moreover, since the lower channel layer is far away from the gate insulating film, a sufficient electric field is not applied to the lower channel layer when a gate voltage is applied, whereby it is relatively difficult to create an inverted state for operating the transistor. Furthermore, a thick buffer layer for lattice relaxation is indispensable, thereby reducing the reliability and the throughput, as described above.

However, in the present embodiment, hetero barriers can be formed for both the conduction band edge and the valence band edge by using a single Si/SiC hetero junction structure, and electrons and holes can be confined in the same channel layer. The channel layer of a CMOS device can be formed from a single layer. As a result, the crystal growth is simplified and the throughput is improved.

Thus, it is possible to obtain a complementary MISFET including an n-MISFET and a p-MISFET that are capable of operating at a high speed, because electrons can travel at a high speed through the SiC channel layer 12 having a quantum well structure in the n-MISFET, whereas holes can travel at a high speed through the SiC channel layer 22 having a quantum well structure in the p-MISFET, as described in the first and second embodiments. Furthermore, both in the n-MISFET and in the p-MISFET, an Si cap layer is not necessary, whereby it is possible to prevent a parasitic channel from occurring and to obtain a transistor having a high current drivability.

FOURTH EMBODIMENT

Figure 6:
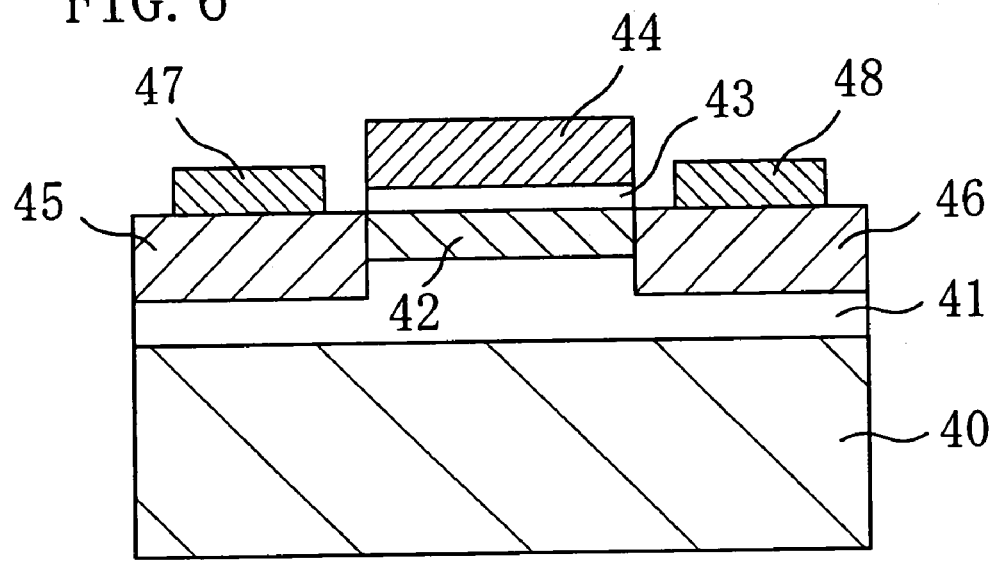
FIG. 6 is a cross-sectional view illustrating an n-MISFET according to the fourth embodiment of the present invention.

FIG. 6 is a cross-sectional view illustrating a structure of an n-MISFET in which tensile-strained silicon containing germanium and carbon is used as a channel according to an embodiment of the present invention.

A substantially intrinsic Si layer 41, an SiGeC ($Si_{1-x-y}Ge_xC_y$) channel layer 42, which is a silicon layer containing carbon, a CN gate insulating film 43 and a gate electrode 44 are deposited in this order on a p-type Si substrate 40. The Si layer 41, the SiGeC channel layer 42 and the CN gate insulating film 43 are all deposited by using an UHV-CVD method. Herein, it is preferred that the thickness of the SiGeC channel layer 42 is set to a value that is less than or equal to the critical thickness so that a dislocation due to a strain does not occur according to the Ge and C concentrations. The channel layer, which is represented by the composition formula $Si_{1-x-y}Ge_xC_y$, is subject to a tensile strain when the Ge composition ratio x and the C composition ratio y are in the relationship of x<8.2y.

Moreover, it is preferred that the thickness of the SiGeC channel layer 42 is set to a value that is less than or equal to the critical thickness so that a dislocation due to a strain does not occur according to the carbon concentration and the germanium concentration. Herein, the Ge content is set to be 20% and the C content to be 4%, and the thickness of the SiGeC channel layer 42 is set to be 10 nm.

A source region 45 and a drain region 46, which are obtained by introducing a high concentration of an n-type impurity into an SiGeC layer and an Si layer, are formed on opposite sides of the SiGeC channel layer 42. Moreover, a source electrode 47 and a drain electrode 48 are formed on the source region 45 and the drain region 46, respectively.

Note that the CN gate insulating film 43 may be formed by a method other than a CVD method, such as an MBE method. Furthermore, an SiGeCN film (e.g., an $Si_{3-x-y}Ge_xC_yN_4$ film) may be used, instead of a CN gate insulating film, as will be described in a subsequent embodiment.

Figure 7:
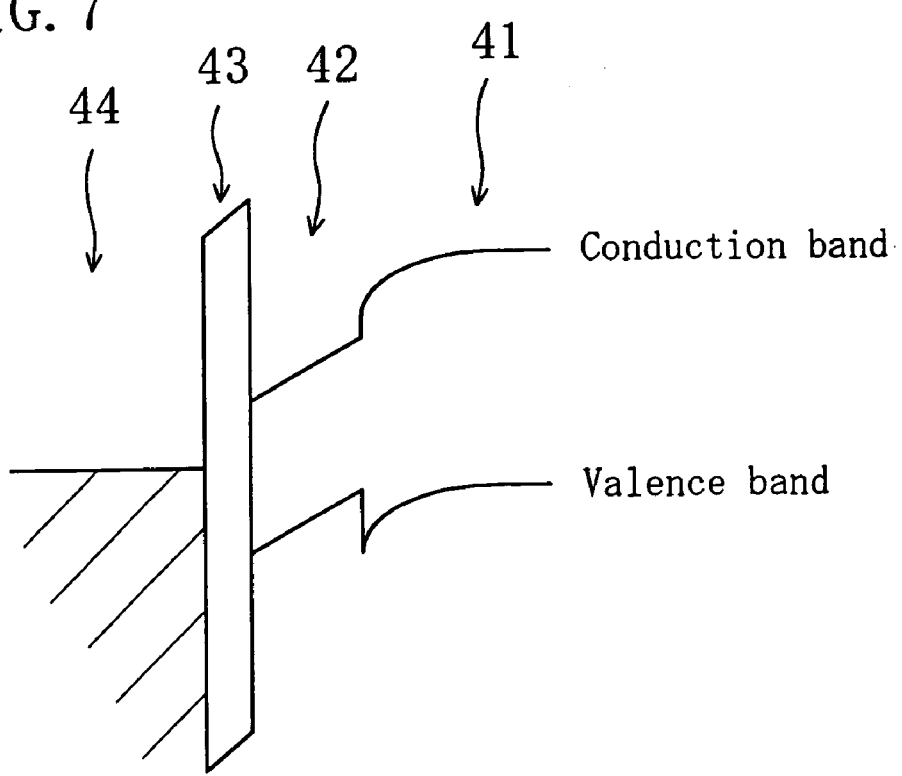
FIG. 7 is an energy band diagram illustrating a band structure along a cross section passing through a gate electrode—CN gate insulating film—SiGeC channel layer—Si layer of the fourth embodiment.

FIG. 7 is an energy band diagram illustrating a band structure along a cross section passing through the gate electrode 44—CN gate insulating film 43—SiGeC channel layer 42—Si layer 41 of the n-MISFET of the present embodiment. When a positive voltage is applied to the gate electrode 44, the band is bent in a direction in which the potential of the gate electrode 44 decreases. Then, when the SiGeC channel layer 42 is brought into an inverted state, a current flows between the source region 45 and the drain region 46. At this time, the lattice constant of the $Si_{1-x-y}Ge_xC_y$ crystal of the SiGeC channel layer 42 can be made smaller than that of the Si crystal by adjusting the composition ratio of Ge and C. Therefore, the SiGeC channel layer 42 will be under a tensile strain in a case where the SiGeC channel layer 42 having a smaller lattice constant than that of the Si layer 41 is grown on the Si layer 41 with a thickness less than or equal to the critical thickness. Then, due to the tensile strain, the band gap of the SiGeC channel layer 42 is substantially reduced, and the conduction band of the SiGeC channel layer 42 will be in a state where the degeneracy is lifted as follows.

That is, as illustrated in FIG. 11, the conduction band in the Si layer 41 is degenerated in 6 fold, whereas the conduction band in the tensile-strained SiGeC channel layer 42 is split into 2-fold and 4-fold degenerated bands (Δ(2) and Δ(4)). The band Δ(2), which is the 2-fold degenerated conduction band edge in the SiGeC channel layer 42, has a potential that is smaller than that of the Si layer 41. At this time, the band offset value ΔEc at the conduction band edge formed between the Si layer 41 and the SiGeC channel layer 42 is about 60 meV. On the other hand, the degeneracy is similarly lifted also in the valence band of the SiGeC channel layer 42, and the band is split into light hole (LH) and heavy hold (HH) bands.

Therefore, as illustrated in FIG. 7, an energy barrier of an insulator is formed between the SiGeC channel layer 42 and the CN gate insulating film 43 at the conduction band edge of the SiGeC channel layer 42, and a hetero barrier is formed between the SiGeC channel layer 42 and the Si layer 41. Thus, the SiGeC channel layer 42 is in a quantum well structure sandwiched between the Si layer 41 having a large band gap and the CN gate insulating film 43.

In such a state, when a positive voltage is applied to the gate electrode 44 and the SiGeC channel layer 42 is brought into an inverted state, excited electrons are confined in the SiGeC channel layer 42, which is a quantum well. Then, even if the electron density increases, substantially no electrons will cross over the hetero barrier, but the electrons travel through the SiGeC channel layer 42 in the direction perpendicular to the sheet of FIG. 7. Since the effective mass of the electrons that travel in this direction is small, the electron mobility in the SiGeC channel layer 42 is improved. Moreover, since the impurity concentration in the SiGeC channel layer 42 is small, the electrons that travel through the SiGeC channel layer 42 can travel at a high speed without being substantially subject to scattering due to an impurity. Therefore, it is possible to obtain a field effect transistor that operates at a high speed.

Since the channel layer is formed not by an Si layer but by an SiGeC layer, which is a second semiconductor layer containing Si, Ge and C, it is possible to apply a tensile strain to the SiGeC channel layer 42 only by adjusting the C content without providing a thick buffer layer for lattice relaxation under the SiGeC channel layer 42. Moreover, since the gate insulating film 43 is made of a nitride, it is possible to suppress the occurrence of defects due to, for example, diffusion of C of the SiGeC channel layer 42 without providing an Si cap layer. If an Si cap layer is provided, a parasitic channel may possibly occur between the Si cap layer and the gate insulating film. However, since the Si cap layer is absent, a parasitic channel will not occur. Therefore, it is possible to obtain a semiconductor device including a transistor having a high current drivability, while maintaining a good crystallinity of the channel layer.

Thus, it is possible to avoid the occurrence of a parasitic channel while using an Si/SiGeC hetero interface, and it is possible to obtain a transistor that operates at a high speed by utilizing the fact that the degeneracy of the conduction band can be lifted.

FIFTH EMBODIMENT

Figure 8:
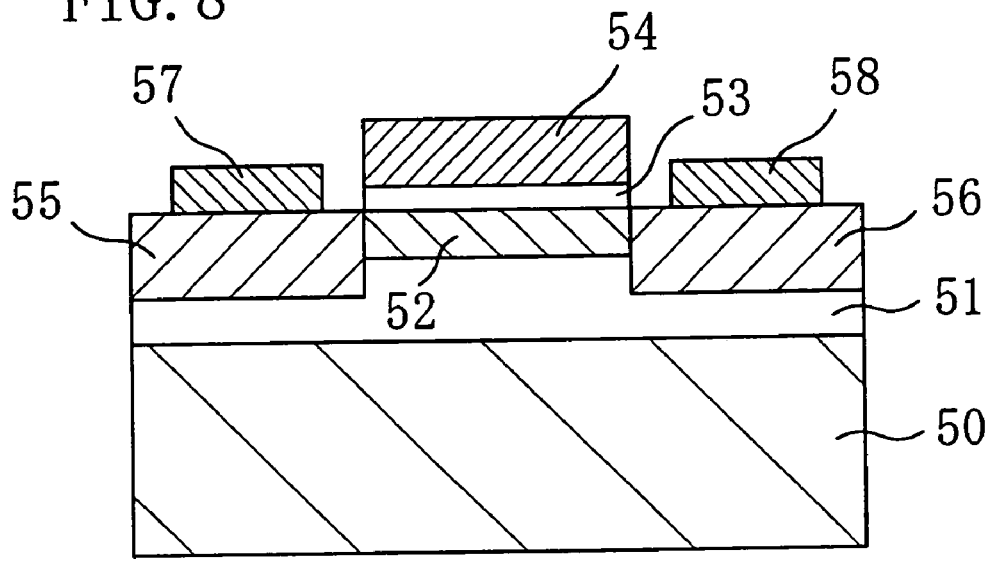
FIG. 8 is a cross-sectional view illustrating a p-MISFET according to the fifth embodiment of the present invention.

FIG. 8 is a is a cross-sectional view illustrating a structure of a p-MISFET in which tensile-strained silicon containing germanium and carbon is used as a channel according to an embodiment of the present invention.

A substantially intrinsic Si layer 51, an SiGeC ($Si_{1-x-y}Ge_xC_y$) channel layer 52, which is a silicon layer containing carbon, a CN gate insulating film 53 and a gate electrode 54 are deposited in this order on an n-type Si substrate 50. The Si layer 51, the SiGeC channel layer 52 and the CN gate insulating film 53 are all deposited by using an UHV-CVD method. Herein, it is preferred that the thickness of the SiGeC channel layer 42 is set to a value that is less than or equal to the critical thickness so that a dislocation due to a strain does not occur according to the Ge and C concentrations. The channel layer, which is represented by the composition formula $Si_{1-x-y}Ge_xC_y$, is subject to a tensile strain when the Ge composition ratio x and the C composition ratio y are in the relationship of x<8.2y.

Moreover, it is preferred that the thickness of the SiGeC channel layer 42 is set to a value that is less than or equal to the critical thickness so that a dislocation due to a strain does not occur according to the carbon concentration and the germanium concentration. Herein, the Ge content is set to be 20% and the C content to be 4%, and the thickness of the SiGeC channel layer 42 is set to be 10 nm.

A source region 55 and a drain region 56, which are obtained by introducing a high concentration of an n-type impurity into an SiGeC layer and an Si layer, are formed on opposite sides of the SiGeC channel layer 52. Moreover, a source electrode 57 and a drain electrode 58 are formed on the source region 55 and the drain region 56, respectively.

Note that the CN gate insulating film 53 may be formed by a method other than a CVD method, such as an MBE method. Furthermore, an SiGeCN film (e.g., an $Si_{3-x-y}Ge_xC_yN_4$ film) may be used, instead of a CN gate insulating film, as will be described in a subsequent embodiment.

Figure 9:
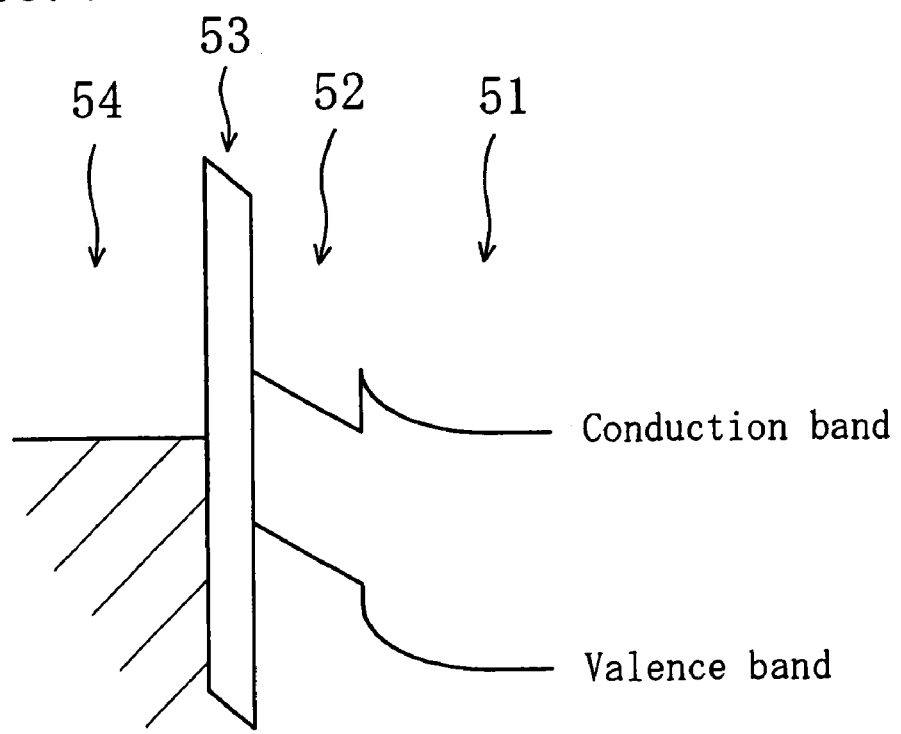
FIG. 9 is an energy band diagram illustrating a band structure along a cross section passing through a gate electrode—CN gate insulating film—SiGeC channel layer—Si layer of the fifth embodiment.

FIG. 9 is an energy band diagram illustrating a band structure along a cross section passing through the gate electrode 54—CN gate insulating film 53—SiGeC channel layer 52—Si layer 51 of the p-MISFET of the present embodiment. When a negative voltage is applied to the gate electrode 54, the band is bent in a direction in which the potential of the gate electrode 54 increases. Then, when the SiGeC channel layer 52 is brought into an inverted state, a current flows between the source region 55 and the drain region 56. At this time, the lattice constant of the $Si_{1-x-y}Ge_xC_y$ crystal of the SiGeC channel layer 52 can be made smaller than that of the Si crystal by adjusting the composition ratio of Ge and C. Therefore, the SiGeC channel layer 52 will be under a tensile strain in a case where the SiGeC channel layer 52 having a smaller lattice constant than that of the Si layer 51 is grown on the Si layer 51 with a thickness less than or equal to the critical thickness. Then, due to the tensile strain, the band gap of the SiGeC channel layer 52 is substantially reduced, and the valence band of the SiGeC channel layer 52 will be in a state where the degeneracy is lifted as follows.

That is, as illustrated in FIG. 11, the valence band in the Si layer 51 is degenerated, whereas the degeneracy of the valence band is lifted in the tensile-strained SiGeC channel layer 52, and the band is split into light hole (LH) and heavy hold (HH) bands.

Therefore, as illustrated in FIG. 9, an energy barrier of an insulator is formed between the SiGeC channel layer 52 and the CN gate insulating film 53 at the valence band edge of the SiGeC channel layer 52, and a hetero barrier is formed between the SiGeC channel layer 52 and the Si layer 51. Thus, the SiGeC channel layer 52 is in a quantum well structure sandwiched between the Si layer 51 having a large band gap and the CN gate insulating film 53.

In such a state, when a negative voltage is applied to the gate electrode 54 and the SiGeC channel layer 52 is brought into an inverted state, excited holes are confined in the SiGeC channel layer 52, which is a quantum well. Then, even if the hole density increases, substantially no holes will cross over the hetero barrier, but the holes travel through the SiGeC channel layer 52 in the direction perpendicular to the sheet of the figure. Furthermore, since the effective mass of the light holes is small, the hole mobility in the SiGeC channel layer 52 is improved. Moreover, since the impurity concentration in the SiGeC channel layer 52 is small, the holes that travel through the SiGeC channel layer 52 can travel at a high speed without being substantially subject to scattering due to an impurity. Particularly, in a case where the SiGeC channel layer 52 is used, as compared with a case where the SiC channel layer 22 is used, it is easy to raise the hetero barrier on the valence band edge side by adjusting the composition of Ge and C, thereby improving the hole confining efficiency.

Since the channel layer is formed not by an Si layer but by an SiGeC layer, which is a second semiconductor layer containing Si, Ge and C, it is possible to apply a tensile strain to the SiGeC channel layer 52 only by adjusting the C content without providing a thick buffer layer for lattice relaxation under the SiGeC channel layer 52. Moreover, since the gate insulating film 53 is made of a nitride, it is possible to suppress the occurrence of defects due to, for example, diffusion of Ge or C of the SiGeC channel layer 52 without providing an Si cap layer. If an Si cap layer is provided, a parasitic channel may possibly occur between the Si cap layer and the gate insulating film. However, since the Si cap layer is absent, a parasitic channel will not occur. Therefore, it is possible to obtain a semiconductor device including a transistor having a high current drivability, while maintaining a good crystallinity of the channel layer.

Thus, it is possible to avoid the occurrence of a parasitic channel while using an Si/SiGeC hetero interface, and it is possible to obtain a transistor that operates at a high speed by utilizing the fact that the degeneracy of the valence band can be lifted.

SIXTH EMBODIMENT

Figure 10:
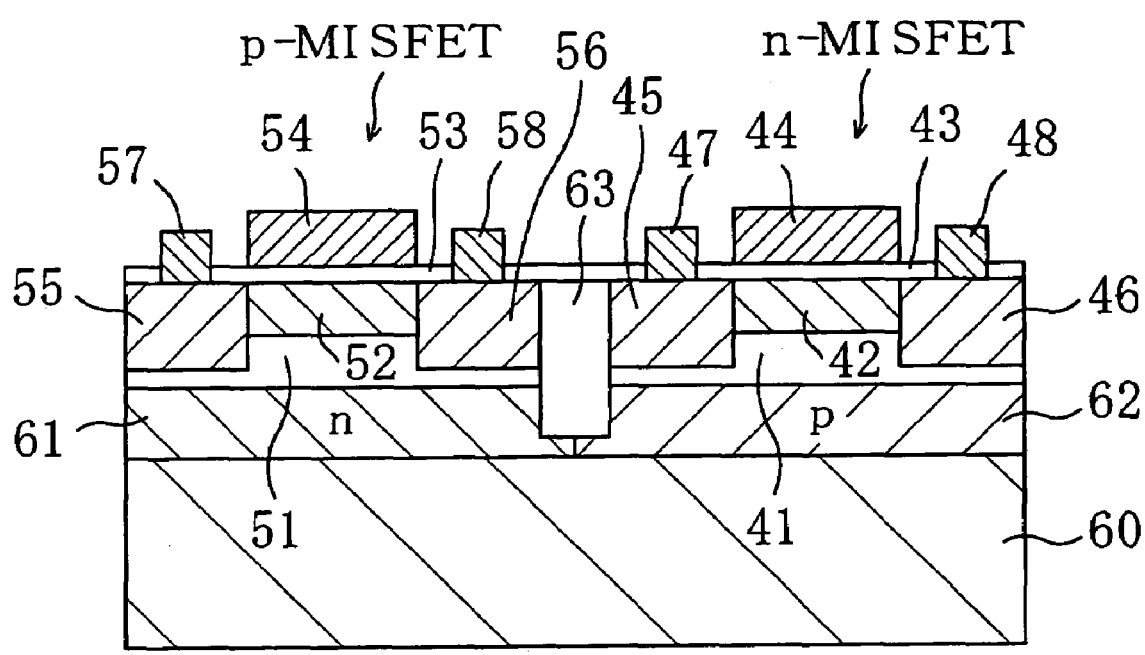
FIG. 10 is a cross-sectional view illustrating a complementary MISFET according to the sixth embodiment of the present invention.

FIG. 10 is a cross-sectional view illustrating a structure of a complementary MISFET in which tensile-strained silicon containing germanium and carbon is used as a channel according to an embodiment of the present invention.

An n-well 61 and a p-well 62 are provided on an Si substrate 60. A p-MISFET having substantially the same structure as that illustrated in FIG. 8 is provided on the n-well 61, and an n-MISFET having substantially the same structure as that illustrated in FIG. 6 is provided on the p-well 62. Moreover, the p-MISFET and the n-MISFET are electrically insulated from each other by a trench isolation insulating film 63.

Specifically, the Si layer 41, the SiGeC ($Si_{1-x-y}Ge_xC_y$) channel layer 42, which is a silicon layer containing carbon, the CN gate insulating film 43 and the gate electrode 44 are deposited in this order on the p-well 62, substantially as in the structure illustrated in FIG. 6. Also in the present embodiment, the Ge composition ratio x and the C composition ratio y in the channel layer, which is represented by the composition formula $Si_{1-x-y}Ge_xC_y$, are set so as to satisfy x<8.2y so that the channel layer is subject to a tensile strain.

Moreover, the Ge content is set to be 20% and the C content to be 4%, and the thickness of the SiGeC channel layer 42 is set to be 10 nm, i.e., a thickness less than or equal to the critical thickness so that a dislocation due to a strain does not occur in the SiGeC channel layer 42.

The source region 45 and the drain region 46, which are obtained by introducing a high concentration of an n-type impurity into an SiGeC layer and an Si layer, are formed on opposite sides of the SiGeC channel layer 42. Moreover, the source electrode 47 and the drain electrode 48 are formed on the source region 45 and the drain region 46, respectively. Thus, the SiGeC channel layer 42 is in a quantum well structure sandwiched between the Si layer 41 having a large band gap and the CN gate insulating film 43.

Moreover, the Si layer 51, the SiGeC ($Si_{1-x-y}Ge_xC_y$) channel layer 52, which is a silicon layer containing carbon, the CN gate insulating film 53 and the gate electrode 54 are deposited in this order on the n-well 62, as in the structure illustrated in FIG. 8. Also in the present embodiment, the Ge composition ratio x and the C composition ratio y in the channel layer, which is represented by the composition formula $Si_{1-x-y}Ge_xC_y$, are set so as to satisfy x<8.2y so that the channel layer is subject to a tensile strain.

Moreover, the Ge content is set to be 20% and the C content to be 4%, and the thickness of the SiGeC channel layer 42 is set to be 10 nm, i.e., a thickness less than or equal to the critical thickness so that a dislocation due to a strain does not occur in the SiGeC channel layer 42.

The source region 55 and the drain region 56, which are obtained by introducing a high concentration of a p-type impurity into an SiGeC layer and an Si layer, are formed on opposite sides of the SiGeC channel layer 52. Moreover, the source electrode 57 and the drain electrode 58 are formed on the source region 55 and the drain region 56, respectively. Thus, the SiGeC channel layer 52 is in a quantum well structure sandwiched between the Si layer 51 having a large band gap and the CN gate insulating film 53.

In the present embodiment, it is possible to form, from a single SiGeC film, an n-channel (SiGeC channel layer 42) and a p-channel (SiGeC channel layer 52) for confining electrons and holes, respectively, as illustrated in FIG. 10. As a result, the crystal growth is simplified and the throughput is improved.

Thus, it is possible to obtain a complementary MISFET including an n-MISFET and a p-MISFET that are capable of operating at a high speed, because electrons can travel at a high speed through the SiGeC channel layer 42 having a quantum well structure in the n-MISFET, whereas holes can travel at a high speed through the SiGeC channel layer 52 having a quantum well structure in the p-MISFET, as described in the fourth and fifth embodiments. Moreover, since the channel layer can be formed at a position close to the gate insulating film, a sufficient electric field effect can be expected.

SEVENTH EMBODIMENT

Figure 12:
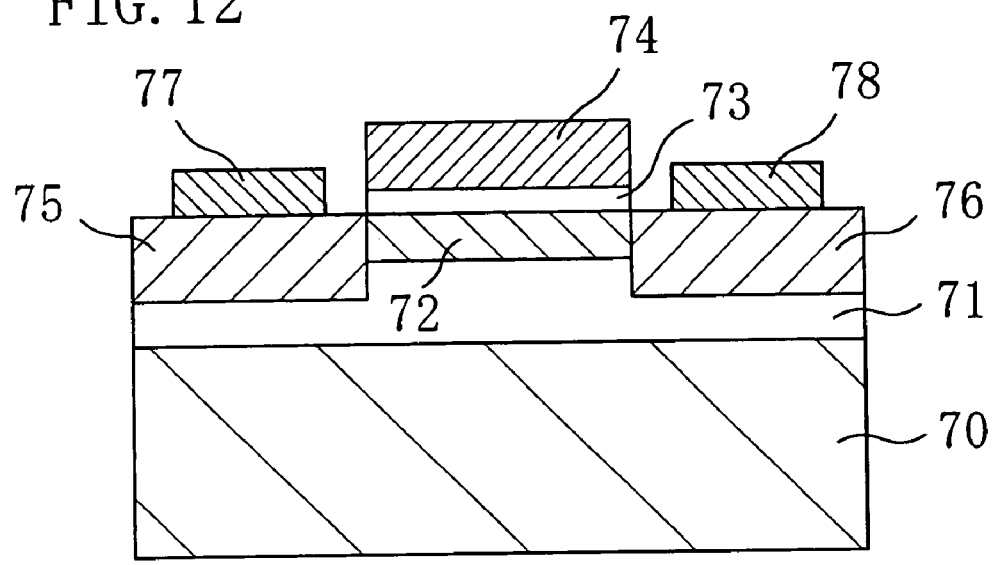
FIG. 12 is a cross-sectional view illustrating a structure of an n-MISFET in which compressive-strained silicon containing Ge is used as a channel according to the seventh embodiment of the present invention.

FIG. 12 is a cross-sectional view illustrating a structure of an n-MISFET in which compressive-strained silicon containing Ge is used as a channel according to the seventh embodiment of the present invention.

A substantially intrinsic Si layer 71, an SiGe ($Si_{1-x}Ge_x$) channel layer 72, which is a silicon layer containing germanium, a CN gate insulating film 73 made of a carbon nitride layer (CN), which is a nitride, and a gate electrode 74 are deposited in this order on a p-type Si substrate 70. The Si layer 71, the SiGe channel layer 72 and the CN gate insulating film 73 are all deposited by using an UHV-CVD method. Herein, it is preferred that the thickness of the SiGe channel layer 72 is set to a value that is less than or equal to the critical thickness so that a dislocation due to a strain does not occur according to the Ge content. Then, the SiGe channel layer 72 is subject to a compressive strain according to the Ge content x due to the lattice mismatch with the underlying Si layer 71. In the present embodiment, the Ge content of the SiGe channel layer 72 is 20% (x=0.2), and the thickness of the SiGe channel layer 72 is 10 nm.

A source region 75 and a drain region 76, which are obtained by introducing a high concentration of an n-type impurity into an SiGe layer and an Si layer, are formed on opposite sides of the SiGe channel layer 72. Moreover, a source electrode 77 and a drain electrode 78 are formed on the source region 75 and the drain region 76, respectively.

Note that the CN gate insulating film 73 may be formed by a method other than a CVD method, such as an MBE method. Furthermore, an SiGeN film (e.g., an $Si_{3-x}Ge_xN_4$ film) may be used, instead of a CN gate insulating film, as will be described in a subsequent embodiment.

Figure 13:
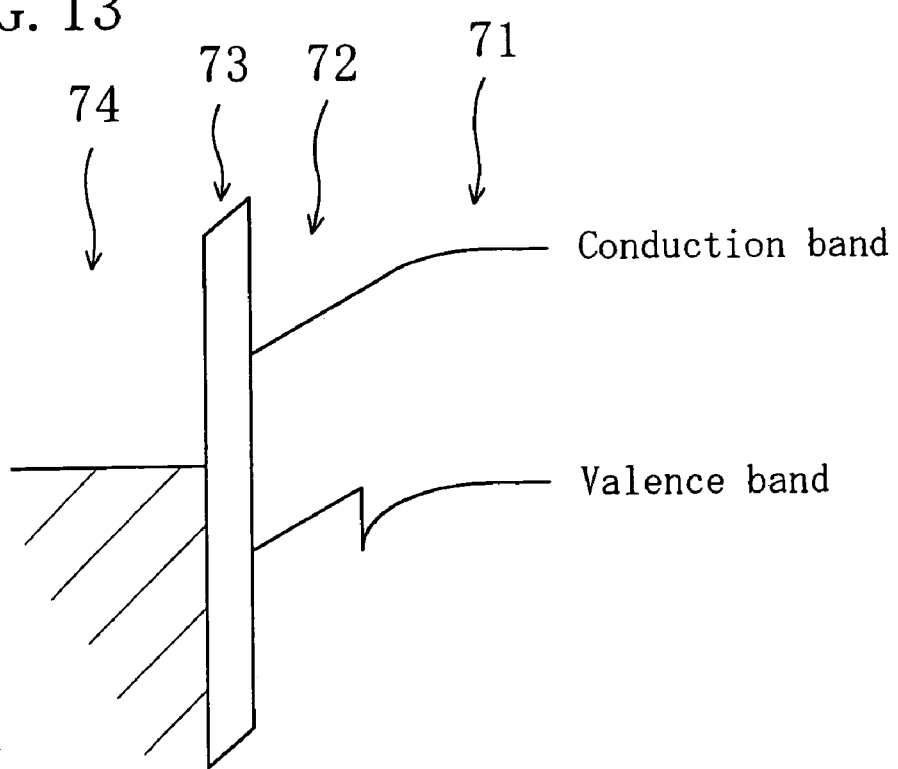
FIG. 13 is an energy band diagram illustrating a band structure along a cross section passing through a gate electrode—CN gate insulating film—SiGe channel layer—Si layer of the n-MISFET of the seventh embodiment.

FIG. 13 is an energy band diagram illustrating a band structure along a cross section passing through the gate electrode 74—CN gate insulating film 73—SiGe channel layer 72—Si layer 71 of the n-MISFET of the present embodiment. When a positive voltage is applied to the gate electrode 74, the band is bent in a direction in which the potential of the gate electrode 74 decreases. Then, when the SiGe channel layer 72 is brought into an inverted state, a current flows between the source region 75 and the drain region 76. At this time, since the lattice constant of the $Si_{1-x}Ge_x$ crystal of the SiGe channel layer 72 is larger than that of the Si crystal, the SiGe channel layer 72 will be under a compressive strain in a case where the SiGe channel layer 72 is grown on the Si layer 71 with a thickness less than or equal to the critical thickness. Then, due to the compressive strain, the conduction band and the valence band of the SiGe channel layer 72 will be in a state where the degeneracy is lifted as follows.

Figure 17:
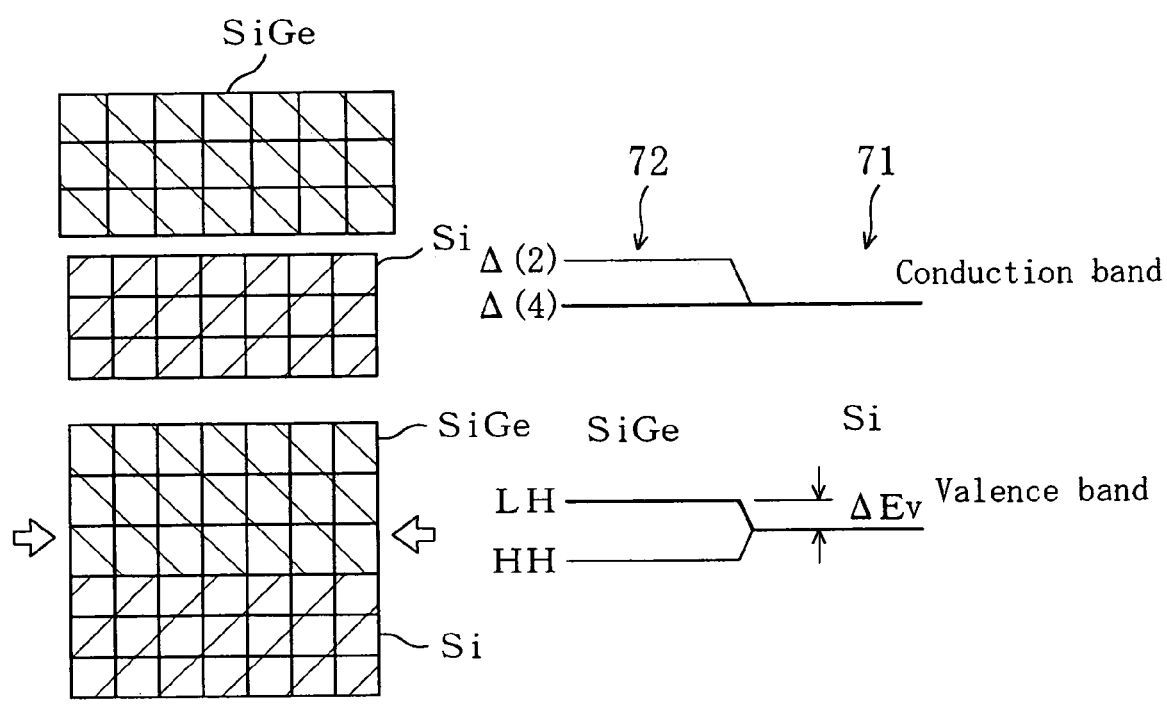
FIG. 17 is an energy band diagram illustrating a degenerated state of the conduction band and the valence band when an SiGe channel layer is provided on an Si layer and a compressive strain is applied to the SiGe channel layer.

FIG. 17 is an energy band diagram illustrating a degenerated state of the conduction band and the valence band in the Si layer and that in the SiGe channel layer in a case where the SiGe channel layer 72 having a lattice constant that is larger than that of the Si layer 71 is provided on the Si layer 71, thus applying a compressive strain to the SiGe channel layer 72. As illustrated in the figure, the conduction band in the Si layer 71 is degenerated in 6 fold, whereas the conduction band in the compressive-strained SiGe channel layer 72 is split into 2-fold and 4-fold degenerated bands ($\Delta(2)$ and $\Delta(4)$). The band $\Delta(4)$, which is the 4-fold degenerated conduction band edge in the SiGe channel layer 72, has a potential that is substantially the same as that of the Si layer 71. Thus, at this time, the band offset value $\Delta Ec$ at the conduction band edge formed between the Si layer 71 and the SiGe channel layer 72 is substantially 0 meV. On the other hand, the degeneracy is similarly lifted also in the valence band of the SiGe channel layer 72, and the band is split into light hole (LH) and heavy hold (HH) bands.

Therefore, as illustrated in FIG. 13, an energy barrier of an insulator is formed between the SiGe channel layer 72 and the CN gate insulating film 73 at the conduction band edge of the SiGe channel layer 72, but substantially no hetero barrier is formed between the SiGe channel layer 72 and the Si layer 71. Thus, the SiGe channel layer 72 has substantially the same structure as that of an Si channel layer of a typical Si-nMISFET.

In such a state, when a positive voltage is applied to the gate electrode 74 and the SiGe channel layer 72 is brought into an inverted state, excited electrons are confined in a region of the SiGe channel layer 72 that is located directly under the CN gate insulating film 73. In a conventional SiGe-nMISFET, an Si cap layer is provided on the SiGe channel layer, whereby an n-channel is substantially formed in a region of the Si cap layer that is directly under the gate oxide film. In contrast, in the SiGe-nMISFET of the present embodiment, it is not necessary to provide an Si cap layer, and thus an n-channel is formed in the SiGe channel layer. Therefore, in the SiGe-nMISFET of the present embodiment, the high-speed operation can be improved by utilizing the fact that the mobility of electrons is higher in the SiGe layer than in the Si layer.

Moreover, since the gate insulating film 73 is made of a nitride, it is possible to suppress the occurrence of defects due to, for example, diffusion of Ge of the SiGe channel layer 72 without providing an Si cap layer. Therefore, it is possible to obtain a semiconductor device including a transistor having a high current drivability, while maintaining a good crystallinity of the channel layer.

EIGHTH EMBODIMENT

Figure 14:
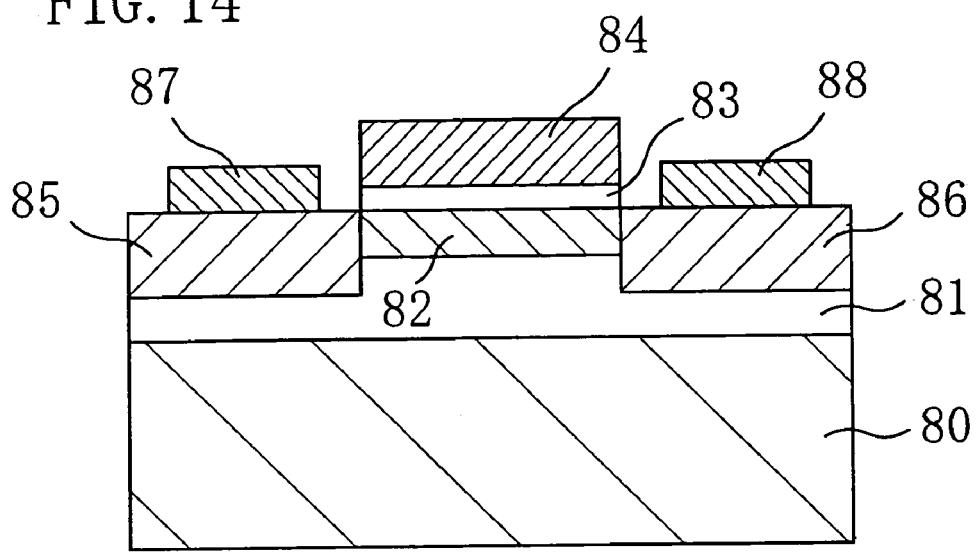
FIG. 14 is a cross-sectional view illustrating a structure of a p-MISFET in which compressive-strained silicon containing Ge is used as a channel according to the eighth embodiment of the present invention.

FIG. 14 is a cross-sectional view illustrating a structure of a p-MISFET in which compressive-strained silicon containing Ge is used as a channel according to the eighth embodiment of the present invention.

A substantially intrinsic Si layer 81, an SiGe ($Si_{1-x}Ge_x$) channel layer 82, which is a silicon layer containing Ge, a CN gate insulating film 83 and a gate electrode 84 are deposited in this order on an n-type Si substrate 80. The Si layer 81, the SiGe channel layer 82 and the CN gate insulating film 83 are all deposited by using an UHV-CVD method. Herein, it is preferred that the thickness of the SiGe channel layer 82 is set to a value that is less than or equal to the critical thickness so that a dislocation due to a strain does not occur according to the Ge concentration. In the present embodiment, the Ge content of the SiGe channel layer 82 is 20% (y=0.2), and the thickness of the SiGe channel layer 82 is 10 nm.

A source region 85 and a drain region 86, which are obtained by introducing a high concentration of a p-type impurity into an SiGe layer and an Si layer, are formed on opposite sides of the SiGe channel layer 82. Moreover, a source electrode 87 and a drain electrode 88 are formed on the source region 85 and the drain region 86, respectively.

Note that the CN gate insulating film 83 may be formed by a method other than a CVD method, such as an MBE method. Furthermore, an SiGeN film (e.g., an $Si_{3-x}Ge_xN_4$ film) may be used, instead of a CN gate insulating film, as will be described in a subsequent embodiment.

Figure 15:
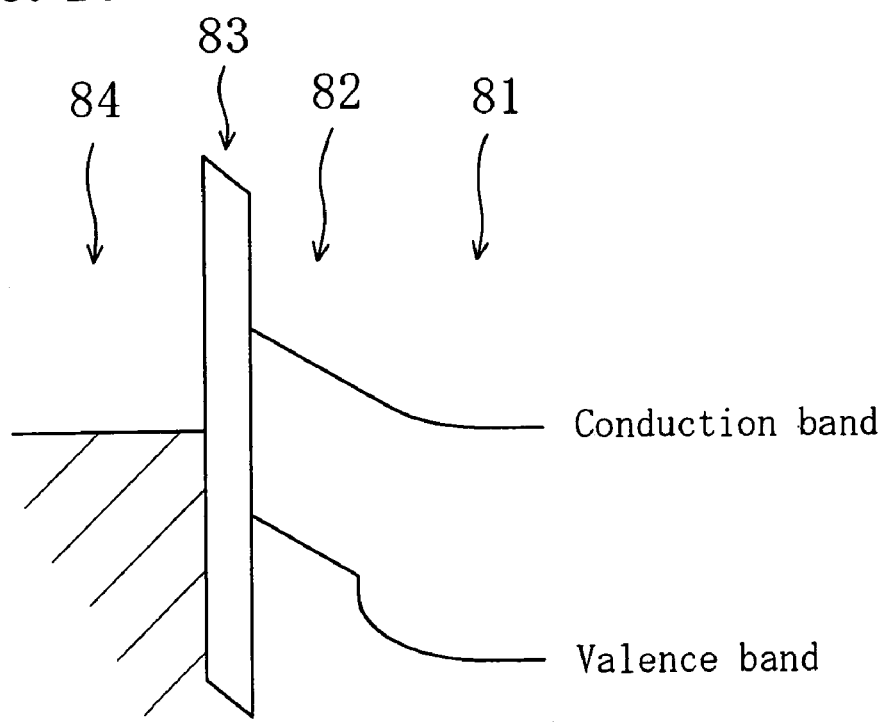
FIG. 15 is an energy band diagram illustrating a band structure along a cross section passing through a gate electrode—CN gate insulating film—SiGe channel layer—Si layer of the n-MISFET of the eighth embodiment.

FIG. 15 is an energy band diagram illustrating a band structure along a cross section passing through the gate electrode 84—CN gate insulating film 83—SiGe channel layer 82—Si layer 81 of the n-MISFET of the present embodiment. When a negative voltage is applied to the gate electrode 84, the band is bent in a direction in which the potential of the gate electrode 84 increases. Then, when the SiGe channel layer 82 is brought into an inverted state, a current flows between the source region 85 and the drain region 86. At this time, since the lattice constant of the $Si_{1-x}Ge_x$ crystal of the SiGe channel layer 82 is larger than that of the Si crystal, the SiGe channel layer 82 will be under a compressive strain in a case where the SiGe channel layer 82 is grown on the Si layer 81 with a thickness less than or equal to the critical thickness. Then, due to the compressive strain, the valence band of the SiGe channel layer 82 will be in a state where the degeneracy is lifted as follows.

That is, as illustrated in FIG. 17, the valence band in the Si layer 81 is degenerated, whereas the degeneracy of the valence band is lifted in the compressive-strained SiGe channel layer 82, and the band is split into light hole (LH) and heavy hold (HH) bands.

Therefore, as illustrated in FIG. 15, an energy barrier of an insulator is formed between the SiGe channel layer 82 and the CN gate insulating film 83 at the valence band edge of the SiGe channel layer 82, and a hetero barrier is formed between the SiGe channel layer 82 and the Si layer 81. Thus, the SiGe channel layer 82 is in a quantum well structure sandwiched between the Si layer 81 having a large band gap and the CN gate insulating film 83 made of CN.

In such a state, when a negative voltage is applied to the gate electrode 84 and the SiGe channel layer 82 is brought into an inverted state, excited holes are confined in the SiGe channel layer 82, which is a quantum well. Then, even if the hole density increases, substantially no holes will cross over the hetero barrier, but the holes travel through the SiGe channel layer 82 in the direction perpendicular to the sheet of the figure. Furthermore, since the effective mass of the light holes is small, the hole mobility in the SiGe channel layer 82 is improved. Moreover, since the impurity concentration in the SiGe channel layer 82 is small, the holes that travel through the SiGe channel layer 82 can travel at a high speed without being substantially subject to scattering due to an impurity. Therefore, it is possible to obtain a field effect transistor that operates at a high speed.

Since the channel layer is formed not by an Si layer but by an SiGe layer, which is a second semiconductor layer containing Si and Ge, it is possible to apply a compressive strain to the SiGe channel layer 82 only by adjusting the Ge content without providing a thick buffer layer for lattice relaxation under the SiGe channel layer 82. Moreover, since the gate insulating film 83 is made of a nitride, it is possible to suppress the occurrence of defects due to, for example, diffusion of Ge of the SiGe channel layer 82 without providing an Si cap layer. If an Si cap layer is provided, a parasitic channel may possibly occur between the Si cap layer and the gate insulating film. However, since the Si cap layer is absent, a parasitic channel will not occur. Therefore, it is possible to obtain a semiconductor device including a transistor having a high current drivability, while maintaining a good crystallinity of the channel layer.

Thus, it is possible to avoid the occurrence of a parasitic channel while using an Si/SiGe hetero interface, and it is possible to obtain a transistor that operates at a high speed by utilizing the fact that the degeneracy of the valence band can be lifted.

NINTH EMBODIMENT

Figure 16:
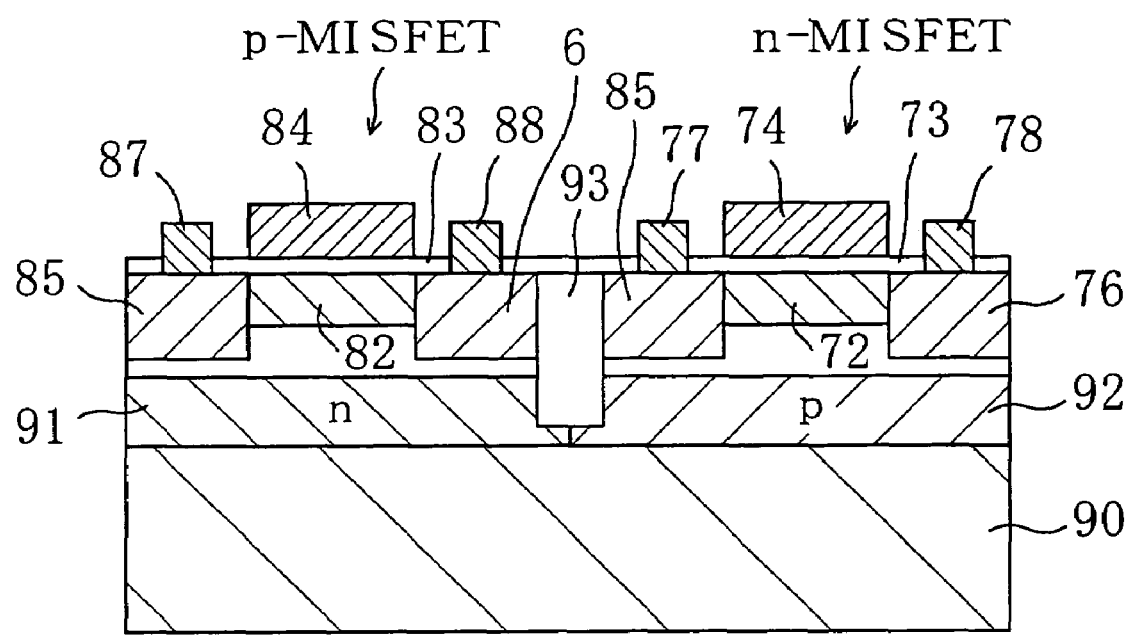
FIG. 16 is a cross-sectional view illustrating a structure of a complementary MISFET in which compressive-strained silicon containing Ge is used as a channel according to the ninth embodiment of the present invention.

FIG. 16 is a cross-sectional view illustrating a structure of a complementary MISFET in which compressive-strained silicon containing Ge is used as a channel according to the ninth embodiment of the present invention.

An n-well 91 and a p-well 92 are provided on an Si substrate 90. A p-MISFET having substantially the same structure as that illustrated in FIG. 14 is provided on the n-well 91, and an n-MISFET having substantially the same structure as that illustrated in FIG. 12 is provided on the p-well 92. Moreover, the p-MISFET and the n-MISFET are electrically insulated from each other by a trench isolation insulating film 93.

Specifically, the Si layer 71, the SiGe ($Si_{1-x}Ge_x$) channel layer 72, which is a silicon layer containing Ge, the CN gate insulating film 73 and the gate electrode 74 are deposited in this order on the p-well 92, substantially as in the structure illustrated in FIG. 12. Also in the present embodiment, the Ge content of the SiGe channel layer 72 is 20% (y=0.2), and the thickness of the SiGe channel layer 72 is 10 nm. The source region 75 and the drain region 76, which are obtained by introducing a high concentration of an n-type impurity into an SiGe layer and an Si layer, are formed on opposite sides of the SiGe channel layer 72. Moreover, the source electrode 77 and the drain electrode 78 are formed on the source region 75 and the drain region 76, respectively. Thus, the SiGe channel layer 72 is in a quantum well structure sandwiched between the Si layer 71 having a large band gap and the CN gate insulating film 73.

Moreover, the Si layer 81, the SiC ($Si_{1-x}Ge_x$) channel layer 82, which is a silicon layer containing Ge, the CN gate insulating film 83 and the gate electrode 84 are deposited in this order on the n-well 92, as in the structure illustrated in FIG. 14. Also in the present embodiment, the Ge content of the SiGe channel layer 82 is 20% (y=0.2), and the thickness of the SiGe channel layer 82 is 10 nm. The source region 85 and the drain region 86, which are obtained by introducing a high concentration of a p-type impurity into an SiGe layer and an Si layer, are formed on opposite sides of the SiGe channel layer 82. Moreover, the source electrode 87 and the drain electrode 88 are formed on the source region 85 and the drain region 86, respectively. Thus, the SiGe channel layer 82 is in a quantum well structure sandwiched between the Si layer 81 having a large band gap and the CN gate insulating film 83.

In the present embodiment, it is possible to form, from a single SiGe film, an n-channel (SiGe channel layer 72) and a p-channel (SiGe channel layer 82) through which electrons and holes travel.

Thus, it is possible to obtain a complementary MISFET including an n-MISFET that is capable of operating at a high speed and a p-MISFET that is capable of operating at a high speed and has a high current drivability, because it is not necessary to provide an Si cap layer in the n-MISFET, whereas holes can travel at a high speed through the SiGe channel layer 82 having a quantum well structure in the p-MISFET, as described in the seventh and eighth embodiments.

TENTH EMBODIMENT

Figure 18:
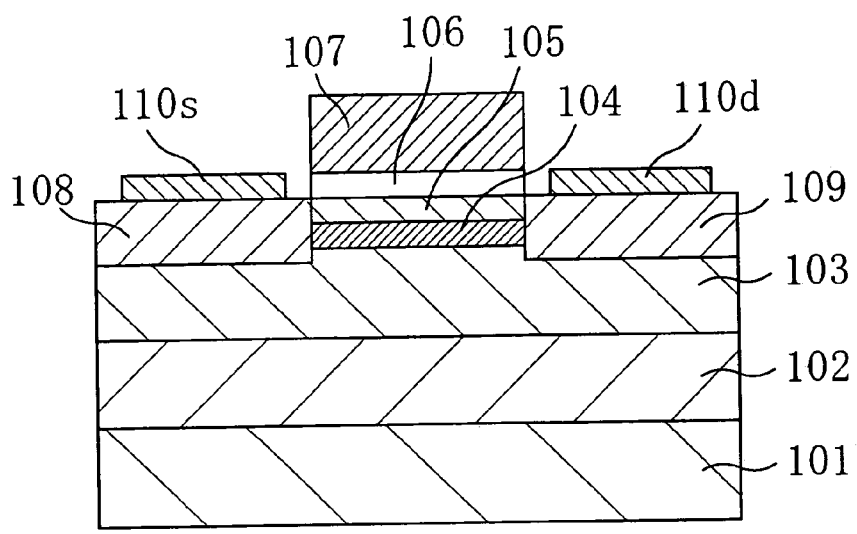
FIG. 18 is a cross-sectional view illustrating a structure of a strained Si-nMISFET according to the tenth embodiment of the present invention.

FIG. 18 is a cross-sectional view illustrating a structure of a strained Si-nMISFET according to the tenth embodiment of the present invention. In the present embodiment, a structure of a strained Si-nMISFET in which a tensile-strained Si channel layer is provided between two semiconductor layers containing Si and Ge will be described.

A p-type graded SiGe layer ($Si_{1-x}Ge_x$ layer) 102 having a graded composition in which the Ge composition gradually increases from a lower portion toward an upper portion, a p-type relaxed SiGe buffer layer 103 in which the crystal lattice is relaxed, a strained Si layer 104 having a tensile strain, a relaxed SiGe layer 105 in which the lattice is relaxed, a CN gate insulating film 106 made of a carbon nitride layer (CN), which is a nitride, and a gate electrode 107 are deposited in this order on a p-type Si substrate 101. The graded SiGe layer 102, the relaxed SiGe buffer layer 103, the strained Si layer 104, the relaxed SiGe layer 105 and the CN gate insulating film 106 are all deposited by using an UHV-CVD method. Herein, it is preferred that the thickness of the graded SiGe layer 102 is set to a value that is equal to or greater than the critical thickness at which a dislocation due to a strain occurs and the lattice is relaxed according to the Ge content. Moreover, it is preferred that the thickness of the relaxed SiGe buffer layer 103 is equal to or greater than a thickness such that after the lattice of the graded SiGe layer 102 is relaxed while forming crystal defects, the formation of crystal defects during the lattice relaxation stops at a position in an upper portion of the relaxed SiGe buffer layer 103 and the crystal defects do not propagate into other layers above. Then, the strained Si layer 104, which is a channel layer, will be under a tensile strain according to the Ge composition ratio of the relaxed SiGe buffer layer 103.

Moreover, the relaxed SiGe layer 105 on the strained Si layer 104 is lattice-matched with the relaxed SiGe buffer layer 103, which is located below the relaxed SiGe layer 105 via the strained Si layer 104 therebetween, whereby the relaxed SiGe layer 105 has substantially no strain and substantially no lattice defects. Thus, the relaxed SiGe layer 105 has a good crystal condition.

Moreover, it is preferred that the preferred thickness of the strained Si layer 104 is less than or equal to a critical thickness that varies depending on the Ge composition ratio of the underlying relaxed SiGe buffer layer 103. In the present embodiment, the Ge content of the relaxed SiGe buffer layer 103 is 40%, and the thickness of the strained Si layer 104 is 20 nm.

Note that the CN gate insulating film 106 may be formed by a method other than a CVD method, such as an MBE method. Furthermore, an SiGeN film (e.g., an $Si_{3-x}Ge_xN_4$ film) may be used, instead of a CN gate insulating film, as will be described in a subsequent embodiment.

Furthermore, the relaxed SiGe layer 105 provided on the strained Si layer 105 has a Ge composition of 40% and a thickness of 10 nm. Thus, in the present embodiment, the strained Si layer 104 is vertically sandwiched between two lattice-relaxed SiGe layers (the relaxed SiGe buffer layer 103 and the relaxed SiGe layer 105).

Moreover, a source region 108 and a drain region 109 containing a high concentration of an n-type impurity are formed in an upper portion of the relaxed SiGe buffer layer 103 and in portions of the strained Si layer 104 and the relaxed SiGe layer 105 beside the gate electrode 107. Moreover, a source electrode 110s and a drain electrode 110d are provided on the source region 106 and the drain region 109, respectively.

In the present embodiment, the strained Si layer 104 is vertically sandwiched between two lattice-relaxed SiGe layers (the relaxed SiGe buffer layer 103 and the relaxed SiGe layer 105). Therefore, in the strained Si-nMISFET of the present embodiment, as compared with a case where a relaxed SiGe layer is provided only under an Si layer to be a channel region as in a conventional SiGe-MISFET, the strained Si layer 104 has improved heat treatment temperature tolerance and heat treatment time tolerance (which are referred to collectively as "thermal budget"), and it can be expected that the device performance will be improved through the increase in the degree of freedom in manufacturing the device and the improvement in the activation rate.

Moreover, in the strained Si-nMISFET of the present embodiment, although the relaxed SiGe buffer layer 103 has a high Ge content (e.g., 40%), with which lattice defects would occur in a conventional SiGe-MISFET structure, it is possible to suppress the occurrence of lattice defects in the strained Si layer 104 by sandwiching the strained Si layer 104 between two relaxed SiGe layers. Thus, by increasing the Ge composition of the relaxed buffer layer 103, the lattice mismatch rate between the relaxed SiGe buffer layer 103 and the strained Si layer 104 is increased, whereby it is possible to increase the amount of strain in the strained Si layer 104. Moreover, the critical thickness of the strained Si layer 104 is increased, whereby it is possible to increase the thickness of the strained Si layer 104. Thus, through an increase in the amount of strain or the thickness of the strained Si layer 104, it is possible to realize a device having a higher performance as will be described later.

Figure 19:
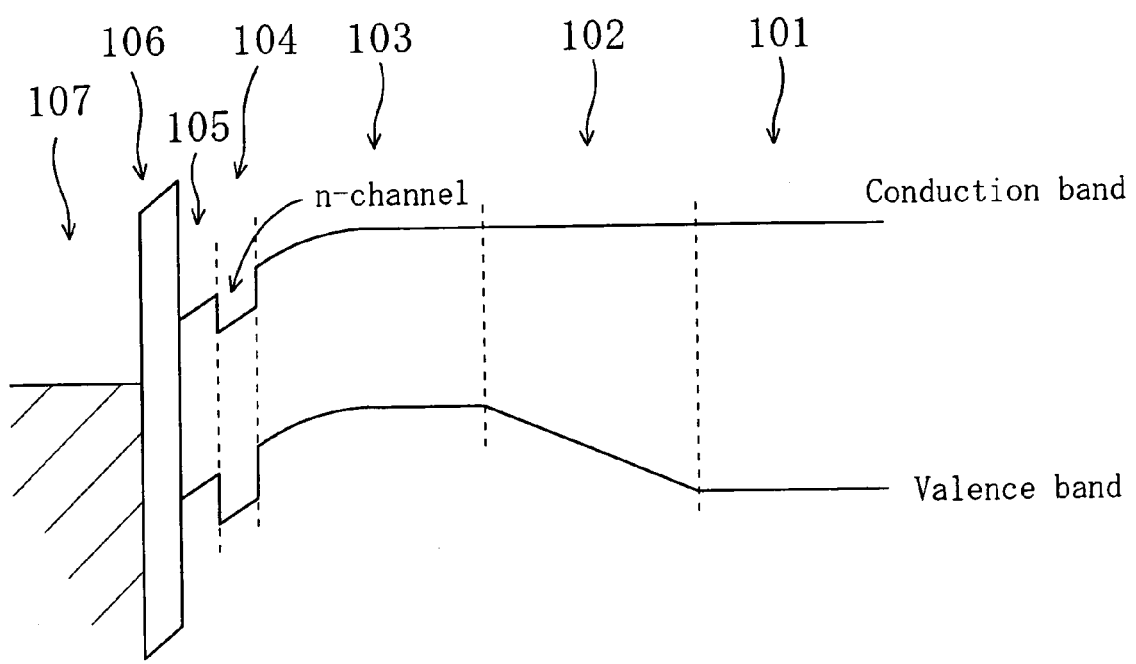
FIG. 19 is an energy band diagram illustrating a band structure along a cross section passing through a gate electrode—CN gate insulating film—relaxed SiGe layer, etc., of the strained Si-nMISFET of the tenth embodiment.

FIG. 19 is an energy band diagram illustrating a band structure along a cross section passing through the gate electrode 107—CN gate insulating film 106-relaxed SiGe layer 105—strained Si layer 104—relaxed SiGe buffer layer 103—graded SiGe layer 102—Si substrate 101 of the strained Si-nMISFET of the present embodiment. When a positive voltage is applied to the gate electrode 107, the band is bent in a direction in which the potential of the gate electrode 107 decreases. Then, when the strained Si layer 104 is brought into an inverted state, a current flows between the source region 108 and the drain region 109. At this time, since the lattice constant of the Si crystal of the strained Si layer 104 is smaller than that of the SiGe crystal of the relaxed SiGe buffer layer 103 and the relaxed SiGe layer 105, the strained Si layer 104 will be under a tensile strain in a case where the strained Si layer 104 is grown with a thickness less than or equal to the critical thickness. Then, due to the tensile strain, the band gap of the strained Si layer 104 is substantially reduced, and the conduction band of the strained Si layer 104 will be in a state where the degeneracy is lifted as follows.

That is, the conduction band in a typical Si layer is degenerated in 6 fold, whereas the conduction band in the strained Si layer 104 under a tensile strain is split into 2-fold and 4-fold degenerated bands ($\Delta(2)$ and $\Delta(4)$). The band $\Delta(2)$, which is the 2-fold degenerated conduction band edge in the strained Si layer 104, has a potential that is lower than that of the relaxed SiGe buffer layer 103 or the relaxed SiGe layer 105. At this time, the band offset value $\Delta Ec$ at the conduction band edge formed between the strained Si layer 104 and the relaxed SiGe buffer layer 103 or the relaxed SiGe layer 105 is about 100 meV. On the other hand, the degeneracy is similarly lifted also in the valence band of the strained Si layer 104, and the band is split into light hole (LH) and heavy hole (HH) bands.

Figure 31:
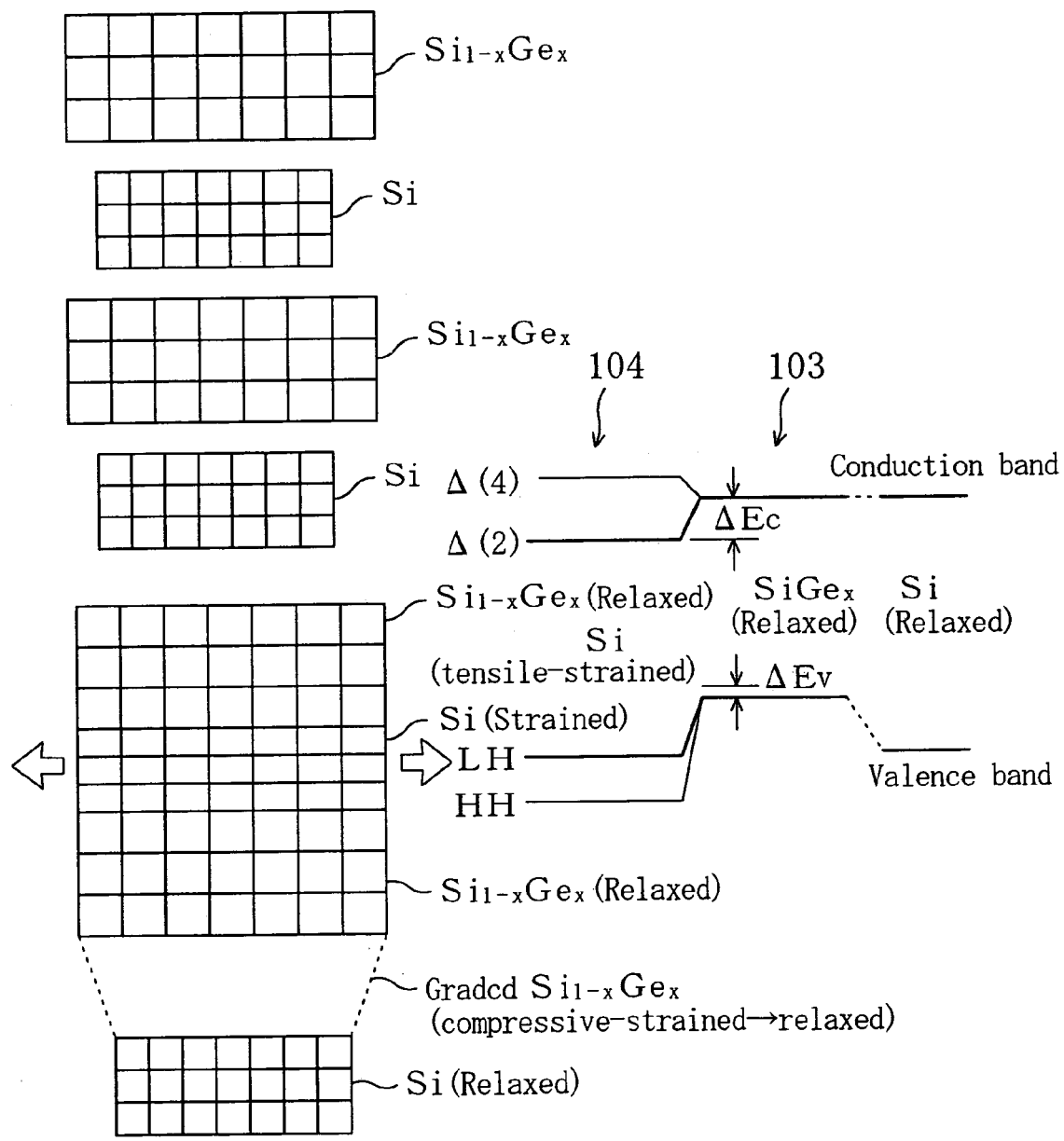
FIG. 31 is an energy band diagram illustrating a degenerated state of the conduction band and the valence band in a relaxed SiGe buffer layer and a strained Si layer of a strained Si-nMISFET in which a tensile-strained Si channel layer is provided between two semiconductor layers containing Si and Ge.

FIG. 31 is an energy band diagram illustrating a degenerated state of the conduction band and the valence band in the relaxed SiGe buffer layer 103 and the strained Si layer 104 of the strained Si-nMISFET in which a tensile-strained Si channel layer is provided between two semiconductor layers containing Si and Ge. As illustrated in the figure, the conduction band in the relaxed SiGe buffer layer 103 is degenerated in 6 fold, whereas the conduction band in the tensile-strained Si layer 104 is split into 2-fold and 4-fold degenerated bands ($\Delta(2)$ and $\Delta(4)$). The band $\Delta(2)$, which is the 2-fold degenerated conduction band edge in the strained Si layer 104, has a potential that is lower than that of the relaxed SiGe buffer layer 103. On the other hand, the degeneracy is similarly lifted also in the valence band of the strained Si layer 104, and the band is split into light hole (LH) and heavy hole (HH) bands.

Moreover, as illustrated in FIG. 19, a hetero barrier is formed between the strained Si layer 104 and the relaxed SiGe buffer layer 103 or the relaxed SiGe layer 105 at the conduction band edge of the strained Si layer 104. Thus, the strained Si layer 104 is in a quantum well structure sandwiched between the relaxed SiGe layer 105 and the relaxed SiGe layer 103.

In such a state, when a positive voltage is applied to the gate electrode 107 and the strained Si layer 104 is brought into an inverted state, excited electrons are confined in the strained Si layer 104, which is a quantum well. Then, even if the electron density increases, substantially no electrons will cross over the hetero barrier, but the electrons travel through the strained Si layer 104 in the direction perpendicular to the sheet of FIG. 18. Since the effective mass of the electrons that travel in this direction is small, the electron mobility in the strained Si layer 104 is improved. Moreover, since the impurity concentration in the strained Si layer 104 is small, the electrons that travel through the strained Si layer 104 can travel at a high speed without being substantially subject to scattering due to an impurity. Furthermore, since the number of interface levels is small at the interface between the strained Si layer 104 and the relaxed SiGe buffer layer 103 and the interface between the strained Si layer 104 and the relaxed SiGe layer 105, it is possible to suppress a decrease in the effective electron mobility due to scattering at these interfaces. Moreover, while scattering due to an impurity in the channel or scattering due to an interface level may cause noise in the transistor, the present embodiment is effective also in reducing the noise since such scattering is little in the strained Si-nMISFET of the present embodiment, as described above. Therefore, it is possible to obtain a field effect transistor that operates at a high speed and has low noise.

In a conventional strained Si-MISFET using a strained Si layer as a channel, an Si cap layer is provided between an SiGe layer, corresponding to the relaxed SiGe layer 105 of the present embodiment, and a gate oxide film, thereby increasing the geometric distance from the gate electrode to the strained Si layer. In contrast, in the Si-nMISFET of the present embodiment, it is not necessary to provide an Si cap layer, and thus the distance from the gate electrode 107 to the strained Si layer 104 is reduced from that in the prior art, whereby it is possible to improve the capability of collecting electrons, which are carriers, i.e., to improve the current drivability.

On the other hand, in a strained Si-nMISFET known in the prior art in which a gate oxide film is provided directly on a strained Si channel layer, the strained Si channel layer and the gate oxide film are in direct contact with each other, thereby increasing the number of interface levels and thus causing noise due to the presence of the interface levels.

Specifically, in the strained Si-nMISFET of the present embodiment, the relaxed SiGe layer 105 having a good crystal condition is provided on the strained Si layer 104, and the CN gate insulating film 106 is provided directly on the relaxed SiGe layer 105. Therefore, the geometric distance between the gate electrode 107 and the strained Si layer 104 (channel layer) can be reduced. Moreover, since electrons travel through a region in the vicinity of an interface between the relaxed SiGe layer 105 and the strained Si layer 104 where the number of interface levels is small, the strained Si-nMISFET of the present embodiment functions as an nMISFET that operates at a high speed and with low noise.

ELEVENTH EMBODIMENT

Figure 20:
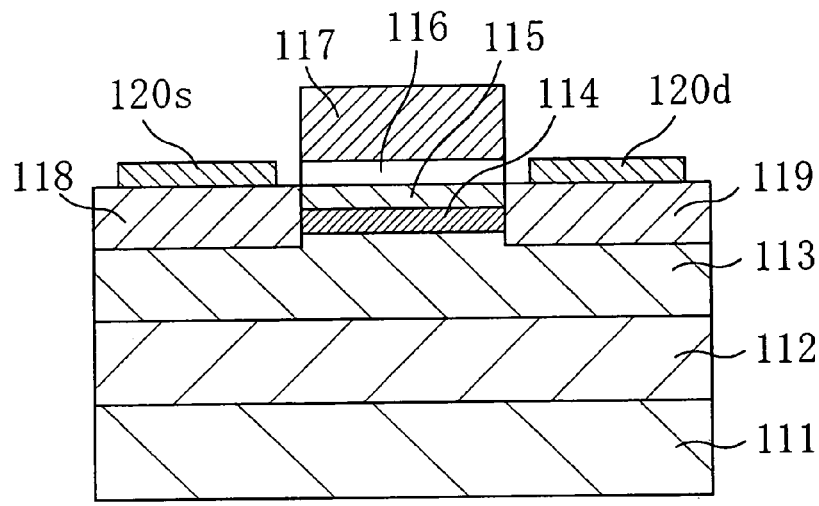
FIG. 20 is a cross-sectional view illustrating a structure of a strained Si-pMISFET according to the eleventh embodiment of the present invention.

FIG. 20 is a cross-sectional view illustrating a structure of a strained Si-pMISFET according to the eleventh embodiment of the present invention. In the present embodiment, a structure of a strained Si-pMISFET in which a tensile-strained Si channel layer is provided between two semiconductor layers containing Si and Ge will be described.

An n-type graded SiGe layer ($Si_{1-x}Ge_x$ layer) 112 having a graded composition in which the Ge composition gradually increases from a lower portion toward an upper portion, an n-type relaxed SiGe buffer layer 113 in which the crystal lattice is relaxed, a strained Si layer 114 having a tensile strain, a relaxed SiGe layer 115 in which the lattice is relaxed, a CN gate insulating film 116 made of a carbon nitride layer (CN), which is a nitride, and a gate electrode 117 are deposited in this order on an n-type Si substrate 111. The graded SiGe layer 112, the relaxed SiGe buffer layer 113, the strained Si layer 114, the relaxed SiGe layer 115 and the CN gate insulating film 116 are all deposited by using an UHV-CVD method. Herein, it is preferred that the thickness of the graded SiGe layer 112 is set to a value that is equal to or greater than the critical thickness at which a dislocation due to a strain occurs and the lattice is relaxed according to the Ge content. Moreover, it is preferred that the thickness of the relaxed SiGe buffer layer 113 is equal to or greater than a thickness such that after the lattice of the graded SiGe layer 112 is relaxed while forming crystal defects, the crystal defects do not propagate into other layers above the relaxed SiGe buffer layer 113. Then, the strained Si layer 114 will be under a tensile strain according to the Ge composition ratio of the relaxed SiGe buffer layer 113.

Moreover, the relaxed SiGe layer 115 on the strained Si layer 114 is lattice-matched with the relaxed SiGe buffer layer 113, which is located below the relaxed SiGe layer 115 via the strained Si layer 114 therebetween, whereby the relaxed SiGe layer 115 has substantially no strain and substantially no lattice defects. Thus, the relaxed SiGe layer 115 has a good crystal condition.

Moreover, it is preferred that the preferred thickness of the strained Si layer 114 is less than or equal to a critical thickness that varies depending on the Ge composition ratio of the underlying relaxed SiGe buffer layer 113. In the present embodiment, the Ge content of the relaxed SiGe buffer layer 113 is 40%, and the thickness of the strained Si layer 114 is about 20 nm.

Furthermore, the relaxed SiGe layer 115 provided on the strained Si layer 115 has a Ge composition of 40% and a thickness of 10 nm. Thus, in the present embodiment, the strained Si layer 114 is vertically sandwiched between two lattice-relaxed SiGe layers (the relaxed SiGe buffer layer 113 and the relaxed SiGe layer 115).

Moreover, a source region 118 and a drain region 119 containing a high concentration of a p-type impurity are formed in an upper portion of the relaxed SiGe buffer layer 113 and in portions of the strained Si layer 114 and the relaxed SiGe layer 115 beside the gate electrode 117. Moreover, a source electrode 120s and a drain electrode 120d are provided on the source region 116 and the drain region 119, respectively.

Note that the CN gate insulating film 116 may be formed by a method other than a CVD method, such as an MBE method. Furthermore, an SiGeN film (e.g., an $Si_{3-x}Ge_xN_4$ film) may be used, instead of a CN gate insulating film, as will be described in a subsequent embodiment.

In the present embodiment, the strained Si layer 114 is vertically sandwiched between two lattice-relaxed SiGe layers (the relaxed SiGe buffer layer 113 and the relaxed SiGe layer 115). Therefore, in the strained Si-nMISFET of the present embodiment, as compared with a case where a relaxed SiGe layer is provided only under an Si layer to be a channel region as in a conventional SiGe-MISFET, the strained Si layer 114 has improved heat treatment temperature tolerance and heat treatment time tolerance (which are referred to collectively as "thermal budget"), and it can be expected that the device performance will be improved through the increase in the degree of freedom in manufacturing the device and the improvement in the activation rate.

Moreover, in the strained Si-nMISFET of the present embodiment, although the relaxed SiGe buffer layer 113 has a high Ge content (e.g., 40%), with which lattice defects would occur in a conventional SiGe-MISFET structure, it is possible to suppress the occurrence of lattice defects in the strained Si layer 114 by sandwiching the strained Si layer 114 between two relaxed SiGe layers. Thus, by increasing the Ge composition of the relaxed buffer layer 113, it is possible to realize a device having a higher performance as will be described later.

Figure 21:
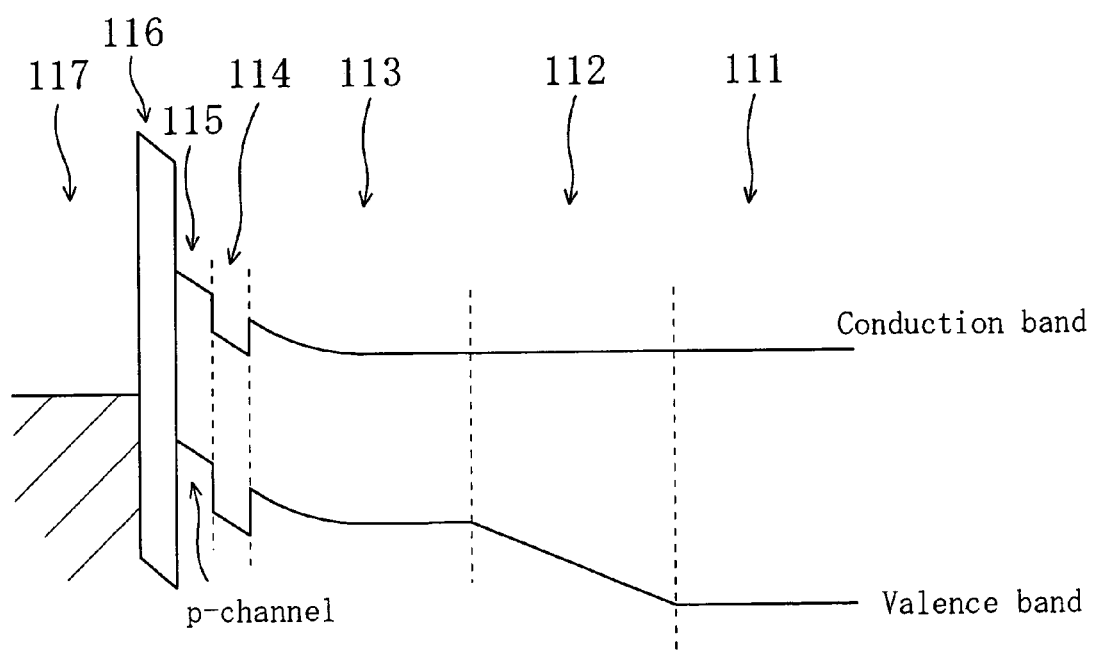
FIG. 21 is an energy band diagram illustrating a band structure along a cross section passing through a gate electrode—CN gate insulating film—relaxed SiGe layer, etc., of the strained Si-pMISFET of the eleventh embodiment.

FIG. 21 is an energy band diagram illustrating a band structure along a cross section passing through the gate electrode 117—CN gate insulating film 116-relaxed SiGe layer 115-strained Si layer 114-relaxed SiGe buffer layer 113—graded SiGe layer 112—Si substrate 111 of the strained Si-pMISFET of the present embodiment. When a negative voltage is applied to the gate electrode 117, the band is bent in a direction in which the potential of the gate electrode 117 increases. Then, when the relaxed SiGe layer 115 to be a channel is brought into an inverted state, a current flows between the source region 118 and the drain region 119. At this time, since the lattice constant of the SiGe crystal of the relaxed SiGe buffer layer 113 and the relaxed SiGe layer 115 is larger than that of the Si crystal of the strained Si layer 114, the strained Si layer 114 will be under a tensile strain due to the lattice mismatch between the relaxed SiGe buffer layer 113 and the relaxed SiGe layer 115 in a case where the strained Si layer 114 is grown with a thickness less than or equal to the critical thickness. Then, due to the tensile strain, the band gap of the strained Si layer 114 is substantially reduced. Note however that at the valence band edge of the band structure illustrated in FIG. 21, the energy level of the relaxed SiGe layer 115 is higher than that of the strained Si layer 114, whereby the relaxed SiGe layer 115 functions as a p-channel through which holes travel.

Therefore, as illustrated in FIG. 21, an energy barrier of an insulator is formed between the relaxed SiGe layer 115 and the CN gate insulating film 116 at the valence band edge of the relaxed SiGe layer 115, which functions as a p-channel, and a hetero barrier is formed between the relaxed SiGe layer 115 and the strained Si layer 114. Thus, the relaxed SiGe layer 115 is in a quantum well structure sandwiched between the strained Si layer 114 and the CN gate insulating film 116.

In such a state, when a negative voltage is applied to the gate electrode 117 and the relaxed SiGe layer 115 is brought into an inverted state, excited holes are confined in the relaxed SiGe layer 115, which is a quantum well. Then, even if the hole density increases, substantially no holes will cross over the hetero barrier, but the holes travel through the relaxed SiGe layer 115 in the direction perpendicular to the sheet of FIG. 20. Since the effective mass of the holes that travel in this direction is small, the hole mobility in the relaxed SiGe layer 115 is improved. Moreover, since the impurity concentration in the relaxed SiGe layer 115 is small, the holes that travel through the relaxed SiGe layer 115 can travel at a high speed without being substantially subject to scattering due to an impurity.

In a conventional strained Si-MISFET using a strained Si layer as a channel, an Si cap layer is provided between an SiGe layer, corresponding to the relaxed SiGe layer 115 of the present embodiment, and a gate oxide film, thereby increasing the geometric distance from the gate electrode to the relaxed SiGe layer. In contrast, in the Si-pMISFET of the present embodiment, it is not necessary to provide an Si cap layer, and thus the distance from the gate electrode 117 to the relaxed SiGe layer 115 is reduced from that in the prior art, whereby it is possible to improve the capability of collecting holes, which are carriers, i.e., to improve the current driv-ability, while maintaining a good crystallinity of the relaxed SiGe layer 115 to be a channel region.

Note that while the relaxed SiGe buffer layer 113 and the relaxed SiGe layer 115 have the same Ge composition (40%) in the tenth and eleventh embodiments, they may alternatively have different Ge compositions. Moreover, the relaxed SiGe layer 115 to be a channel may have a higher Ge composition than that of the relaxed SiGe buffer layer 113 so as to be a compressive-strained semiconductor layer. In such a case, it is possible to increase the operating speed of the transistor by utilizing light holes obtained by utilizing the band split of the valence band.

Furthermore, an SiGeC layer containing a slight amount (e.g., about 1%) of carbon may alternatively be provided instead of the relaxed SiGe layer 115 or the relaxed SiGe buffer layer 113.

TWELFTH EMBODIMENT

Figure 22:
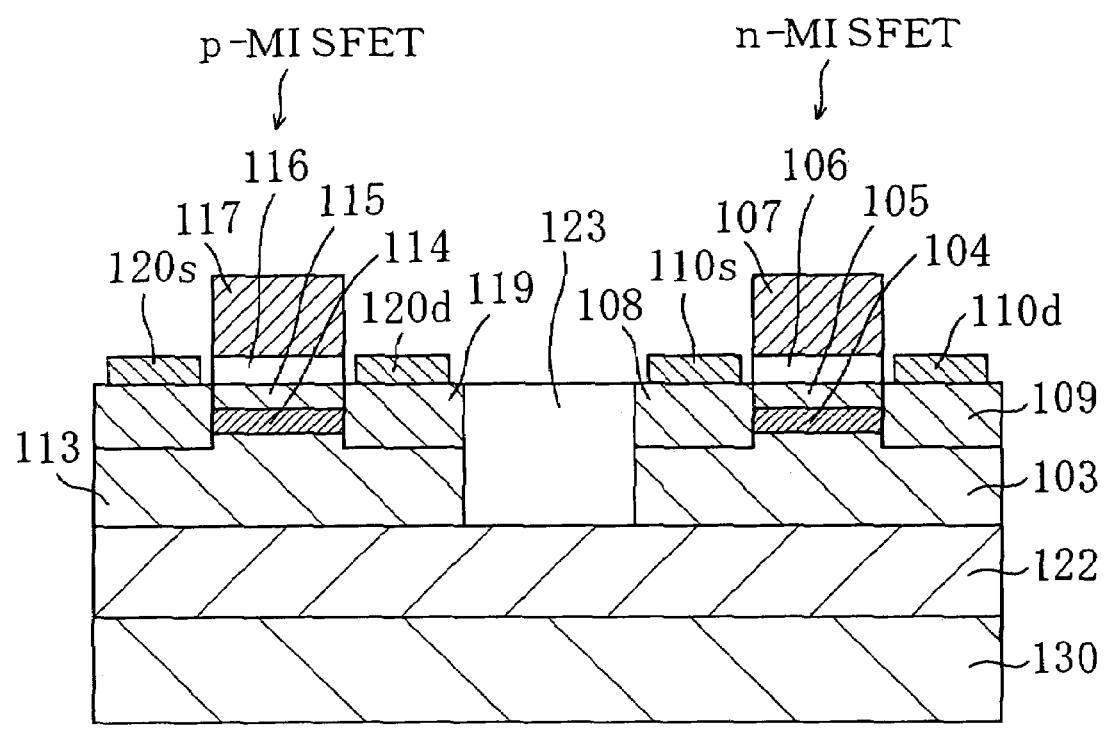
FIG. 22 is a cross-sectional view illustrating a structure of a complementary MISFET with strained Si according to the twelfth embodiment of the present invention.

FIG. 22 is a cross-sectional view illustrating a structure of a complementary MISFET with strained Si according to the twelfth embodiment of the present invention. In the present embodiment, a structure of an Si-cMISFET in which a tensile-strained Si channel layer is provided between two semiconductor layers containing Si and Ge will be described.

An n-type graded SiGe layer ($Si_{1-x}Ge_x$ layer) 122 having a graded composition in which the Ge composition gradually increases from a lower portion toward an upper portion, the p-type relaxed SiGe buffer layer 103 in which the crystal lattice is relaxed and the n-type relaxed SiGe buffer layer 113 in which the crystal lattice is relaxed are provided on an Si substrate 130. An nMISFET having substantially the same structure as that illustrated in FIG. 18 is provided on the p-type relaxed SiGe buffer layer 103, and a pMISFET having substantially the same structure as that illustrated in FIG. 20 is provided on the n-type relaxed SiGe buffer layer 113. Moreover, the pMISFET and the nMISFET are electrically insulated from each other by a trench isolation insulating film 123.

Specifically, the strained Si layer 104 having a tensile strain, the relaxed SiGe layer 105 in which the lattice is relaxed, the CN gate insulating film 106 made of a carbon nitride layer (CN), which is a nitride, and the gate electrode 107 are deposited in this order on the p-type relaxed SiGe buffer layer 103. Then, the strained Si layer 104, which is a channel layer, will be under a tensile strain according to the Ge composition ratio of the relaxed SiGe buffer layer 103. Also in the present embodiment, the Ge content of the relaxed SiGe buffer layer 103 is 40%, and the thickness of the strained Si layer 104 is 20 nm. Furthermore, the relaxed SiGe layer 105 provided on the strained Si layer 105 has a Ge composition of 40% and a thickness of 10 nm, which is less than or equal to the critical thickness. Thus, in the present embodiment, the strained Si layer 104 is vertically sandwiched between two lattice-relaxed SiGe layers (the relaxed SiGe buffer layer 103 and the relaxed SiGe layer 105).

Moreover, the source region 108 and the drain region 109 containing a high concentration of an n-type impurity are formed in an upper portion of the relaxed SiGe buffer layer 103 and in portions of the strained Si layer 104 and the relaxed SiGe layer 105 beside the gate electrode 107. Moreover, the source electrode 110s and the drain electrode 110d are provided on the source region 106 and the drain region 109, respectively.

Moreover, the strained Si layer 114 having a tensile strain, the relaxed SiGe layer 115 in which the lattice is relaxed, the CN gate insulating film 116 made of a carbon nitride layer (CN), which is a nitride, and the gate electrode 117 are deposited in this order on the n-type relaxed SiGe buffer layer 113. Then, the strained Si layer 114 will be under a tensile strain according to the Ge composition ratio of the relaxed SiGe buffer layer 113. Moreover, in the present embodiment, the Ge content of the relaxed SiGe buffer layer 113 is 40%, and the thickness of the strained Si layer 114 is about 20 nm. Furthermore, the relaxed SiGe layer 115 provided on the strained Si layer 115 has a Ge composition of 40% and a thickness of 10 nm, which is less than or equal to the critical thickness. Thus, in the present embodiment, the strained Si layer 114 is vertically sandwiched between two lattice-relaxed SiGe layers (the relaxed SiGe buffer layer 113 and the relaxed SiGe layer 115).

Moreover, the source region 118 and the drain region 119 containing a high concentration of a p-type impurity are formed in an upper portion of the relaxed SiGe buffer layer 113 and in portions of the strained Si layer 114 and the relaxed SiGe layer 115 beside the gate electrode 117. Moreover, the source electrode 120s and the drain electrode 120d are provided on the source region 116 and the drain region 119, respectively.

In the present embodiment, the strained Si layer 104 serves as an n-channel through which electrons travel in the nMISFET, whereas the relaxed SiGe layer 115 serves as a p-channel through which holes travel in the pMISFET, as illustrated in FIG. 22. Since the n-MISFET and the p-MISFET have a common layered structure, the layers of the MISFETs can be formed from the SiGe or Si film deposited at once. Thus, the crystal growth is simplified and the throughput is improved.

As described in the tenth embodiment, in the nMISFET, the relaxed SiGe layer 105 is provided on the strained Si layer 104, and the CN gate insulating film 106 is provided directly on the relaxed SiGe layer 105. Therefore, the geometric distance between the gate electrode 107 and the strained Si layer 104 (channel layer) can be reduced. Moreover, since electrons travel through a region in the vicinity of an interface between the relaxed SiGe layer 105 and the strained Si layer 104 where the number of interface levels is small, the strained Si-nMISFET of the present embodiment functions as an nMISFET that operates at a high speed and with low noise.

Moreover, in the pMISFET, it is possible to increase the operating speed by improving the hole mobility in the relaxed SiGe layer 115 and by suppressing the scattering due to an impurity. Moreover, the distance from the gate electrode 117 to the relaxed SiGe layer 115 is reduced from that in the prior art, whereby it is possible to improve the current drivability.

THIRTEENTH EMBODIMENT

In the present embodiment, a method for manufacturing a complementary MISFET having a channel containing Si and C and having an SiCN gate insulating film (the MISFET of the third embodiment) will be described. FIG. 23(a) to FIG. 23(d) and FIG. 24(a) to FIG. 24(c) are cross-sectional views illustrating the manufacturing steps of the present embodiment.

Figure 23A:
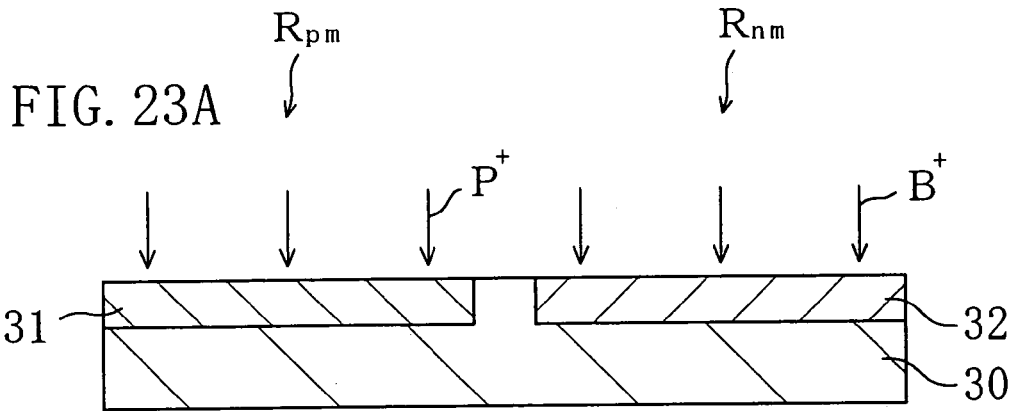
FIG. 23($a$) to FIG. 23($d$) are cross-sectional views illustrating the first half of a manufacturing process according to the thirteenth embodiment of the present invention.

First, in the step shown in FIG. 23(a), phosphorus ion. ($P^+$) and boron ion ($B^+$) are implanted into a pMISFET forming region Rpm and an nMISFET forming region Rnm, respectively, of the Si substrate 30 so as to form the n-well 31 and the p-well 32. In this process, a resist mask (not shown) including an opening in the pMISFET forming region Rpm and a resist mask (not shown) including an opening in the nMISFET forming region Rnm, which are formed by photolithography, are used. After the impurity ion implantation, annealing is performed in a nitrogen atmosphere, thereby forming the wells 31 and 32.

Figure 23B:
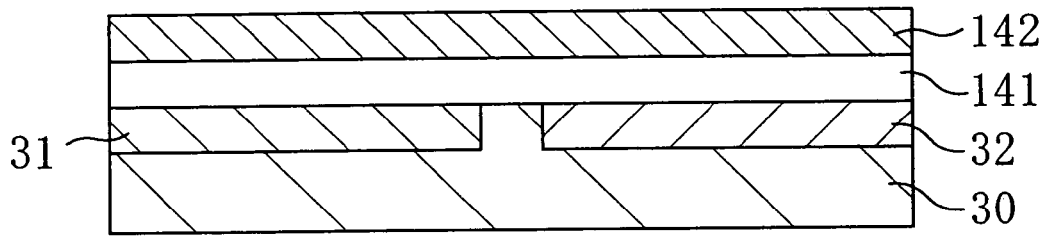

Then, in the step shown in FIG. 23(b), an Si film 141 having a thickness of about 20 nm is deposited on the substrate in which the wells 31 and 32 have been formed, after which an SiC film ($Si_{1-y}C_y$ film) 142 having a thickness of about 10 nm, which is under a tensile strain due to the lattice mismatch with the underlying Si film 141, is further deposited thereon. The Si film 141 and the SiC film 142 are deposited by using an UHV-CVD method or an LP-CVD method. The thickness of the SiC film 142 to be a channel is set to be less than or equal to the critical thickness so that a dislocation due to a strain or stress relaxation does not occur. Moreover, in the present embodiment, the C composition ratio y of the SiC film 142 is 0.02. Then, the band gap of the channel layer will be smaller than that of Si by about 150 meV. The band gap difference appears as a hetero barrier at the conduction band edge, which is advantageous for confining electrons. Note that the impurities (dopants) of the wells 31 and 32 diffuse into the Si film 141 and the SiC film 142, whereby a portion of the Si film 141 and the SiC film 142 that is located above the n-well 31 is of n-type and another portion that is located above the p-well 32 is of p-type.

Figure 23C:
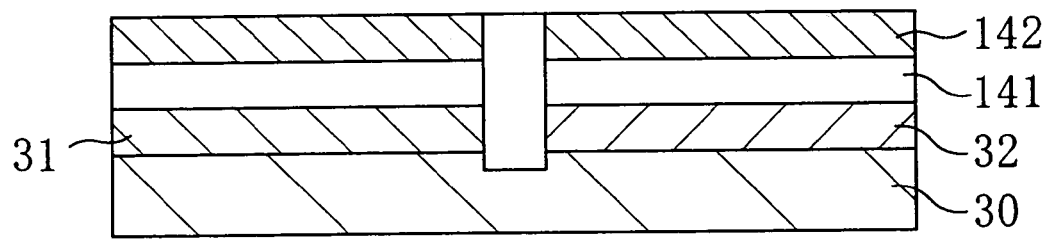

Then, in the step shown in FIG. 23(c), the trench isolation insulating film 33 that runs through the SiC film 142 and the Si film 141 and partitions the n-well 31 and the p-well 32 from each other is formed. In this process, in the present embodiment, the trench isolation insulating film 33 of a shallow trench type is formed by forming a trench through etching and by burying an insulating film (oxide film) therein. The amount of etching during the trench formation is preferably about 0.1 to 1.0 μm. Note that a LOCOS isolation insulating film obtained by selective oxidization may alternatively be formed instead of the trench isolation insulating film 33.

Figure 23D:
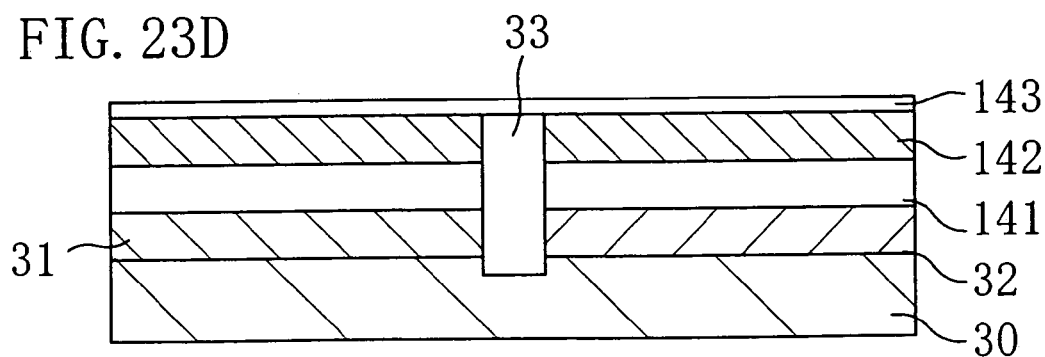

Then, in the step shown in FIG. 23(d), an $Si_{3-y}C_yN_4$ film 143 to be a gate insulating film is formed. In this process, the underlying SiC film 142 is nitrided (by direct nitriding method) excluding the trench isolation insulating film 33. In the present embodiment, the thickness of the $Si_{3-y}C_yN_4$ film 143 is set to be 10 nm or less. The nitriding process is performed by nitriding the channel layer by using an ECR (Electron Cyclotron Resonance) plasma process apparatus. With this method, it is possible to produce a high-density plasma under a low pressure by injecting a microwave under a magnetic field of about 0.1 tesla. Moreover, since an ECR plasma is used, the plasma density can be made higher than that when a parallel plate type plasma is used, whereby the gate insulating film can be formed under a low temperature, and the formation can be done without detracting from the crystallinity of the region to be the channel layer. Alternatively, the SiC film 142 may be nitrided by using other methods such as a radical nitriding method, or a thermal nitriding method in which a heat treatment is performed in an ammonium atmosphere.

Thus, by using a nitriding method, it is possible to obtain a nitride layer being a nitride-containing layer having a good structural affinity with the underlying layer, whereby it is possible to suppress adverse influences on the portion to be the channel.

Note that while an $Si_{3-y}C_yN_4$ film, which is a nitride film that substantially conforms to the stoichiometric ratio of a nitride film of a substance A, i.e., $A_3N_4$, is formed as the gate insulating film in the present embodiment, it may not be necessary to form a film having a composition that conforms to the stoichiometric ratio of a nitride film because the N composition ratio in the nitride film varies depending on the nitriding conditions. Moreover, depending on the underlying material, the film that functions as the gate insulating film may be an SiN film, a GeN film, a CN film, or the like, or a composite material using two or more of these materials. For example, in a case where the channel layer is made of SiGe, the portion that functions as the gate insulating film is typically made of SiGeN. Furthermore, a composite film having a graded composition in which the composition ratio gradually changes upward may alternatively be used.

Figure 24A:
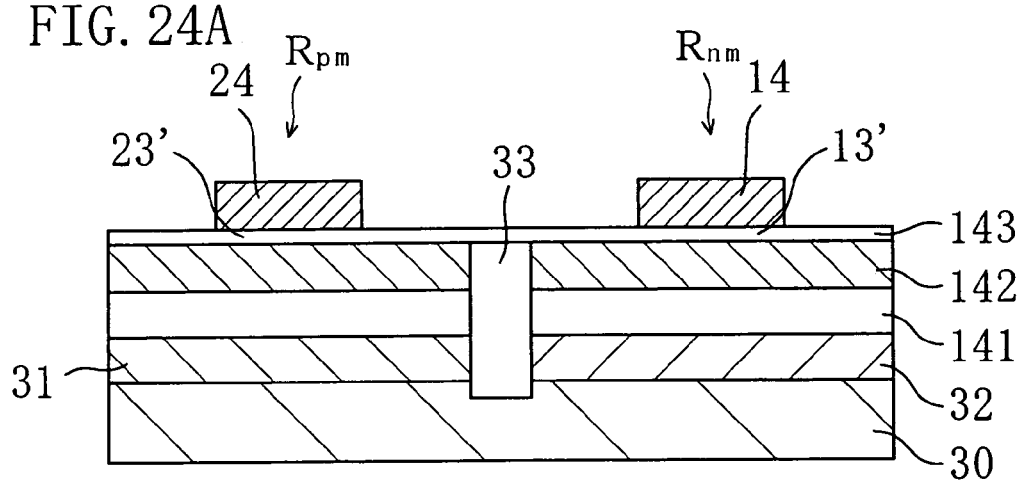
FIG. 24($a$) to FIG. 24($c$) are cross-sectional views illustrating the latter half of the manufacturing process according to the thirteenth embodiment.

Then, in the step shown in FIG. 24(a), an undoped polysilicon film (not shown) is deposited on the $Si_{3-y}C_yN_4$ film 143 by using an LP-CVD method. Then, a photolithography process, an ion implantation process and an annealing process are performed so as to dope boron (B) into a region of the polysilicon film that is located in the pMISFET forming region Rpm, and phosphorus (P) into another region thereof that is located in the nMISFET forming region Rnm. Then, the polysilicon film is patterned by photolithography and dry etching so as to form the gate electrodes 24 and 14 of the pMISFET and the nMISFET, respectively. In this process, the polysilicon film is etched by reactive ion etching (RIE) using a gas such as HBr or $Cl_2$. Thus, portions of the $Si_{3-y}C_yN_4$ film 143 that is located under the gate electrodes 24 and 14 function as gate insulating films 23' and 13', respectively.

Note that after the formation of the gate electrodes, regions of the $Si_{3-y}C_yN_4$ film 143 excluding portions that are located under the gate electrode 24 and 14 may be removed by wet etching using an etchant that has a high selectivity to an SiC film or a polysilicon film.

Figure 24B:
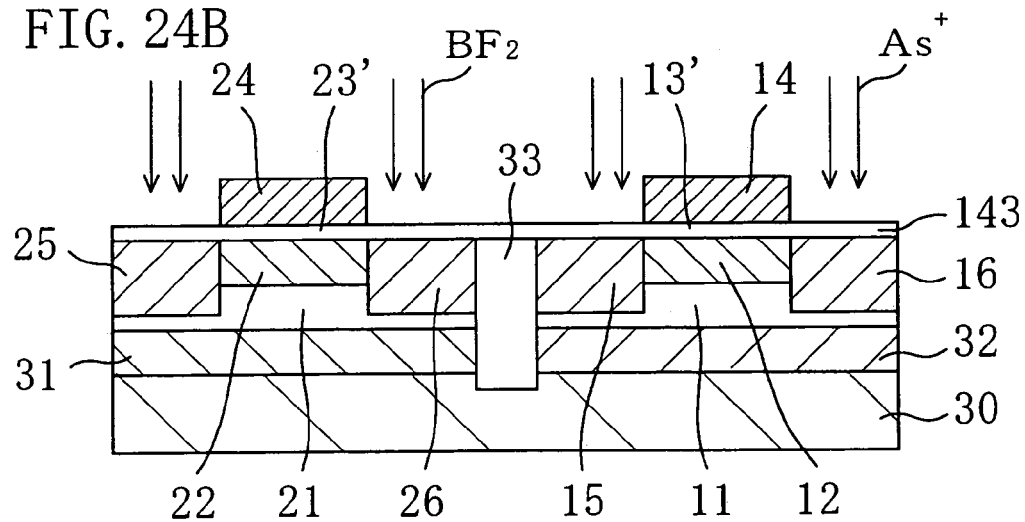

Then, in the step shown in FIG. 24(b), a resist film (not shown) including an opening in the pMISFET forming region Rpm is formed by photolithography, and then ion implantation of boron ($B^+$) is performed by using the resist film and the gate electrode 24 as a mask so as to form the source region 25 and the drain region 26 of the pMISFET. Furthermore, a resist film (not shown) including an opening in the nMISFET forming region Rnm is formed by photolithography, and then ion implantation of arsenic ($As^+$) is performed by using the resist film and the gate electrode 14 as a mask so as to form the source region 15 and the drain region 16 of the nMISFET.

Figure 24C:
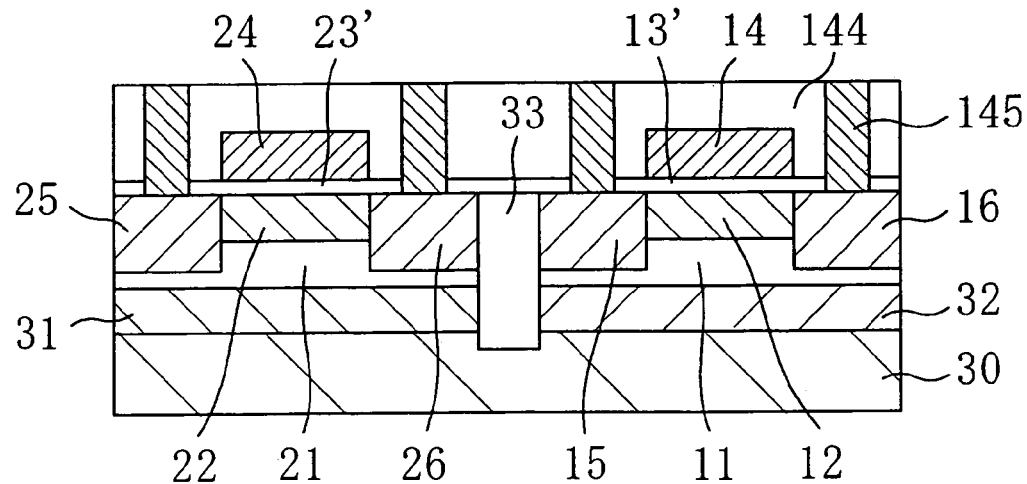

Then, in the step shown in FIG. 24(c), an interlayer insulating film 144 made of two layers of, for example, NSG (non-doped Silicate Glass) and BPSG (Boron phospho Silicate Glass) is deposited on the substrate, after which contact holes that run through the interlayer insulating film 144 to reach the source regions 25 and 15 and the drain regions 26 and 16 are formed. Furthermore, the contact holes are filled with a metal material such as tungsten so as to form plugs 145. Then, although not shown, a wiring layer that is connected to the plugs 145 and extends on the interlayer insulating film 144 is formed. The wiring material is typically a metal material such as Al, Cu, W or Au.

Note that the source regions 25 and 15 and the drain regions 26 and 16 illustrated in FIG. 24(b) may be formed as extension regions containing an impurity of a concentration that is slightly lower than that of high-concentration source/drain regions, with a side wall being formed on each side surface of the gate electrodes 24 and 14 after the extension implantation, and an ion implantation being performed by using the side wall as a mask so as to form high-concentration source/drain regions. In such a case, it is possible to obtain a high-performance transistor that is resistant against the short channel effect and has a relatively high saturation current value.

Moreover, an elevated source-drain structure may be employed so as to form a shallow junction structure.

Moreover, in the formation of plugs or wires, a so-called "damascene method" may be employed, in which a metal film of Cu, or the like, is deposited in a groove or a hole formed in an interlayer insulating film, followed by CMP.

Note that while a bulk silicon single crystal substrate is used as the substrate on which a MISFET is provided in the present embodiment, an SOI (Silicon On Insulator) substrate having a buried oxide film layer therein may alternatively be used.

FOURTEENTH EMBODIMENT

In the present embodiment, a method for manufacturing a complementary MISFET having a channel containing Si, Ge and C and having an SiGeCN gate insulating film (the MISFET of the sixth embodiment) will be described. FIG. 25(a) to FIG. 25(d) and FIG. 26(a) to FIG. 26(c) are cross-sectional views illustrating the manufacturing steps of the present embodiment.

Figure 25A:
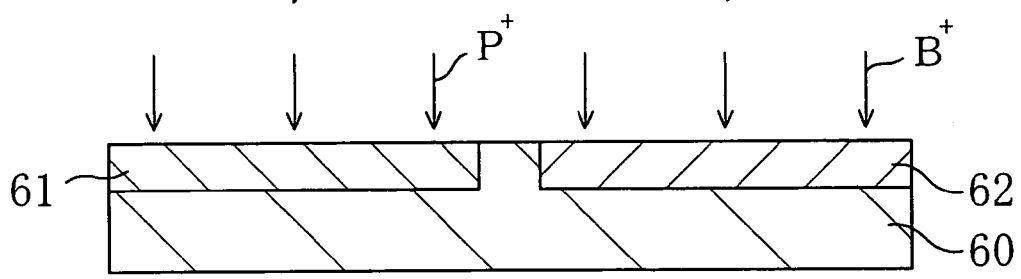
FIG. 25($a$) to FIG. 25($d$) are cross-sectional views illustrating the first half of a manufacturing process according to the fourteenth embodiment of the present invention.

First, in the step shown in FIG. 25(a), phosphorus ion ($P^+$) and boron ion ($B^+$) are implanted into a pMISFET forming region Rpm and an nMISFET forming region Rnm, respectively, of the Si substrate 60 so as to form the n-well 61 and the p-well 62. In this process, a resist mask (not shown) including an opening in the pMISFET forming region Rpm and a resist mask (not shown) including an opening in the nMISFET forming region Rnm, which are formed by photolithography, are used. After the impurity ion implantation, annealing is performed in a nitrogen atmosphere, thereby forming the wells 61 and 62.

Figure 25B:
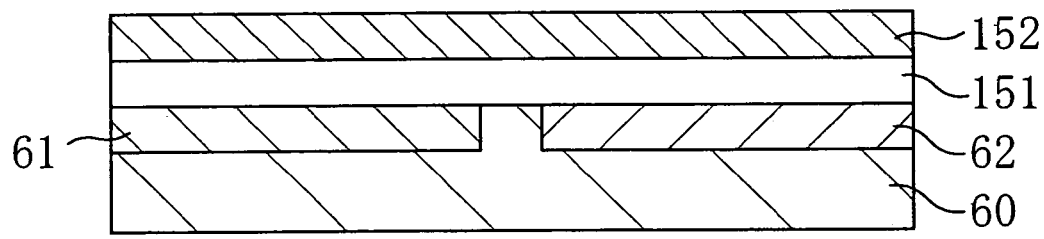

Then, in the step shown in FIG. 25(b), an Si film 151 having a thickness of about 20 nm is deposited on the substrate in which the wells 61 and 62 have been formed, after which an SiGeC film ($Si_{1-x-y}Ge_xC_y$ film) 152 having a thickness of about 10 nm, which is under a tensile strain due to the lattice mismatch with the underlying Si film 151, is further deposited thereon. The Si film 141 and the SiGeC film 152 are deposited by using an UHV-CVD method or an LP-CVD method. The thickness of the SiGeC film 152 to be a channel is set to be less than or equal to the critical thickness so that a dislocation due to a strain or stress relaxation does not occur. Moreover, in the present embodiment, the Ge composition ratio x of the SiGeC film 152 is about 0.1 and the C composition ratio y thereof is 0.015. Then, the band offset amount between the SiGeC film 152 and the Si film 151 is about 0.1 eV at the conduction band edge and about 0.1 eV at the valence band edge. The band offsets are expressed as hetero barriers at the conduction band edge and at the valence band edge, which are advantageous for confining electrons and holes. Note that the impurities (dopants) of the wells 61 and 62 diffuse into the Si film 151 and the SiGeC film 152, whereby a portion of the Si film 151 and the SiGeC film 152 that is located above the n-well 61 is of n-type and another portion that is located above the p-well 62 is of p-type.

Figure 25C:
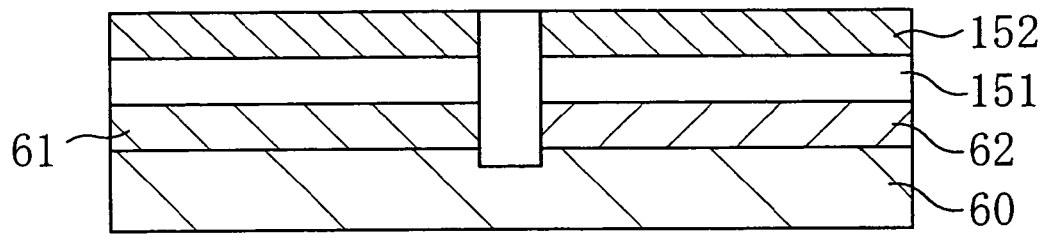

Then, in the step shown in FIG. 25(c), the trench isolation insulating film 63 that runs through the SiGeC film 152 and the Si film 151 and partitions the n-well 61 and the p-well 62 from each other is formed. In this process, in the present embodiment, the trench isolation insulating film 63 of a shallow trench type is formed by forming a trench through etching and by burying an insulating film (oxide film) therein. The amount of etching during the trench formation is preferably about 0.1 to 1.0 µm. Note that a LOCOS isolation insulating film obtained by selective oxidization may alternatively be formed instead of the trench isolation insulating film 63.

Figure 25D:
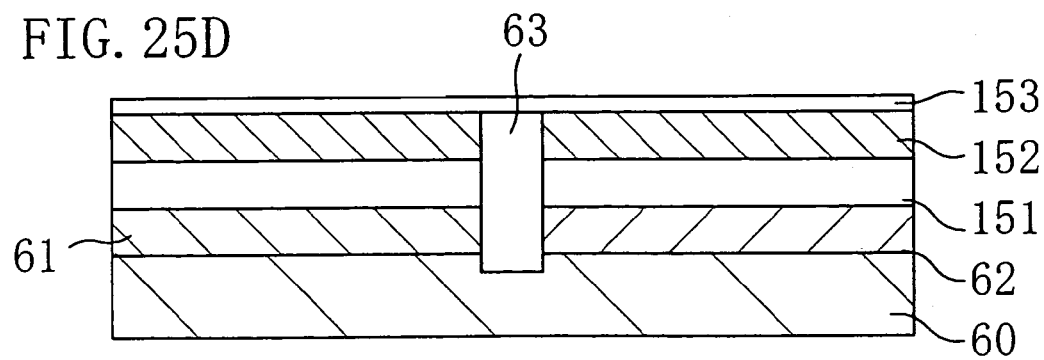

Then, in the step shown in FIG. 25(d), a $C_3N_4$ film 153 to be a gate insulating film is formed by using an AP-CVD method, an LP-CVD method or an UHV-CVD method. In this process, it is preferred that $C_2H_2$ and $NH_3$ are used as a source gas and the growth temperature is 1000° C. or less.

Note that other methods for depositing the $C_3N_4$ film include an ion beam assisted vacuum evaporation method, a reactive sputtering method and an MBE method, and any of these deposition methods may be used.

Note that while a $C_3N_4$ film, which is a nitride film that substantially conforms to the stoichiometric ratio of a nitride film of a substance A, i.e., $A_3N_4$, is formed as the gate insulating film in the present embodiment, it may not be necessary to form a film having a composition that conforms to the stoichiometric ratio of a nitride film because the N composition ratio in the nitride film varies depending on the nitriding conditions. Moreover, the film that functions as the gate insulating film may be an SiN film, a GeN film, an AlN film, a GaN film, or the like, or a composite material using two or more of these materials. For example, a composite film having a graded composition in which the composition ratio gradually changes upward may alternatively be used. The use of a deposition method is advantageous in that a most suitable gate insulating film material can be freely selected independently of the underlying material.

Figure 26A:
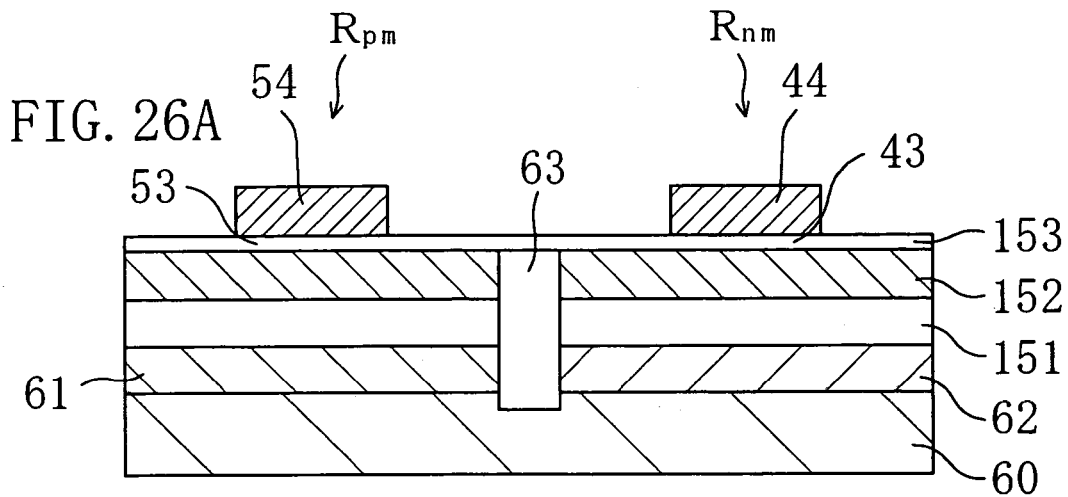
FIG. 26($a$) to FIG. 26($c$) are cross-sectional views illustrating the latter half of the manufacturing process according to the fourteenth embodiment.

Then, in the step shown in FIG. 26(a), an undoped polysilicon film (not shown) is deposited on the $C_3N_4$ film 153 by using an LP-CVD method. Then, a photolithography process, an ion implantation process and an annealing process are performed so as to dope boron (B) into a region of the polysilicon film that is located in the pMISFET forming region Rpm, and phosphorus (P) into another region thereof that is located in the nMISFET forming region Rnm. Then, the polysilicon film is patterned by photolithography and dry etching so as to form the gate electrodes 54 and 44 of the PMISFET and the nMISFET, respectively. In this process, the polysilicon film is etched by reactive ion etching (RIE) using a gas such as HBr or $Cl_2$. Thus, portions of the $C_3N_4$ film 153 that is located under the gate electrodes 54 and 44 function as CN gate insulating films 53 and 43, respectively.

Note that after the formation of the gate electrodes, regions of the $C_3N_4$ film 153 excluding portions that are located under the gate electrode 54 and 44 may be removed by wet etching using an etchant that has a high selectivity to an SiC film or a polysilicon film.

Figure 26B:
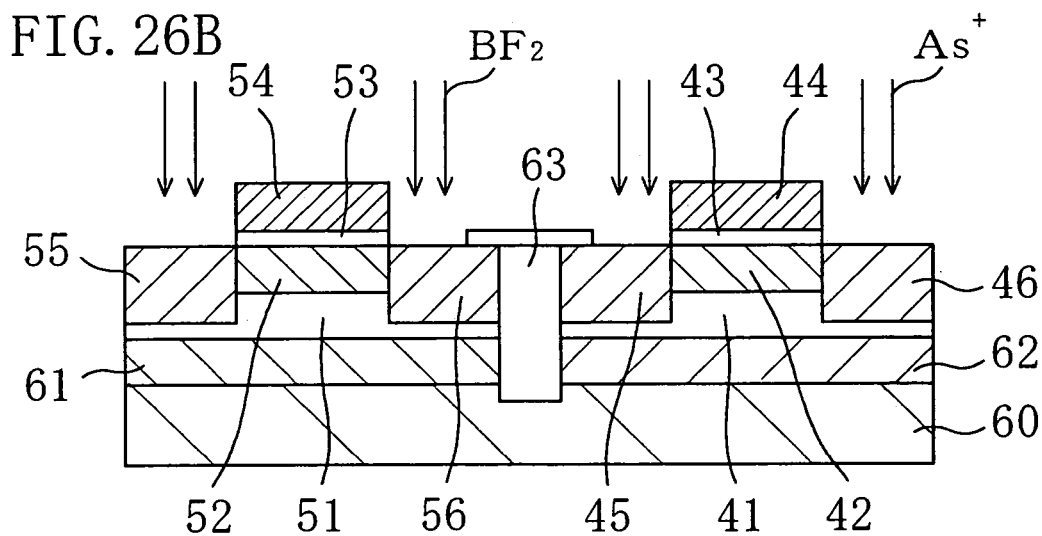

Then, in the step shown in FIG. 26(b), a resist film (not shown) including an opening in the pMISFET forming region Rpm is formed by photolithography, and then ion implantation of boron ($B^+$) is performed by using the resist film and the gate electrode 54 as a mask so as to form the source region 55 and the drain region 56 of the pMISFET. Furthermore, a resist film (not shown) including an opening in the nMISFET forming region Rnm is formed by photolithography, and then ion implantation of arsenic (As) is performed by using the resist film and the gate electrode 44 as a mask so as to form the source region 45 and the drain region 46 of the nMISFET.

Figure 26C:
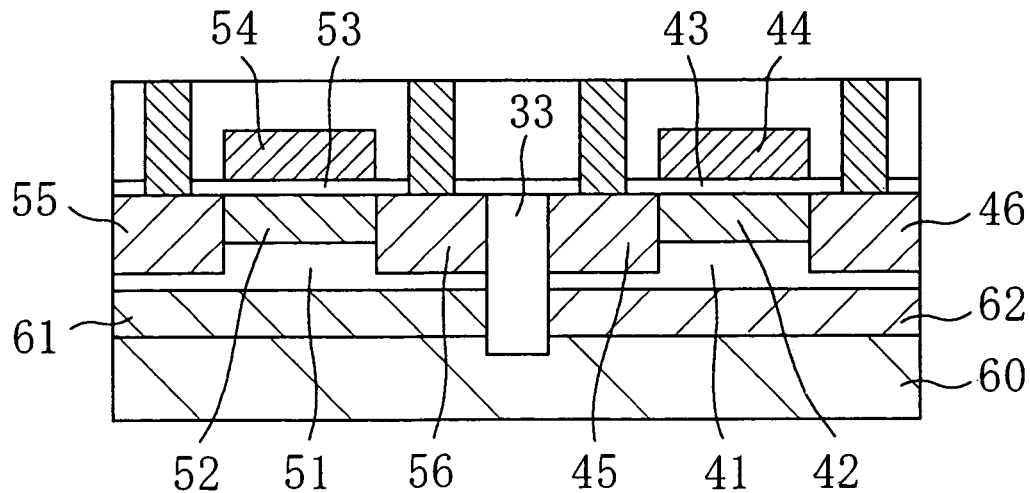

Then, in the step shown in FIG. 26(c), an interlayer insulating film 154 made of two layers of, for example, NSG (non-doped Silicate Glass) and BPSG (Boron phospho Silicate Glass) is deposited on the substrate, after which contact holes that run through the interlayer insulating film 154 to reach the source regions 55 and 45 and the drain regions 56 and 46 are formed. Furthermore, the contact holes are filled with a metal material such as tungsten so as to form plugs 155. Then, although not shown, a wiring layer that is connected to the plugs 155 and extends on the interlayer insulating film 154 is formed. The wiring material is typically a metal material such as Al, Cu, W or Au.

Note that the source regions 55 and 45 and the drain regions 56 and 46 illustrated in FIG. 26(b) may be formed as extension regions containing an impurity of a concentration that is slightly lower than that of high-concentration source/drain regions, with a side wall being formed on each side surface of the gate electrodes 54 and 44 after the extension implantation, and an ion implantation being performed by using the side wall as a mask so as to form high-concentration source/drain regions. In such a case, it is possible to obtain a high-performance transistor that is resistant against the short channel effect and has a relatively low threshold voltage.

Moreover, an elevated source-drain structure may be employed so as to form a shallow junction structure.

Moreover, in the formation of plugs or wires, a so-called "damascene method" may be employed, in which a metal film of Cu, or the like, is deposited in a groove or a hole formed in an interlayer insulating film, followed by CMP.

Note that while a bulk silicon single crystal substrate is used as the substrate on which a MISFET is provided in the present embodiment, an SOI (Silicon On Insulator) substrate having a buried oxide film layer therein may alternatively be used.

FIFTEENTH EMBODIMENT

In the present embodiment, a method for manufacturing a complementary MISFET having a strained Si layer and a relaxed SiGe layer to form a channel and having a CN gate insulating film (the MISFET of the twelfth embodiment) will be described. FIG. 27(a) and FIG. 27(b), and FIG. 28(a) and FIG. 28(b) are cross-sectional views illustrating the manufacturing steps of the present embodiment.

Figure 27A:
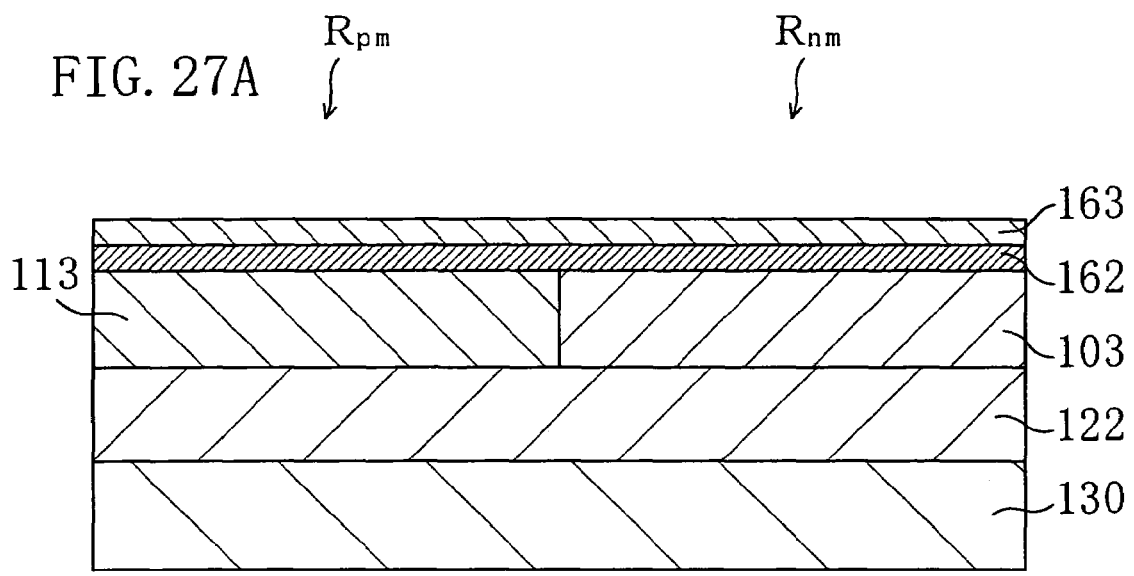
FIG. 27($a$) and FIG. 27($b$) are cross-sectional views illustrating the first half of a manufacturing process according to the fifteenth embodiment of the present invention.

First, in the step shown in FIG. 27(a), the graded SiGe layer ($Si_{1-x}Ge_x$ layer) 122 having a thickness of about 1 µm and having a graded composition in which the Ge composition gradually increases from a lower portion toward an upper portion, and an SiGe film having a thickness of about 300 nm for forming the relaxed SiGe buffer layers 113 and 103, are deposited by using an UHV-CVD method on the Si substrate 130. The Ge composition in the graded SiGe layer 122 is substantially 0% in a portion thereof that is in contact with the Si substrate 130 and 40% in an uppermost portion thereof.

Then, phosphorus ion ($P^+$) and boron ion ($B^+$) are implanted into a pMISFET forming region Rpm and an nMISFET forming region Rnm, respectively, of the SiGe film so as to form the relaxed SiGe buffer layers 113 and 103, respectively. In this process, a resist mask (not shown) including an opening in the pMISFET forming region Rpm and a resist mask (not shown) including an opening in the nMISFET forming region Rnm, which are formed by photolithography, are used. After the impurity ion implantation, annealing (900° C., 15 sec) is performed in a nitrogen atmosphere, thereby forming the relaxed SiGe buffer layers 113 and 103.

Then, a strained Si film 162 having a thickness of about 20 nm, which is under a compressive strain due to the lattice mismatch with the underlying relaxed SiGe buffer layers 113 and 103, is deposited on the substrate in which the relaxed SiGe buffer layers 113 and 103 have been formed, after which an SiGe film ($Si_{1-x}Ge_x$ film) 163 having a thickness of about 10 nm and having a Ge composition of about 40% is further deposited thereon. The strained Si film 162 and the SiGe film 163 are deposited by using an UHV-CVD method or an LP-CVD method. Note that the impurities (dopants) of the relaxed SiGe buffer layers 113 and 103 diffuse into the strained Si film 162 and the $C_3N_4$ film 153, whereby a portion of the strained Si film 162 and the SiGe film 163 that is located above the relaxed SiGe buffer layer 113 is of n-type and another portion that is located above the relaxed SiGe buffer layer 103 is of p-type.

Figure 27B:
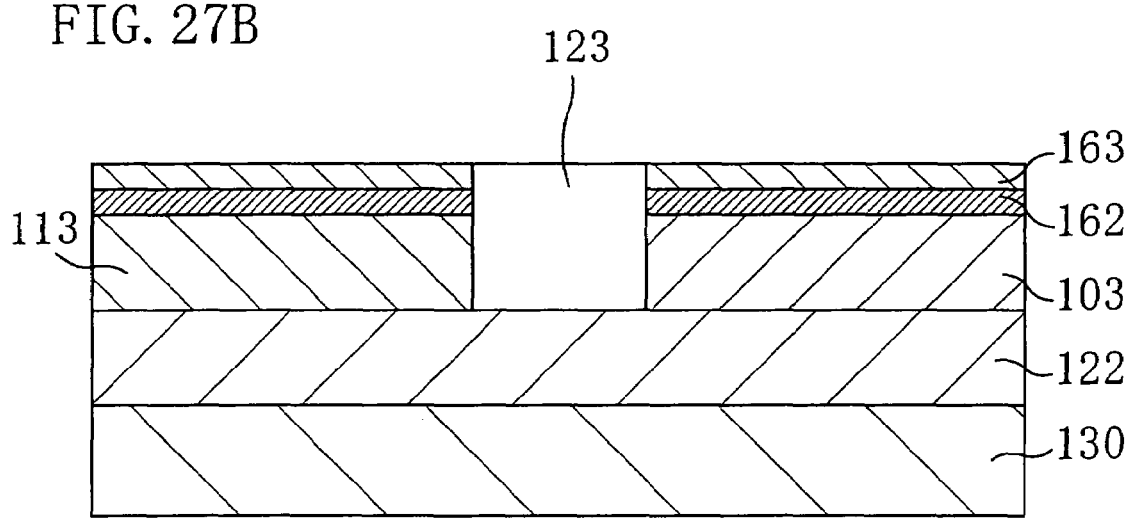

Then, in the step shown in FIG. 27(b), the trench isolation insulating film 123 that runs through the SiGe film 163 and the strained Si film 162 and partitions the relaxed SiGe buffer layers 113 and 103 from each other is formed. In this process, in the present embodiment, the trench isolation insulating film 123 of a shallow trench type is formed by forming a trench through etching and by burying an insulating film (oxide film) therein. The amount of etching during the trench formation is preferably about 0.1 to 1.0 μm. Note that a LOCOS isolation insulating film obtained by selective oxidization may alternatively be formed instead of the trench isolation insulating film 123.

Figure 28A:
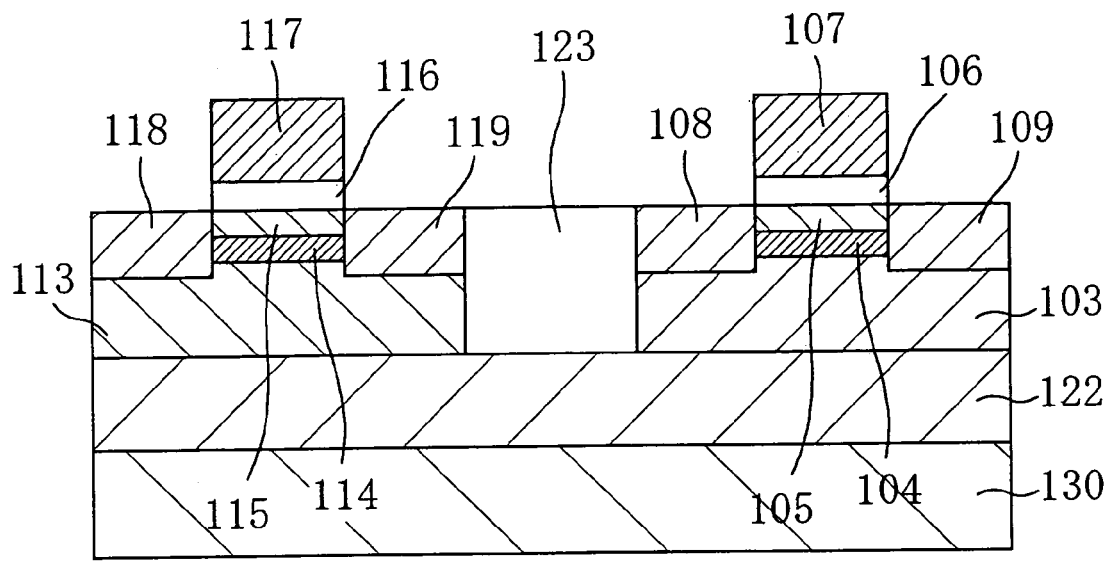
FIG. 28($a$) and FIG. 28($b$) are cross-sectional views illustrating the latter half of the manufacturing process according to the fifteenth embodiment.

Then, in the step shown in FIG. 28(a), a $C_3N_4$ film (not shown) to be a gate insulating film is formed by using an AP-CVD method, an LP-CVD method or an UHV-CVD method. In this process, it is preferred that $C_2H_2$ and $NH_3$ are used as a source gas and the growth temperature is 1000° C. or less.

Note that other methods for depositing the $C_3N_4$ film include an ion beam assisted vacuum evaporation method, a reactive sputtering method and an MBE method, and any of these deposition methods may be used.

Note that while a $C_3N_4$ film, which is a nitride film that substantially conforms to the stoichiometric ratio of a nitride film of a substance A, i.e., $A_3N_4$, is formed as the gate insulating film in the present embodiment, it may not be necessary to form a film having a composition that conforms to the stoichiometric ratio of a nitride film because the N composition ratio in the nitride film varies depending on the nitriding conditions. Moreover, the film that functions as the gate insulating film may be an SiN film, a GeN film, an AlN film, a GaN film, or the like, or a composite material using two or more of these materials. For example, a composite film having a graded composition in which the composition ratio gradually changes upward may alternatively be used. The use of a deposition method is advantageous in that a most suitable gate insulating film material can be freely selected independently of the underlying material.

Then, an undoped polysilicon film (not shown) is deposited on the $C_3N_4$ film by using an LP-CVD method. Then, a photolithography process, an ion implantation process and an annealing process are performed so as to dope boron (B) into a region of the polysilicon film that is located in the pMISFET forming region Rpm, and phosphorus (P) into another region thereof that is located in the nMISFET forming region Rnm. Then, the polysilicon film and the $C_3N_4$ film are patterned by photolithography, dry etching and wet etching so as to form the gate electrodes 117 and 107 and the CN gate insulating films 116 and 106 of the pMISFET and the nMISFET, respectively. In this process, the polysilicon film is etched by reactive ion etching (RIE) using a gas such as HBr or $Cl_2$. In RIE of the $C_3N_4$ film, it is preferred that a gas primarily containing oxygen atoms with a high selectivity to a polysilicon film, e.g., $O_2$, is used. This is because $C_3N_4$, when reacted with $O_2$, is turned into CO and NO, which are volatile, and it does not substantially etch the underlying SiGe layer.

Then, a resist film (not shown) including an opening in the pMISFET forming region Rpm is formed by photolithography, and then ion implantation of boron ($B^+$) is performed by using the resist film and the gate electrode 117 as a mask so as to form the source region 118 and the drain region 119 of the pMISFET. Furthermore, a resist film (not shown) including an opening in the nMISFET forming region Rnm is formed by photolithography, and then ion implantation of arsenic ($As^+$) is performed by using the resist film and the gate electrode 107 as a mask so as to form the source region 108 and the drain region 109 of the nMISFET.

Figure 28B:
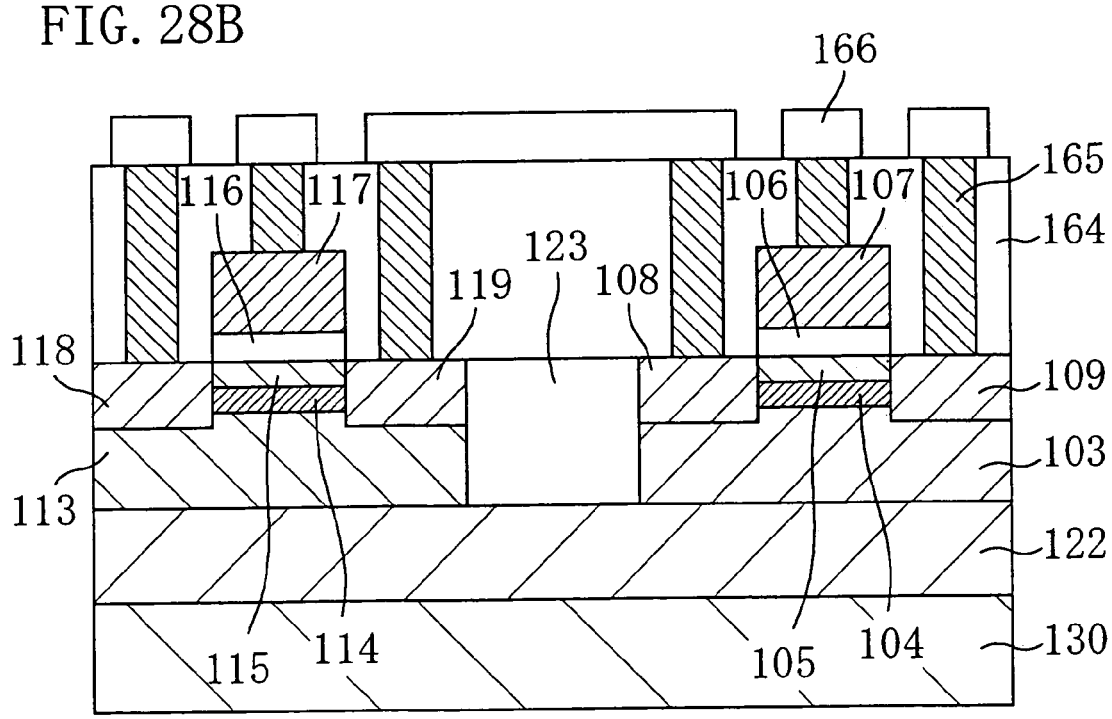

Then, in the step shown in FIG. 28(b), an interlayer insulating film 164 made of two layers of, for example, NSG (non-doped Silicate Glass) and BPSG (Boron phospho Silicate Glass) is deposited on the substrate, after which contact holes that run through the interlayer insulating film 164 to reach the source regions 118 and 108 and the drain regions 119 and 109 are formed. Furthermore, the contact holes are filled with a metal material such as tungsten so as to form plugs 165. Then, although not shown, a wiring layer that is connected to the plugs 165 and extends on the interlayer insulating film 164 is formed. The wiring material is typically a metal material such as Al, Cu, W or Au.

Note that the source regions 118 and 108 and the drain regions 119 and 109 illustrated in FIG. 28(a) may be formed as extension regions containing an impurity of a concentration that is slightly lower than that of high-concentration source/drain regions, with a side wall being formed on each side surface of the gate electrodes 117 and 107 after the extension implantation, and an ion implantation being performed by using the side wall as a mask so as to form high-concentration source/drain regions. In such a case, it is possible to obtain a high-performance transistor that is resistant against the short channel effect and has a relatively low threshold voltage.

Moreover, an elevated source-drain structure may be employed so as to form a shallow junction structure.

Moreover, in the formation of plugs or wires, a so-called "damascene method" may be employed, in which a metal film of Cu, or the like, is deposited in a groove or a hole formed in an interlayer insulating film, followed by CMP.

Note that while a bulk silicon single crystal substrate is used as the substrate on which a MISFET is provided in the present embodiment, an SOI (Silicon On Insulator) substrate having a buried oxide film layer therein may alternatively be used.

ALTERNATIVE EMBODIMENTS

In the first to sixth embodiments, a CN gate insulating film made of carbon nitride (CN) is provided as a gate insulating film. However, similar effects can be realized by providing a gate insulating film made of a different nitride, instead of CN, such as aluminum nitride (AlN), gallium nitride (GaN), silicon nitride (SiN), germanium nitride (GeN), silicon germanium nitride (SiGeN), silicon carbon nitride (SiCN), germanium carbon nitride (GeCN), silicon germanium carbon nitride (SiGeCN) or an oxynitride film (SiON). In such a case, the nitride may have a stoichiometric composition or a composition shifted from the stoichiometric composition.

Particularly, if the gate insulating film contains carbon (C), diffusion of C from the SiC channel layer or the SiGeC channel layer below the gate insulating film can be suppressed, thereby providing an advantage of suppressing the occurrence of defects in the channel layer.

Note that while an Si cap layer is not provided on the SiC channel layer or the SiGeC channel layer in the embodiments above, a thin Si cap layer may be provided. This is because even in such a case, the diffusion of an impurity of the constituent atoms of the channel layer can be suppressed due to the presence of an insulating film made of a nitride film on the Si cap layer. For example, if the Si cap layer is a very thin Si cap layer of about 2 nm or less, it is substantially possible to reliably suppress the occurrence of a parasitic channel.

Note that in a case where the underlying layer of the SiC layer of the first to third embodiments is made of an SiGeC layer instead of an Si layer, the composition can be adjusted so that the tensile strain on the SiC layer is substantially 0, and also in such a case, the effects of the first to third embodiments can be provided.

Moreover, in a case where the underlying layer of the SiGe layer of the fourth to sixth embodiments is made of an SiGeC layer instead of an Si layer, the composition can be adjusted so that the compressive strain on the SiGe layer is substantially 0, and also in such a case, the effects of the fourth to sixth embodiments can be provided.

BASIC STRUCTURE OF THE INVENTION

Next, elements that are necessary to obtain the functions/effects of the present invention, which are deduced from the embodiments above, will be described.

Figure 32:
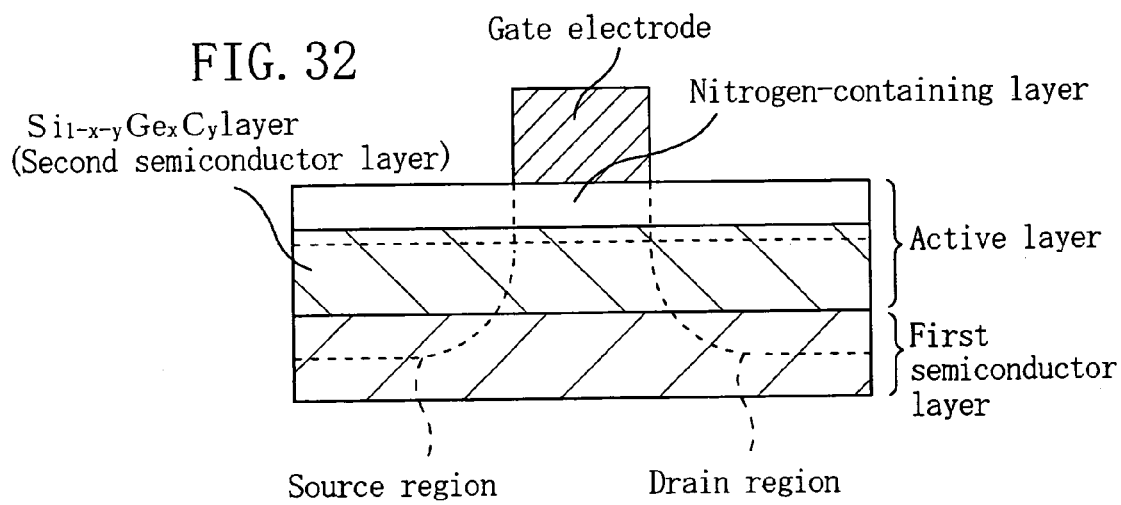
FIG. 32 is a cross-sectional view selectively illustrating only a characteristic portion of a semiconductor device of the present invention.

FIG. 32 is a cross-sectional view selectively illustrating only a characteristic portion of a semiconductor device of the present invention. As illustrated in the figure, the semiconductor device of the present invention includes an active layer on a first semiconductor layer. The uppermost portion of the active layer is a nitride layer of CN, or the like, that functions as a gate insulating film. Moreover, the main portion of the active layer is a second semiconductor having a composition expressed as $Si_{1-x-y}Ge_xC_y$ ($0 \leq x<1$, $0 \leq y<1$, x+y>0). Specifically, the second semiconductor layer is an SiGe layer, an SiC layer or an SiGeC layer. While it is preferred that the second semiconductor layer is in contact with the nitride layer, a very thin Si cap layer, for example, may be provided between the second semiconductor layer and the nitride layer. This is because the occurrence of a parasitic channel is suppressed and a good transconductance is obtained when the interval between the SiGe layer, which is the second semiconductor layer, and the gate insulating film is 2 nm or less, particularly 1 nm or less, as illustrated in FIG. 30(a) and FIG. 30(b).

Figure 33A:
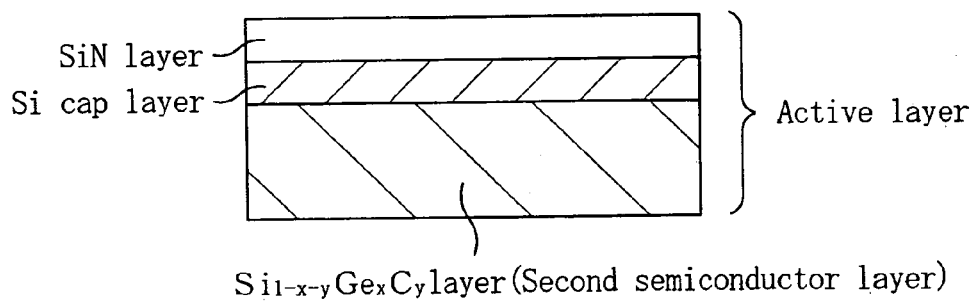
FIG. 33($a$) and FIG. 33($b$) are cross-sectional views each illustrating an example of an active layer where an Si cap layer is provided in the active layer.
Figure 33B:
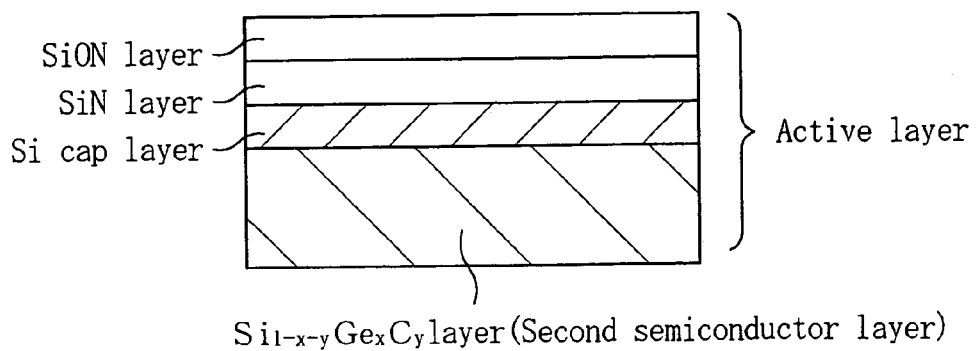

FIG. 33(a) and FIG. 33(b) are cross-sectional views each illustrating an example of an active layer where an Si cap layer is provided in the active layer. It is preferred that the thickness of the Si cap layer is 2 nm or less, and more preferably 1 nm or less.

As illustrated in FIG. 33(a), an Si cap layer and an SiN layer (nitride layer), which is formed by nitriding an Si cap layer, are provided on the $Si_{1-x-y}Ge_xC_y$ layer (second semiconductor layer) in the active layer. This structure can be obtained by, for example, forming the Si cap layer on the $Si_{1-x-y}Ge_xC_y$ layer and then nitriding the Si cap layer. In such a case, it is preferred, for eliminating a parasitic channel of the transistor, to nitride the entire Si cap layer, as already discussed above. However, it may not be possible, due to other limitations, to nitride the entire Si cap layer. In such a case, the structure as illustrated in FIG. 33(a) is suitable. Moreover, the Si cap layer may possibly remain due to variations in process conditions, etc. Note that the nitriding process may extend from the Si cap layer into the $Si_{1-x-y}Ge_xC_y$ layer, thereby forming a CN film, an SiGeN film, an SiCN film or an SiGeC film under the SiN layer.

Alternatively, a surface portion of the SiN layer may be further oxidized to form SiON, which is an oxynitride film, as illustrated in FIG. 33(b). Conversely, a surface portion of the $SiO_2$ film may be nitrided.

According to a semiconductor device of the present invention, the gate insulating film of a hetero junction type field effect transistor is made of a nitride, whereby it is possible to obtain a semiconductor device including a transistor in which the occurrence of a parasitic channel is suppressed and which has a high current drivability.

FIELD OF THE INVENTION

The present invention can be applied to a MISFET in an LSI that is placed in various types of electronic equipment.

What is claimed is:

1. A semiconductor device, comprising at least one field effect transistor, the field effect transistor including:
   a first semiconductor layer;
   a first active layer provided on the first semiconductor layer, an uppermost portion of the first active layer being a nitride-containing layer and a main portion of the first active layer being a second semiconductor layer having a composition expressed as $Si_{1-x-y}Ge_xC_y$ ($0<x<1$, $0 \leq y<1$, x+y<0); and
   a gate electrode provided on the first active layer;
   wherein the nitride-containing layer is made of at least one material selected from carbon nitride (CN), aluminum nitride (AlN) gallium nitride (GaN), germanium nitride (GeN), silicon carbon nitride (SiCN) and germanium carbon nitride (GeCN),
   wherein the first semiconductor layer has a composition expressed as $Si_{1-x-y}Ge_xC_y$($0 \leq x<1$, $0 \leq y<1$); and
   the second semiconductor layer has a composition expressed as $Si_{1-y}C_y$($0<y<1$).

2. The semiconductor device of claim 1, wherein the first semiconductor layer is under a tensile strain.

3. The semiconductor device of claim 1, wherein the second semiconductor layer is used as an n-channel through which electrons travel.

4. The semiconductor device of claim 1, wherein the second semiconductor layer is used as a p-channel through which holes travel.

5. The semiconductor device of claim 1, wherein;
   the field effect transistor is an n-channel field effect transistor; and the semiconductor device further comprises a p-channel field effect transistor, the p-channel field effect transistor including:
   a third semiconductor layer having a composition expressed as $Si_{1-x-y}Ge_xC_y$($0 \leq x<1$, $0 \leq y<1$);
   a second active layer provided on the third semiconductor layer, an uppermost portion of the second active layer being a nitride-containing layer and a main portion of the second active layer being a fourth semiconductor layer having a composition expressed as $Si_{1-y}C_y$ ($0<y<1$); and
   a gate electrode provided on the second active layer.

6. The semiconductor device of claim 5, wherein:
the first semiconductor layer and the third semiconductor layer are formed from the same semiconductor film; and
the second semiconductor layer and the fourth semiconductor layer are formed from the same semiconductor film.

7. A semiconductor device, comprising at least one field effect transistor, the field effect transistor including:
a first semiconductor layer;
a first active layer provided on the first semiconductor layer, an uppermost portion of the first active layer being a nitride-containing layer and a main portion of the first active layer being a second semiconductor layer having a composition expressed as $Si_{1-x-y}Ge_xC_y$ (0<x<1, 0<y<1, x+y>0); and
a gate electrode provided on the first active layer,
wherein the nitride-containing layer is made of at least one material selected from carbon nitride (CN). aluminum nitride (AlN) gallium nitride (GaN), germanium nitride (GeN) silicon carbon nitride (SiCN) and germanium carbon nitride (GeCN),
wherein
the first semiconductor layer has a composition expressed as $Si_{1-x-y}Ge_xC_y$ (0≦x<1, 0<y<1); and
the second semiconductor layer has a composition expressed as $Si_{1-x-y}Ge_xC_y$ (0<x<1, 0<y<1).

8. The semiconductor device of claim 7, wherein the second semiconductor layer is used as an n-channel through which electrons travel.

9. The semiconductor device of claim 7, wherein the second semiconductor layer is used as a p-channel through which holes travel.

10. The semiconductor device of claim 7, wherein:
the field effect transistor is an n-channel field effect transistor; and the semiconductor device further comprises a p-channel field effect transistor the p-channel field effect transistor including;
a fifth semiconductor layer having a composition expressed as $Si_{1-x-y}Ge_xC_y$(0≦x<1, 0≦y<1),
a third active layer provided on the fifth semiconductor layer, an uppermost portion of the third active layer being a nitride-containing layer and a main portion of the third active layer being a sixth semiconductor layer having a composition expressed as $Si_{1-y}C_y$(0<y<1); and
a gate electrode provided on the third active layer.

11. The semiconductor device of claim 10, wherein:
the first semiconductor layer and the fifth semiconductor layer are formed from the same film; and
the second semiconductor layer and the sixth semiconductor layer are formed from the same film.

12. The semiconductor device of claim 1, wherein:
A semiconductor device, comprising at least one field effect transistor, the field effect transistor including;
a first semiconductor layer;
a first active layer provided on the first semiconductor layer, an uppermost portion of the first active layer being a nitride-containing layer and a main portion of the first active layer being a second semiconductor layer having a composition expressed as $Si_{1-x-y}Ge_xC_y$ (0≦x<1, 0≦y<1, x+y>0); and
a gate electrode provided on the first active layer,
wherein the nitride-containing layer is made of at least one material selected from carbon nitride (CN) aluminum nitride (AlN) gallium nitride (GaN) germanium nitride (GeN), silicon carbon nitride (SiCN) and germanium carbon nitride (GeCN),
wherein the first semiconductor layer is a lattice-relaxed layer having a composition expressed as $Si_{1-x-y}Ge_xC_y$ (0<x<1, 0≦y<1);
the second semiconductor layer is a lattice-relaxed layer, and
the semiconductor device further comprises a tensile-strained ninth semiconductor layer having a composition expressed as $Si_{1-x-y}Ge_xC_y$(0≦x<1, 0≦y<1) and provided between the first semiconductor layer and the second semiconductor layer in the first active layer.

13. The semiconductor device of claim 12, wherein the ninth semiconductor layer is used as an n-channel through which electrons travel.

14. The semiconductor device of claim 12, wherein the second semiconductor layer is used as a p-channel through which holes travel.

15. The semiconductor device of claim 12, further comprising a tenth semiconductor layer provided under the second semiconductor layer and having a graded composition expressed as $Si_{1-x-y}Ge_xC_y$(0<x<1, 0<y<1) that is varied so that a crystal lattice dimension increases from a lower portion toward an upper portion.

16. The semiconductor device of claim 12, wherein:
the field effect transistor is an n-channel field effect transistor; and
the semiconductor device further comprises a p-channel field effect transistor, the p-channel field effect transistor including a lattice-relaxed tenth semicondutor layer having a composition expressed as $Si_{1-x-y}Ge_xC_y$ (0≦x<1, 0<y<1);
a fifth active layer, an uppermost portion of the fifth active layer being a nitride-containing layer and a main portion of the fifth active layer including a lattice-relaxed eleventh semiconductor layer having the same composition as that of the tenth semiconductor layer and a tensile-strained twelfth semiconductor layer that is provided between the tenth semiconductor layer and the eleventh semiconductor layer and has a composition expressed as $Si_{1-x-y}Ge_xC_y$(0≦x<1, 0≦y<1); and
a gate electrode provided on the fifth active layer.

17. The semiconductor device of claim 16, wherein:
the first semiconductor layer and the tenth semiconductor layer are formed from the same film;
the second semiconductor layer and the eleventh semiconductor layer are formed the same film; and
the ninth semiconductor layer and the twelfth semiconductor layer are formed from the same film.

\* \* \* \* \*

UNITED STATES PATENT AND TRADEMARK OFFICE
CERTIFICATE OF CORRECTION

PATENT NO. : 7,244,972 B2  Page 1 of 1
APPLICATION NO. : 10/868774
DATED : July 17, 2007
INVENTOR(S) : Kubo et al.

It is certified that error appears in the above-identified patent and that said Letters Patent is hereby corrected as shown below:

in other publications under cited references, "VLSI Technology Digest of Tchnical Papers" should read "VLSI Technology Digest of Technical Papers."

column 40, line 33, "x+y<0" should read "x+y>0."

column 41, line 37, "a p-channel field effect transistor the p-channel" should read "a p-channel field effect transistor, the p-channel."

column 41, line 38, "including;" should read "including:".

column 41, line 54, "including;" should read "including:".

column 42, line 3, "0≤x<1" should read "0<x<1."

column 42, line 6, "carbon nitride (CN) aluminum" should read "carbon nitride (CN), aluminum."

column 42, line 7, "gallium niride "GaN) germanium" should read "gallium nitride (GaN), germanium."

column 42, line 12, "lattice-relaxed layer," should read "lattice-relaxed layer;".

column 42, line 39, "0≤x<1" should read "0<x<1."

Signed and Sealed this

Seventeenth Day of November, 2009

David J. Kappos
*Director of the United States Patent and Trademark Office*